(12) United States Patent
Grant et al.

(10) Patent No.: US 12,164,837 B2
(45) Date of Patent: Dec. 10, 2024

(54) ELECTRODE STRUCTURE

(71) Applicant: Oxford University Innovation Limited, Oxford (GB)

(72) Inventors: Patrick Grant, Oxford (GB); Stephen Duncan, Aylesbury (GB); Ross Drummond, Oxford (GB); Chuan Cheng, Coventry (GB)

(73) Assignee: OXFORD UNIVERSITY INNOVATION LIMITED, Oxford (GB)

( * ) Notice: Subject to any disclaimer, the term of this patent is extended or adjusted under 35 U.S.C. 154(b) by 0 days.

(21) Appl. No.: 18/020,440

(22) PCT Filed: Aug. 11, 2021

(86) PCT No.: PCT/GB2021/052076
§ 371 (c)(1),
(2) Date: Feb. 9, 2023

(87) PCT Pub. No.: WO2022/034318
PCT Pub. Date: Feb. 17, 2022

(65) Prior Publication Data
US 2023/0297729 A1 Sep. 21, 2023

(30) Foreign Application Priority Data

Aug. 11, 2020 (GB) .................... 2012487

(51) Int. Cl.
*G06F 30/10* (2020.01)
*H01M 4/04* (2006.01)
*H01M 4/139* (2010.01)

(52) U.S. Cl.
CPC .......... *G06F 30/10* (2020.01); *H01M 4/0404* (2013.01); *H01M 4/0419* (2013.01); *H01M 4/139* (2013.01)

(58) Field of Classification Search
CPC .... H01M 4/0404; H01M 4/0419; H01M 4/08; H01M 4/139; H01M 4/88
(Continued)

(56) References Cited

U.S. PATENT DOCUMENTS

| 6,017,654 A * | 1/2000 | Kumta .................... C01G 53/50 |
| | | 429/231.95 |
| 9,368,788 B2 * | 6/2016 | Ogg ........................ H01M 4/32 |

(Continued)

FOREIGN PATENT DOCUMENTS

WO  2011/109815 A1  9/2011

OTHER PUBLICATIONS

International Search Report and Written Opinion for WO 2022/034318 (PCT/GB2021/052076), dated Feb. 14, 2022, pp. 1-18.
(Continued)

*Primary Examiner* — Brian K Talbot
(74) *Attorney, Agent, or Firm* — Thomas|Horstemeyer, LLP

(57) ABSTRACT

The present disclosure relates to graded electrodes for an electric battery cell, and to methods of designing and manufacturing such electrodes. Example embodiments include a method of designing an electrode for an electric battery cell, the electrode comprising a compound mixture of an electrochemically active material, an electrically conductive material and a binding material, the method comprising: applying a model for an electrochemical response of the electric battery cell; and optimising parameters of the model to maximise one or more of an energy density, power density, battery health and thermal response of the electric battery cell.

11 Claims, 15 Drawing Sheets

(58) Field of Classification Search
USPC .................................................. 427/58, 115
See application file for complete search history.

(56) References Cited

U.S. PATENT DOCUMENTS

| | | | | |
|---|---|---|---|---|
| 10,038,193 | B1* | 7/2018 | Schroder | H01G 11/38 |
| 10,637,045 | B2* | 4/2020 | Woehrle | H01M 4/0471 |
| 10,686,215 | B2* | 6/2020 | Kim | H01M 4/366 |
| 11,271,196 | B2* | 3/2022 | Yao | H01M 4/62 |
| 2004/0026253 | A1* | 2/2004 | Leddy | C25B 11/00 |
| | | | | 205/339 |
| 2006/0024579 | A1* | 2/2006 | Kolosnitsyn | H01M 10/0525 |
| | | | | 429/213 |
| 2006/0251965 | A1* | 11/2006 | Nagayama | H01M 4/366 |
| | | | | 429/231.95 |
| 2012/0328942 | A1* | 12/2012 | Thomas-Alyea | H01M 4/587 |
| | | | | 429/211 |
| 2016/0104882 | A1* | 4/2016 | Yushin | H01M 4/386 |
| | | | | 429/233 |
| 2017/0317338 | A1* | 11/2017 | Woehrle | H01M 4/139 |
| 2018/0138556 | A1* | 5/2018 | Palko | H01M 10/4285 |
| 2020/0212437 | A1 | 7/2020 | Yao et al. | |
| 2021/0111435 | A1* | 4/2021 | Higashi | H01M 10/0525 |

OTHER PUBLICATIONS

UK Search Report for GB 2012487.1, dated Feb. 16, 2021, pp. 1-2.
Journal of Power Sources, vol. 413, 2019. C. Cheng et al, "Micro-scale graded electrodes for improved dynamic and cycling performance of Li-ion batteries", pp. 59-67.
Journal of the Electrochemical Society, vol. 164, 2017, Y. Qi et al, "Is There a Benefit in Employing Graded Electrodes for Lithium-Ion Batteries?", pp. A3196-A3207.
Journal of Power Sources, vol. 253, 2014, S. Golmon et al, "A design optimization methodology for Li+batteries", pp. 239-250.
Journal of the Electrochemical Society, vol. 164, 2017, L. Liu et al, "Experimental and Simulation Investigations of Porosity Graded Cathodes in Mitigating Battery Degradation of High Voltage Lithium-Ion Batteries", pp. A3163-A3173.
2012 American Control Conference—ACC 2012, 2012, S. De et al, "Model-based simultaneous optimization of multiple design parameters for lithium-ion batteries for maximization of energy density", pp. 4275-4280.

* cited by examiner

ELECTRODE STRUCTURE

CROSS-REFERENCE TO RELATED APPLICATIONS

This application is the National Stage of International Application No. PCT/GB2021/052076, filed Aug. 11, 2021, which claims priority to GB 2012487.1, filed Aug. 11, 2020, which are entirely incorporated herein by reference.

FIELD OF THE INVENTION

The present disclosure relates to graded electrodes for an electric battery cell, and to methods of designing and manufacturing such electrodes.

BACKGROUND

As lithium ion (Li-ion) batteries continue to grow in popularity and establish themselves as the primary energy storage device for emerging applications such as electric vehicles, greater demands are being placed on their performance. Improvements in degradation rates, energy/power densities and thermal safety are becoming increasingly important to realise the next generation of mobile technologies. In research laboratories, the traditional way to improve battery performance has been to develop novel chemistries that can offer improved theoretical performance over commonly used Li-ion chemistries, such as lithium iron phosphate ($LiFePO_4$, also abbreviated to LFP here) and lithium cobalt oxide (LCO). However, most commercial batteries still rely on tried-and-tested chemistries, even for high-performance applications and this trend does not appear to be abating. A key reason for this technology lag between research and commercial batteries is the radical improvements in Li-ion battery manufacturing of recent years that have led to orders of magnitude reductions in battery costs, primarily through the economics of scale [28]. Correspondingly, as well as significant performance improvements, the commercialisation of any novel Li-ion battery chemistry hoping to be commercialised must show manufacturing scalability if it hopes to supplant the existing chemistries. With such guarantees lacking in many of the approaches currently being developed, future batteries technologies are likely to still rely upon Li-ion chemistries. To make a real impact on near-future commercial batteries, improvements at the macro-scale where engineering and manufacturing methods can be applied, and not the molecular level, may well prove critical.

One approach to manufacture better batteries that has emerged in recent years is electrode grading [47]. In contrast to traditional slurry casting, graded electrodes are constructed additively with controlled through-thickness variations in the local electrode micro-structure, see e.g. [10, 31, 19, 49].

The traditional approach to graded electrodes involves introducing layers of different materials into the electrode, as has been demonstrated for Li-ion batteries [16, 17] and supercapacitors [7, 30, 18]. However, electrodes layered in this way may introduce additional resistances across the electrode and so recent grading approaches have been improved by using a two-step spray forming process to enable graded electrodes with near continuous variations in through-thickness micro-structure [3]. In practice, such sprayed graded electrodes have shown a 50% improvement in degradation rate and a 31% improvement in high C-rate capacity compared to equivalent uniform electrodes [3], indicating the potential use of advanced manufacturing methods to improve battery performance.

WO 2014/147419 A1 discloses a method of manufacture of an electrode having a non-uniform microstructure or mesostructure comprising providing a first suspension containing a first electrode material and a second suspension containing a second electrode material, delivering the first and second suspension to a spraying means, operating the spraying means for a period of time to spray the first and second suspension on to a substrate located a distance from the spraying means, and controlling the mass flow rate of the first electrode material and/or the second electrode material to and/or through the spraying means as a function of time for at least a portion of the period of time. This enables an electrode having a non-uniform microstructure or mesostructure to be produced.

WO 2016/075465 A1 discloses a discrete layered electrode structure and a method of manufacture thereof.

Within the context of electrode manufacture, any attempted optimisation of electrode structure typically involves trial and error. This may be time consuming and inefficient, leading to manufacturing inefficiencies, for example in terms of waste and/or downtime, and/or may lead to sub-optimal electrodes being manufactured. These potential downsides are magnified when trying to optimise a non-monolithic electrode (e.g. a graded electrode), due to the enormous increase in the number of possible variations as compared with a monolithic or finitely layered electrode.

SUMMARY

According to a first aspect there is provided a method of designing an electrode for an electric battery cell, the electrode comprising a compound mixture of an electrochemically active material, an electrically conductive material and a binding material, the method comprising: applying a model for an electrochemical response of the electric battery cell; and optimising parameters of the model to maximise one or more of an energy density, power density, battery health and thermal response of the electric battery cell.

The model may describe the evolution of state-of-charge, overpotential, heat generation, electrolyte displacement and degradation effects including Li-plating, particle cracking and SEI layer growth.

The model may define a microstructure of the electrode using image-based methods or from a continuum approximation.

The electrochemical response of the electric battery cell may include internal electrochemical reactions occurring with the cell and local dynamics of the electrochemically active material during charging and discharging of the cell.

Battery health may be defined as a relative decrease in capacity or a relative increase in internal resistance over time of the electric battery cell, for example in comparison to an initial manufactured state. Maximising battery health would therefore involve minimising such changes over time.

A thermal response may be defined as a variation in temperature of the electrode, or across the electrode, over time upon application of an electrical current. Maximising such a thermal response would therefore involve minimising such a variation.

The parameters may include one or more of a length of an electrode separator, a length of the electrode, porosity, tortuosity, particle radii, electronic and ionic conductivities and dimensions of the electrode.

The model may be configured to minimise a variation in overpotential of the electrode to maximise the energy density, power density, battery health and/or thermal response of the electric battery cell.

The electrode may be a graded electrode.

According to a second aspect there is provided a method of designing an electrode for an electric battery cell, the electrode having a thickness L between first and second opposing faces and comprising a compound mixture of an electrochemically active material, an electrically conductive material and a binding material, the method comprising:
  i) selecting upper and lower bounds for a weight fraction w(x) of the electrochemically active material at a fractional distance x from the first to second opposing faces;
  ii) selecting an initial weight fraction for the electrode for x=0 and x=L;
  iii) applying a model of overpotential dynamics for the electrode; and
  iv) adjusting a variation in w(x) to determine a distribution of w(x) that minimises overpotential across the electrode.

The method enables the electrode to be optimised since, for a given amount of electrochemically active material, defined by an average overall weight fraction u, the method will find the optimal distribution of electrochemically active material in the through-thickness direction that minimises the overpotential across the electrode.

The electrode may be a graded electrode, i.e. with a varying distribution of electrochemically active material across the electrode thickness. In such cases the method may comprise defining an average overall weight fraction u of electrochemically active material for the electrode and the step of adjusting the variation in w(x) provides a distribution that minimises overpotential for the given weight fraction of electrochemically active material. In some cases the electrode may have a uniform distribution of active material, the method enabling an optimum level of the electrochemically active material to be determined.

Step iv) may comprise:
  applying a convex relaxation to the model to provide a convex semi-definite program;
  and solving the convex semi-definite program to determine the distribution of w(x).

An advantage of using a convex semi-definite program is of efficiently providing a solution within a short timeframe, e.g. a few seconds. Such speed contrasts with pre-existing design approaches using for example a neural network or a genetic algorithm.

The convex semi-definite program may be capable of being efficiently solved within a short timeframe, e.g. a few seconds. Such speed contrasts with pre-existing design approaches using for example a neural network or a genetic algorithm.

Step i) may further comprise selecting an upper bound for a gradient in w(x) across the electrode. The upper bound may be required to provide a distribution that lies within the limits of what may be realistically manufactured.

The method may comprise a further step of manufacturing the electrode by depositing successive layers of the compound mixture on a substrate.

The substrate may be a current collector layer for the electric battery cell.

The electric battery cell may be a Li-ion battery cell. The electrochemically active material may be one of Lithium Iron Phosphate, Lithium Cobalt Oxide and Lithium Nickel Manganese Cobalt Oxide in the case of the electrode being a cathode for the Li-ion battery cell. In the case of the electrode being an anode for the Li-ion battery cell, the electrochemically active material may for example be graphite.

The method may allow for optimised electrodes to be designed. The electrodes may be optimised, for example, in terms of the optimal fraction and arrangement of the different constituent electrode materials, in order to maximise electrode performance in terms of resistance and/or volumetric and gravimetric energy density and/or power density and/or cycle life etc. This approach may be used similarly to guide the experimental optimisation of electrode and battery performance.

According to a third aspect there is provided an electrode for an electric battery cell, the electrode having a thickness L between first and second opposing surfaces and comprising a compound mixture of an electrochemically active material, an electrically conductive material and a binding material, the compound mixture having an average overall weight fraction u of electrochemically active material,
  wherein a weight fraction w(x) of the electrochemically active material at a fractional distance x from the first interface to the second interface varies such that $w(x) > \mu$ where $0.15 < x < 0.85$.

In some examples, $0.6 \leq \mu \leq 0.9$.

In some examples, $\mu$ may reduce from a maximum between $0.15 < x < 0.85$ and a minimum at one or both of the first and second interfaces. The minimum may be between around 0.3 and around 0.6.

A maximum gradient in w(x) across the electrode thickness may be at least around 3. The maximum gradient in w(x) across the electrode thickness may for example be no greater than around 5.

In some examples, a variation in w(x) between $0.15 < x < 0.85$ may be no more than around 0.05.

The electrode may be a cathode or an anode of a Li-ion battery cell.

The electrochemically active material may be one of Lithium Iron Phosphate, Lithium Titanate, Lithium Cobalt Oxide and Lithium Nickel Manganese Cobalt Oxide.

The electrode may form part of an electrode assembly comprising:
  a current collector comprising an electrically conductive layer; and
  a separator layer,
  wherein the electrode is disposed between the current collector and the separator layer.

An electric battery may be provided comprising one or more cells comprising the electrode assembly.

According to a fourth aspect there is provided a method of manufacturing an electrode for an electric battery cell, the method comprising depositing a compound mixture of an electrochemically active material, an electrically conductive material and a binding material on a substrate to form the electrode having a total thickness with an average overall weight fraction $\mu$ of electrochemically active material, wherein a weight fraction w(x) of the electrochemically active material at a fractional distance x across the thickness of the electrode varies such that $w(x) > \mu$ where $0.15 < x < 0.85$.

The compound mixture may be deposited by spraying the compound mixture on the substrate.

The skilled person will appreciate that except where mutually exclusive, a feature or parameter described in relation to any one of the above aspects may be applied to any other aspect. Furthermore, except where mutually exclusive, any feature or parameter described herein may be applied to any aspect and/or combined with any other feature or parameter described herein.

DETAILED DESCRIPTION

Example embodiments will be described with reference to the accompanying drawings, in which.

Figure 6A:
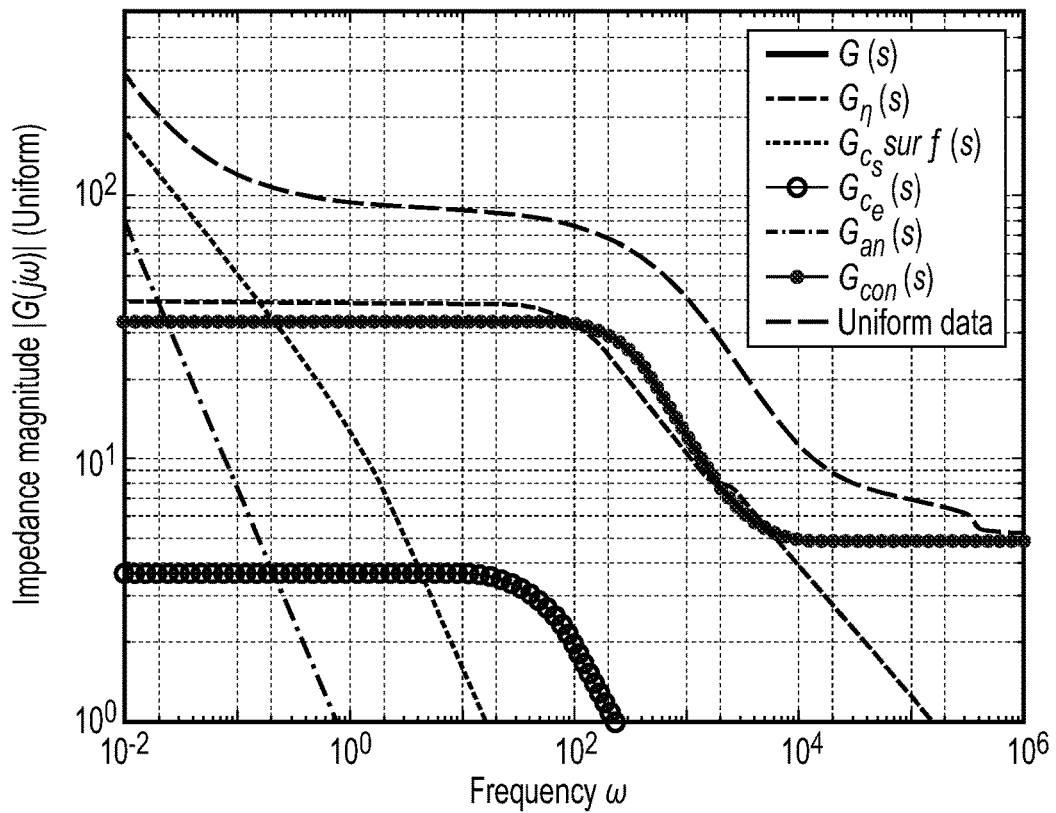
Figure 6B:
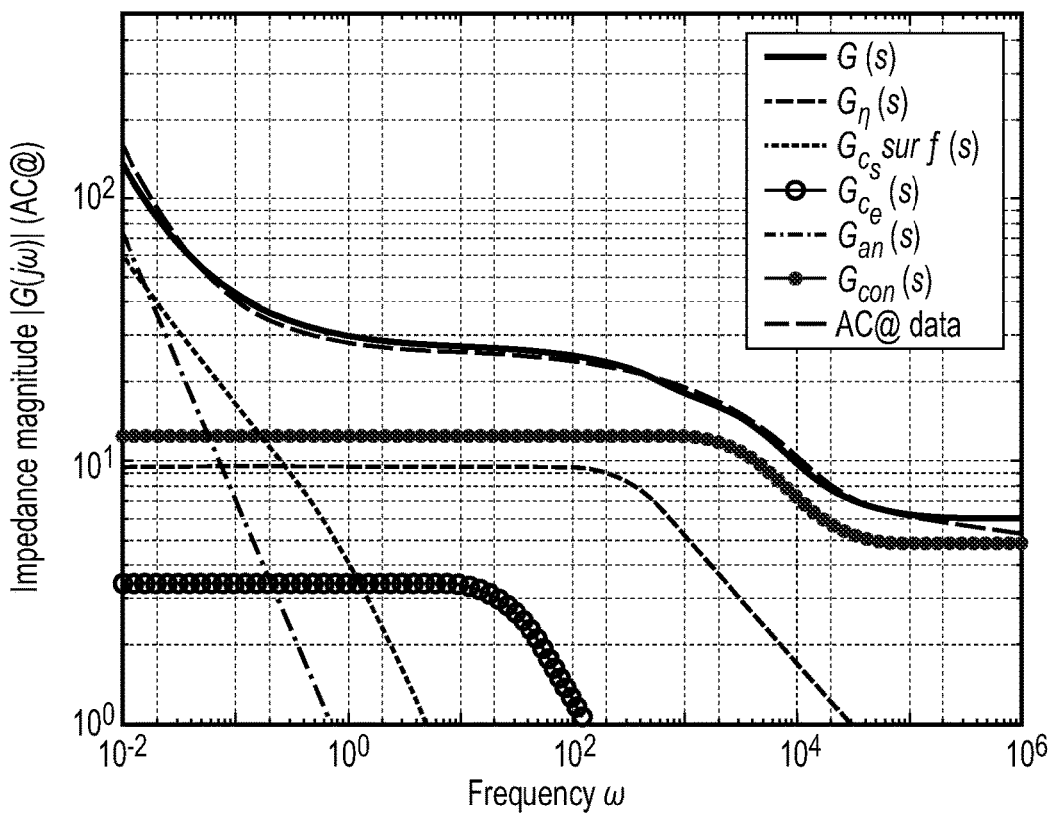
Figure 6C:
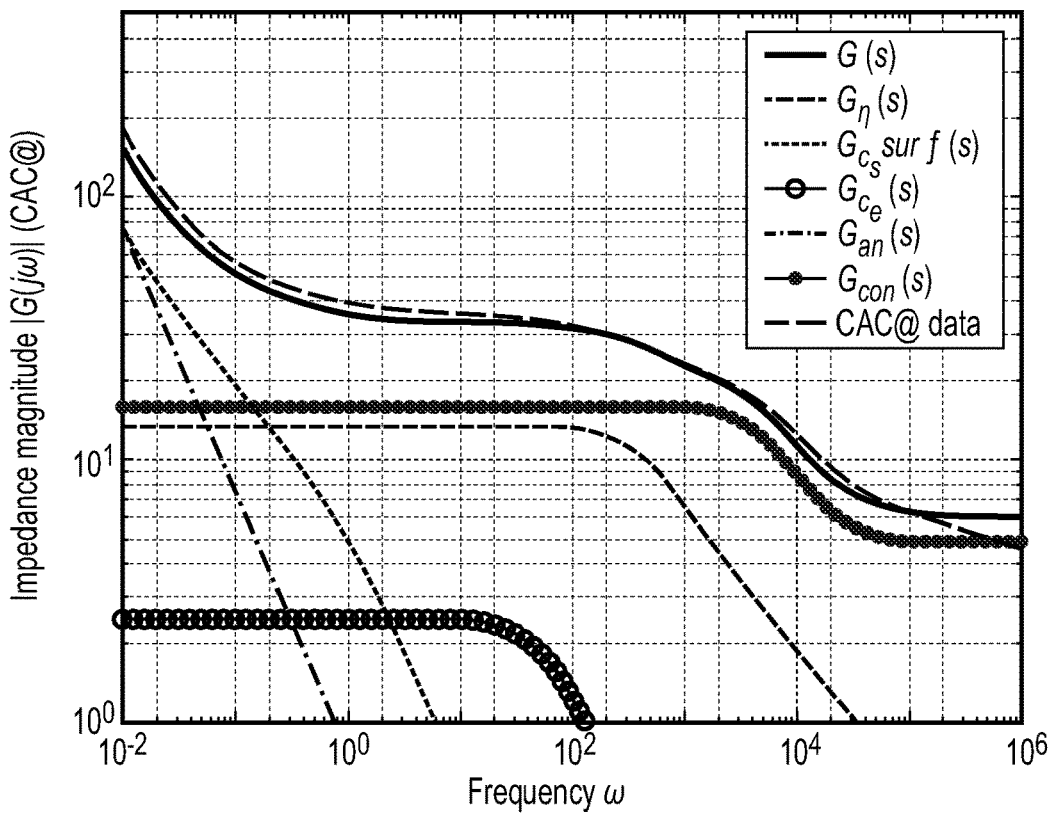
Figure 7:
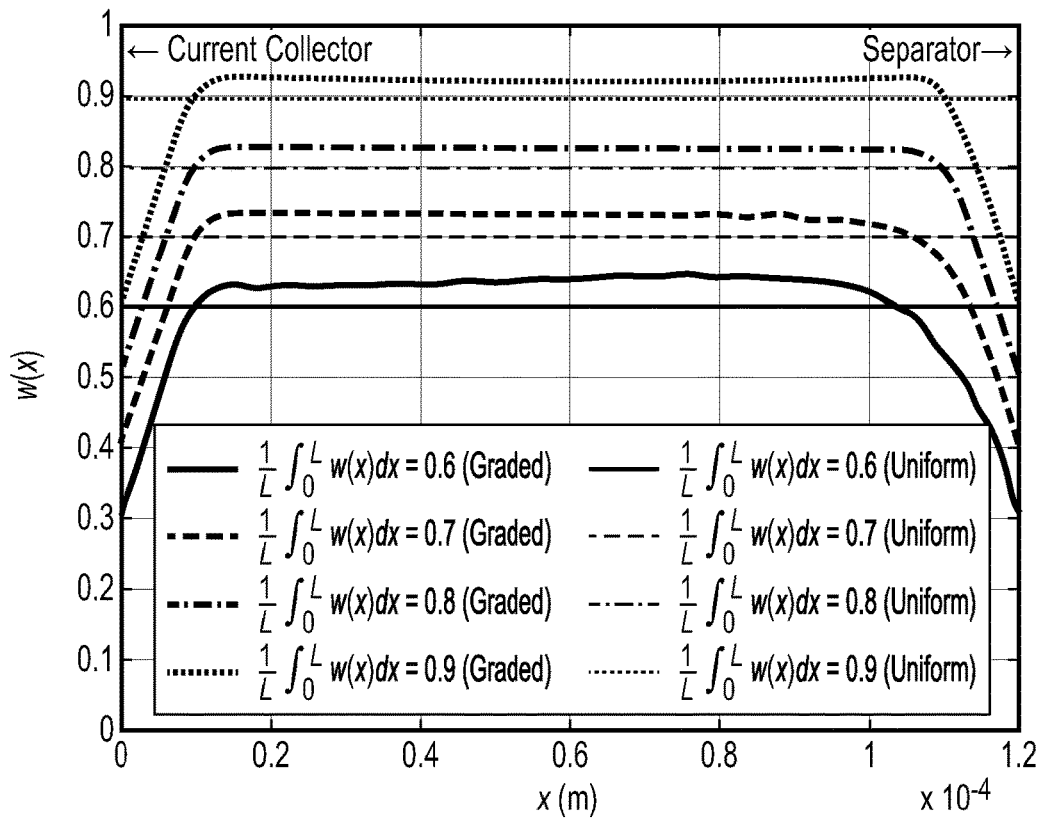
Figure 8A:
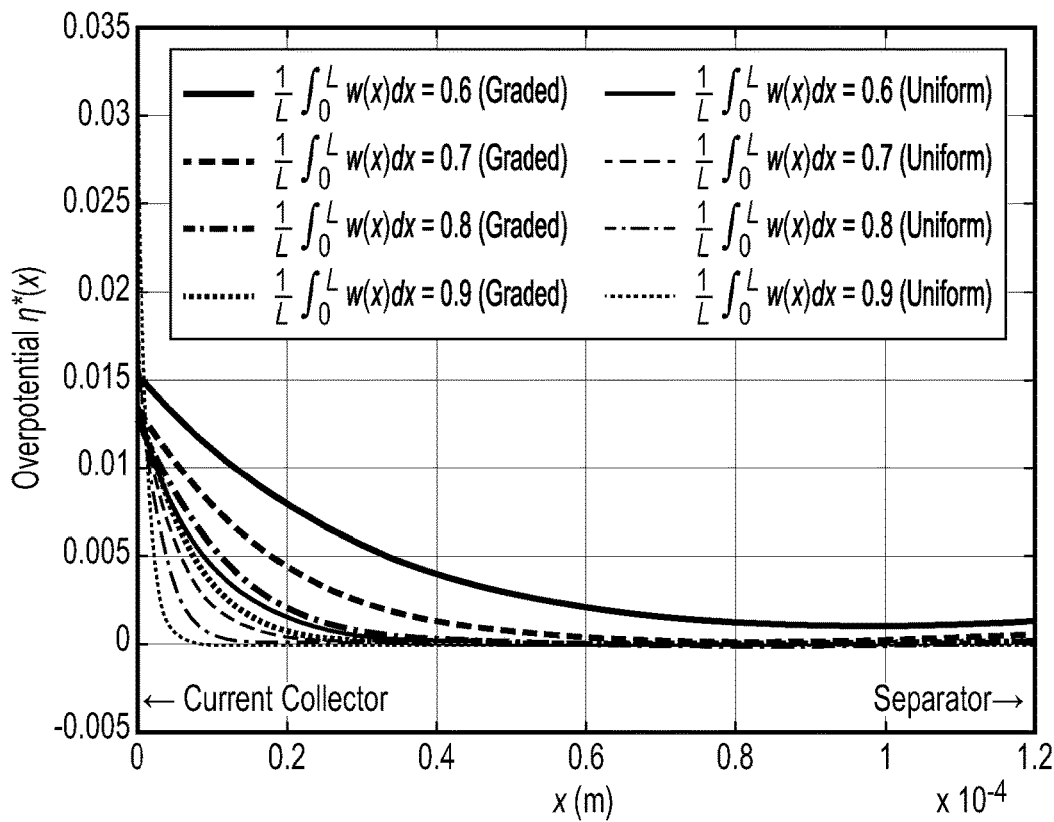
Figure 8B:
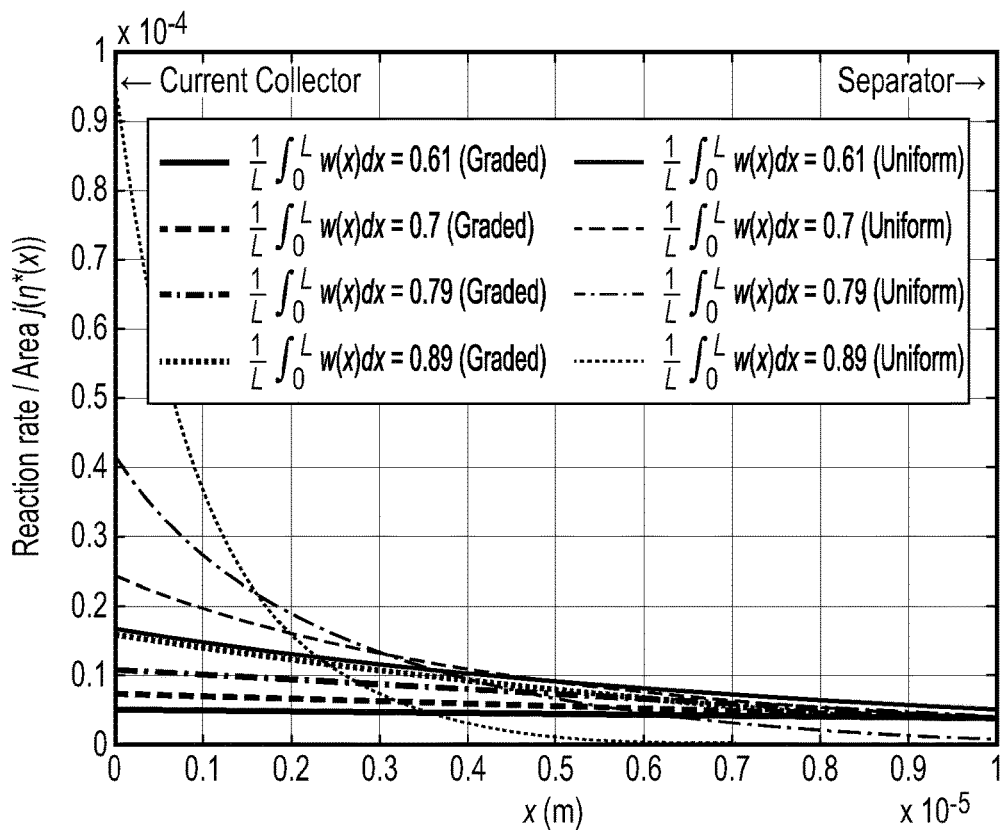
Figure 9A:
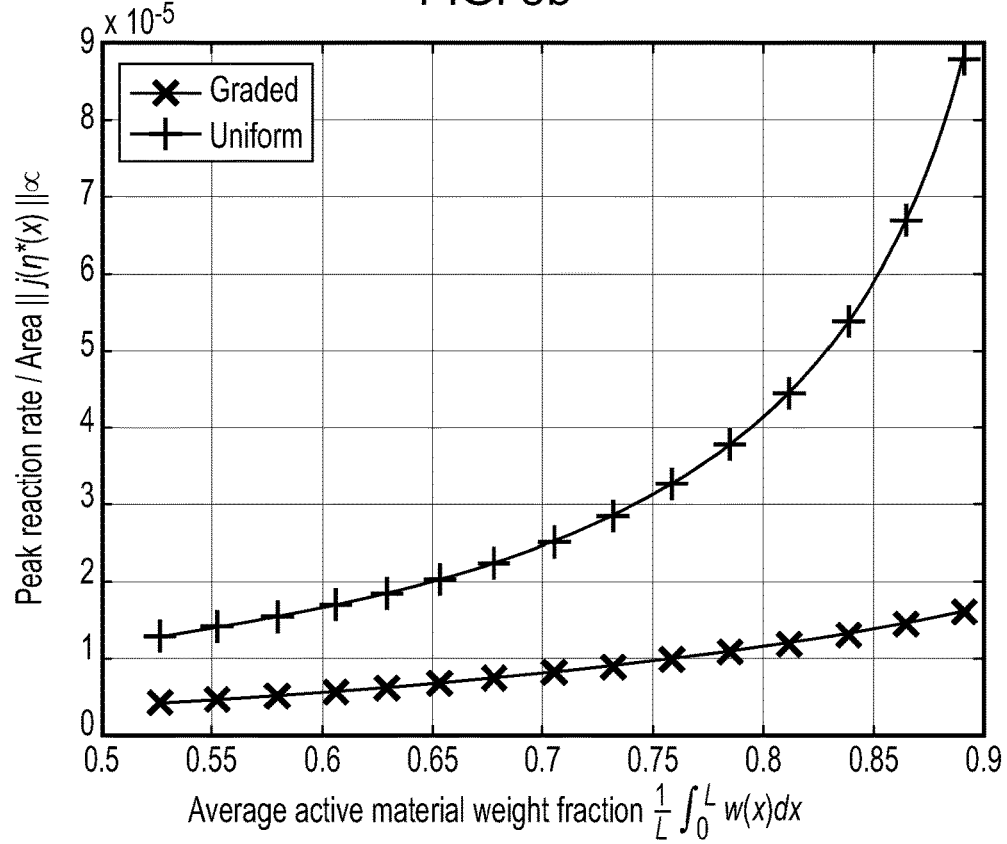
Figure 9B:
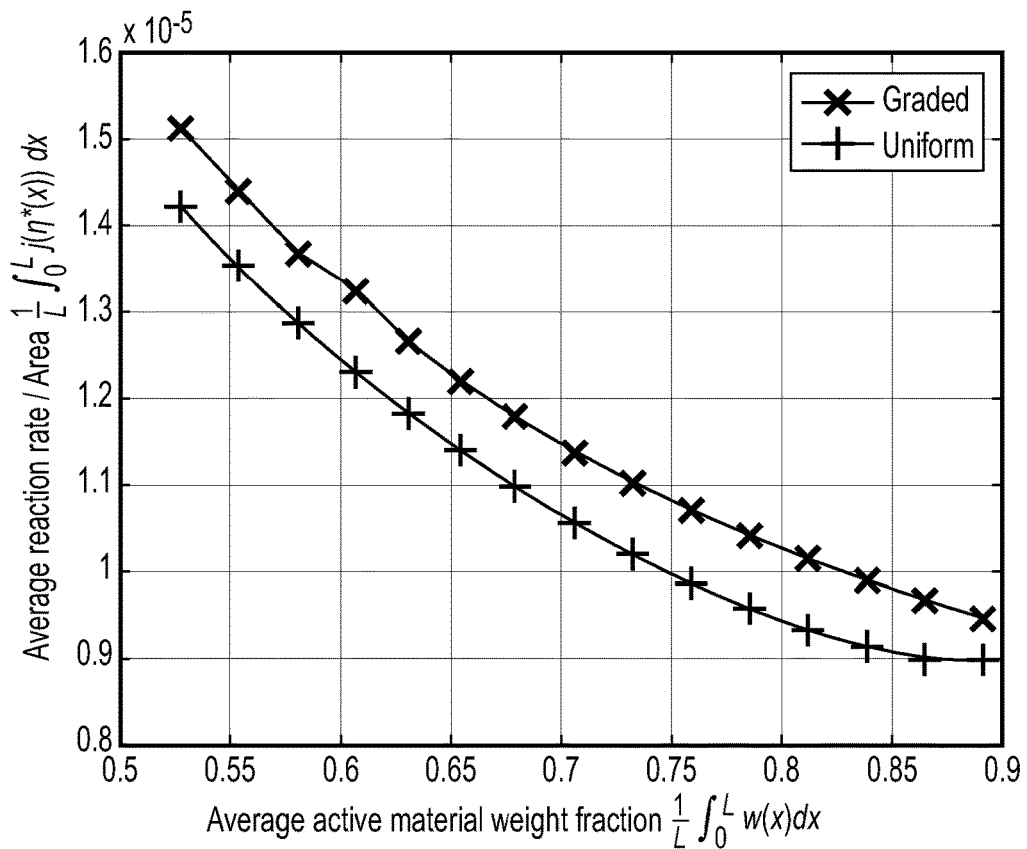
Figure 10:
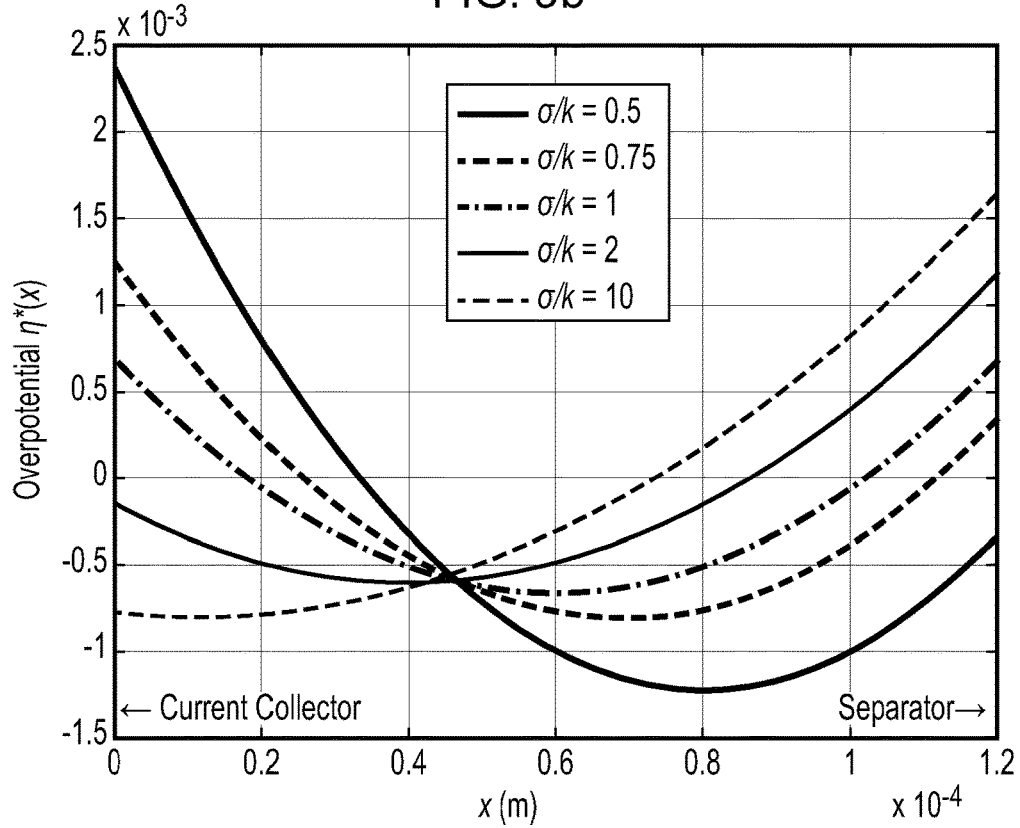
Figure 11A:
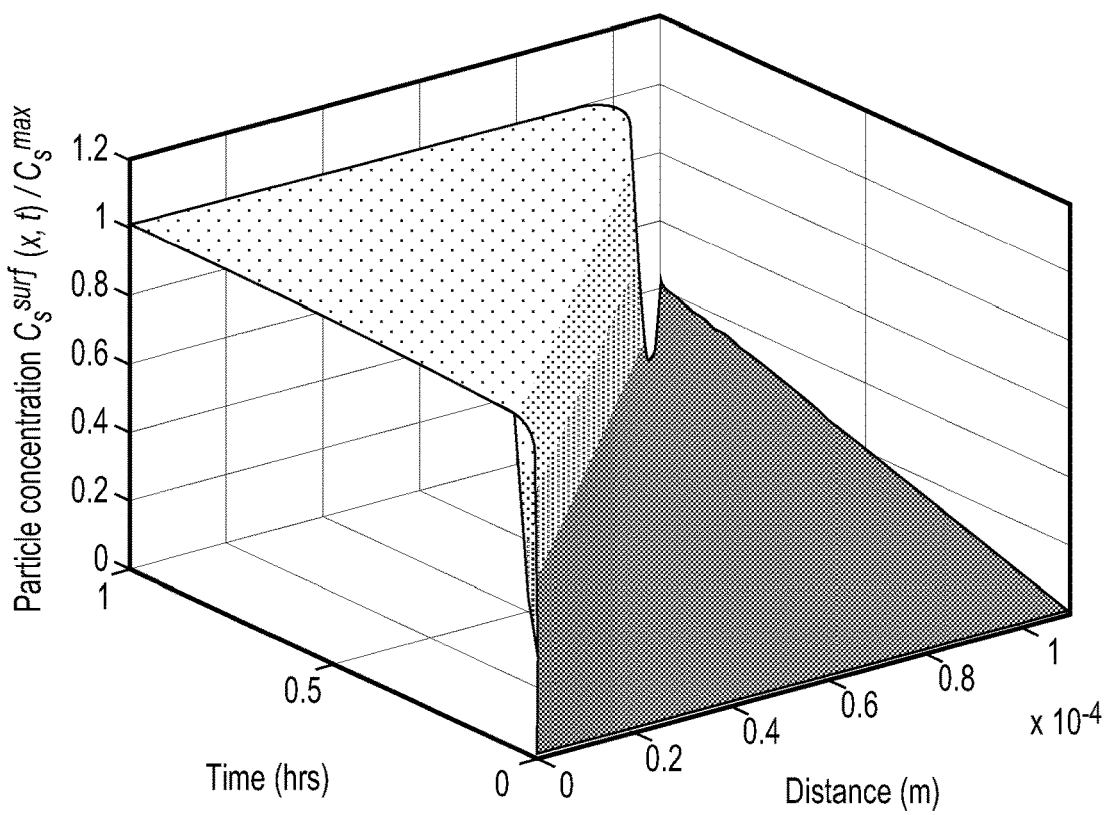
Figure 11B:
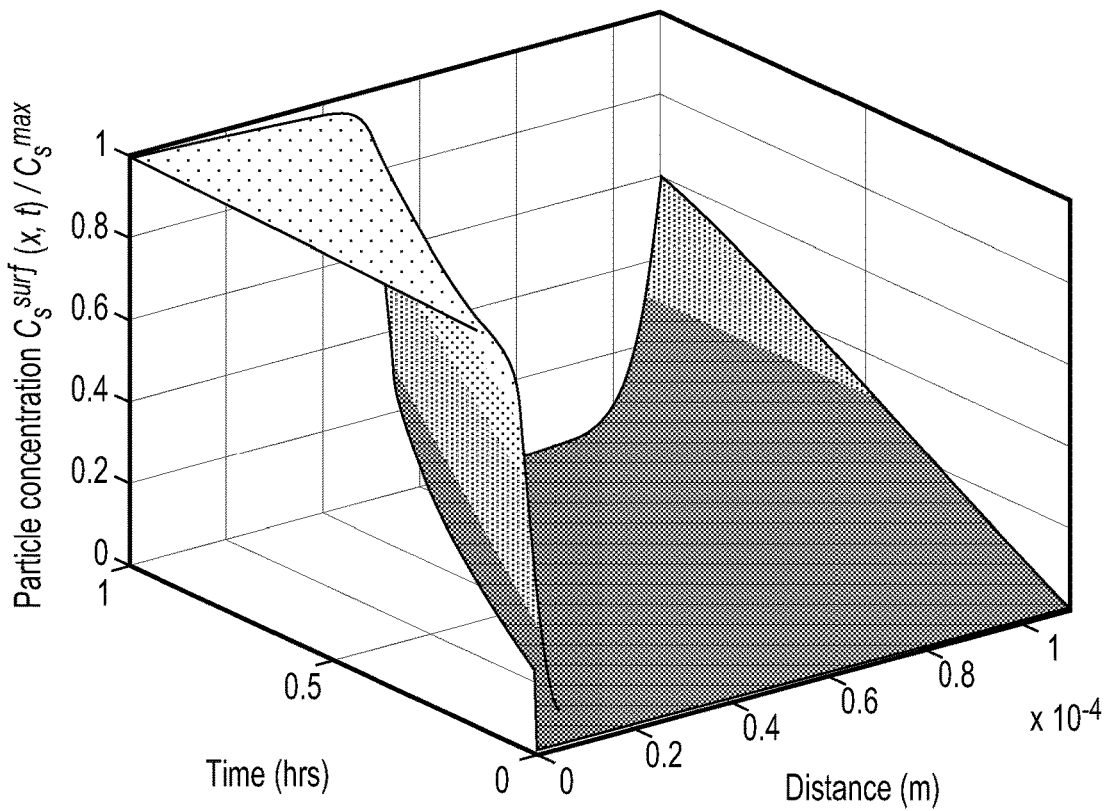
Figure 11C:
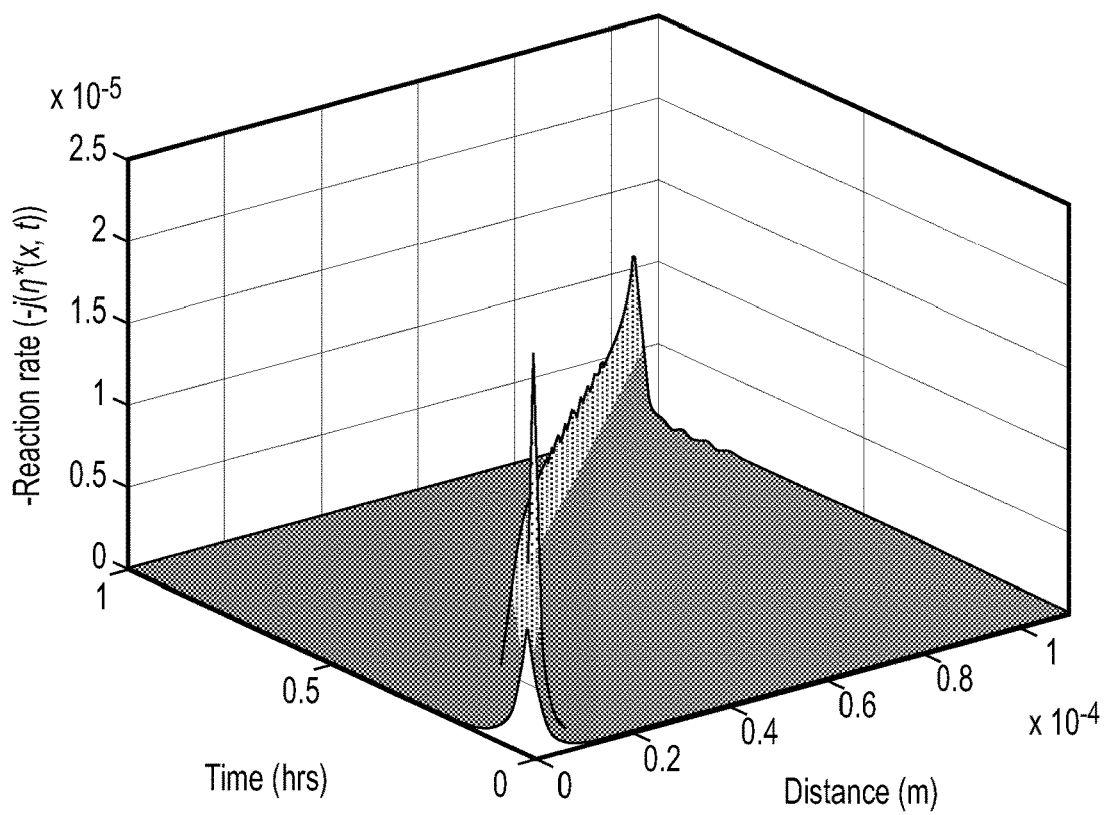
Figure 11D:
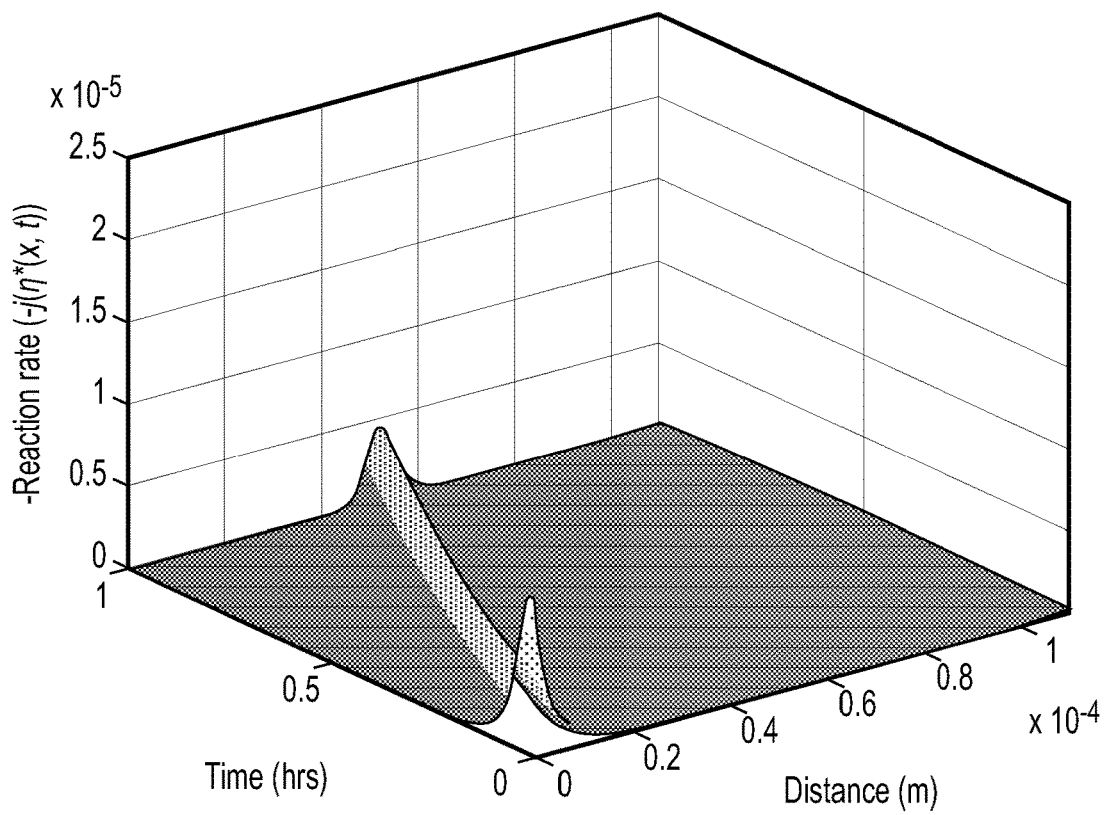
Figure 12:
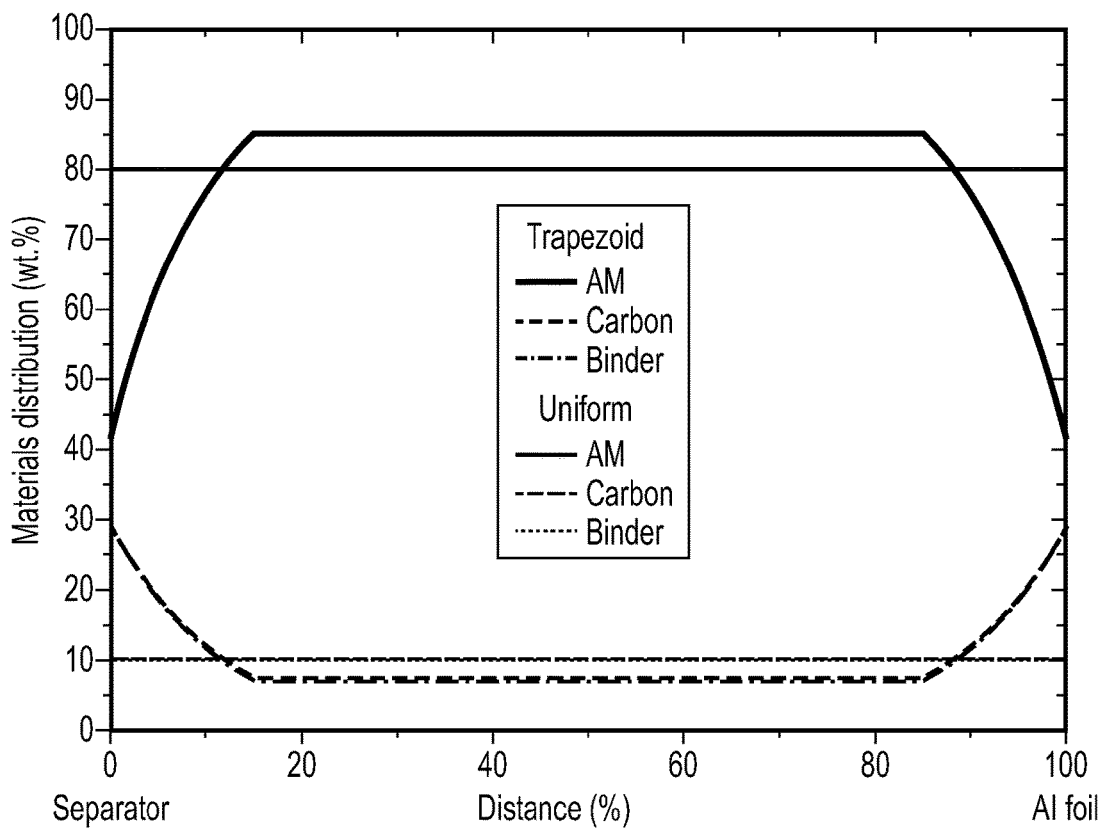
Figure 13:
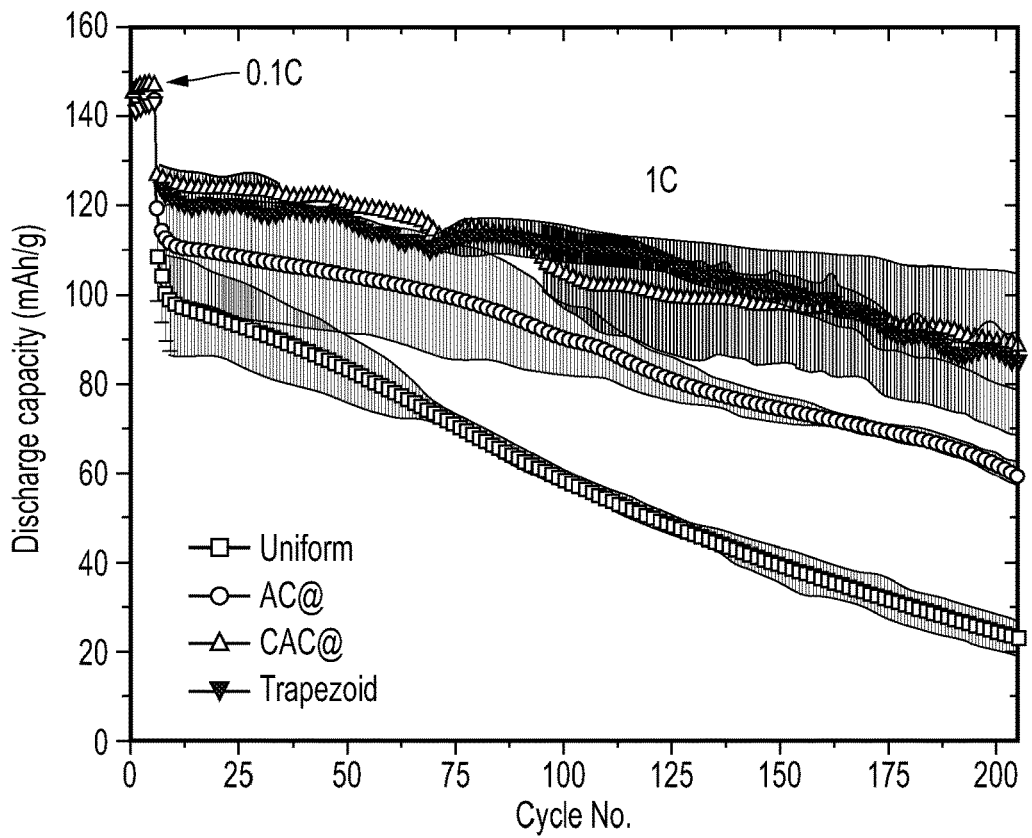
Figure 14A:
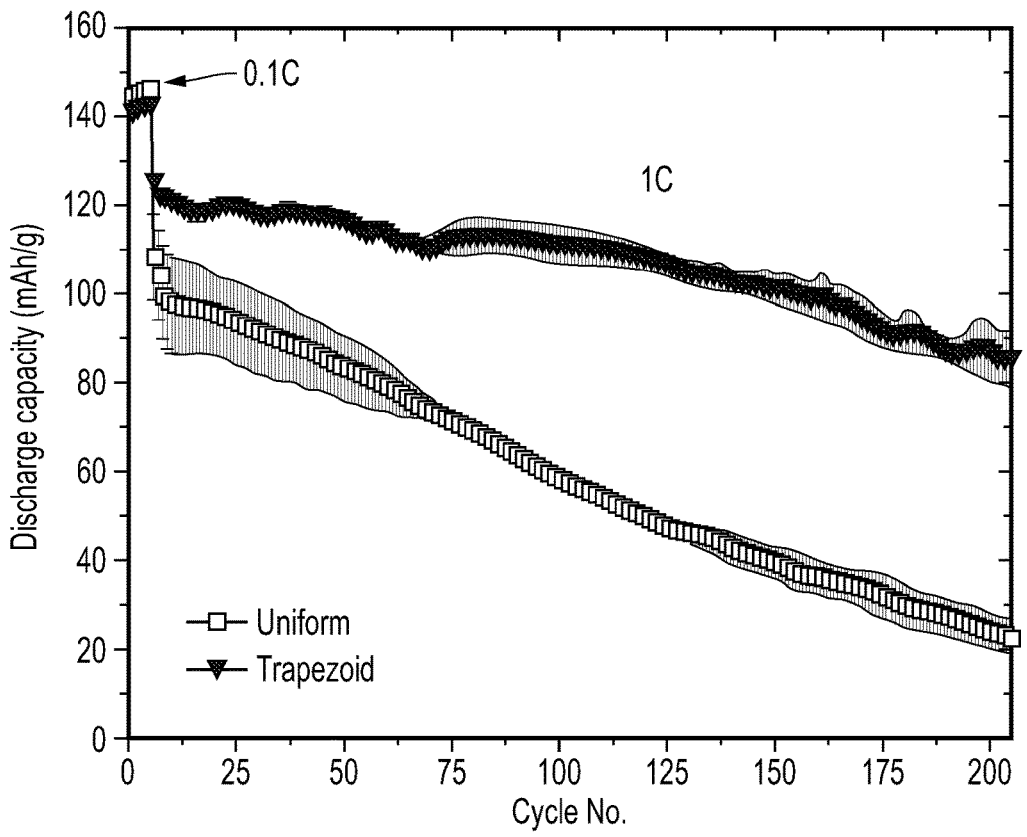
Figure 14B:
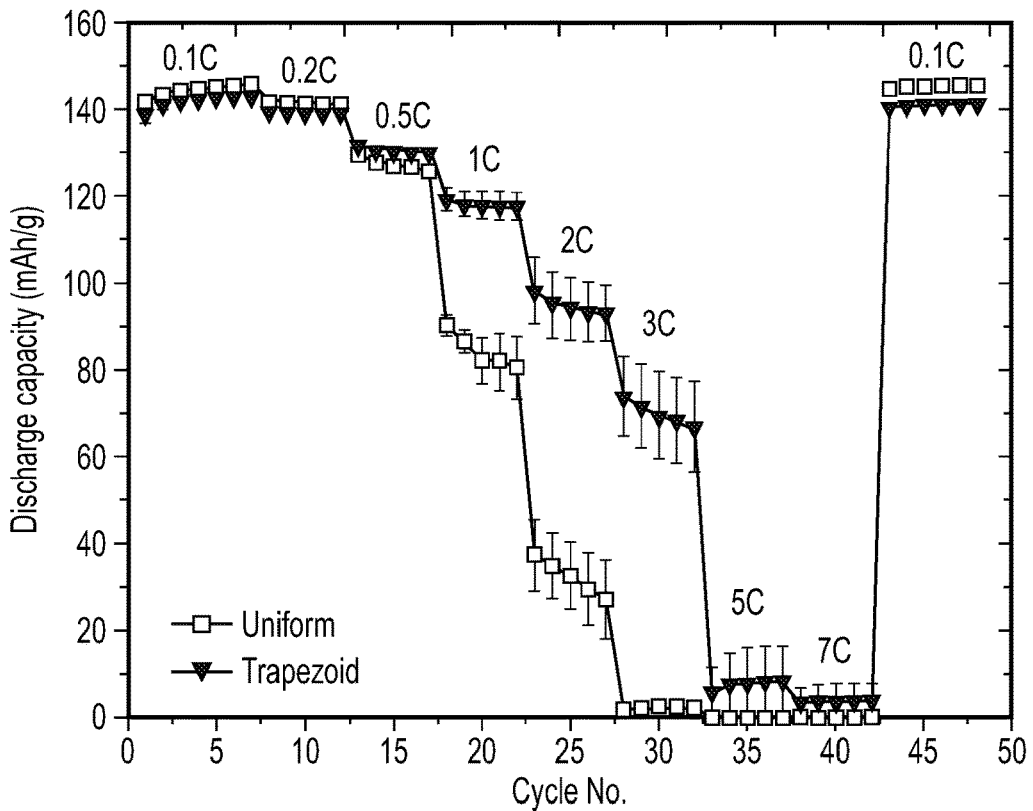
Figure 15:
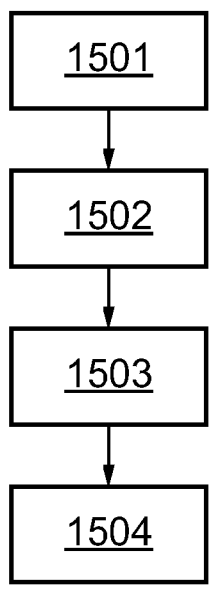
Figure 16:
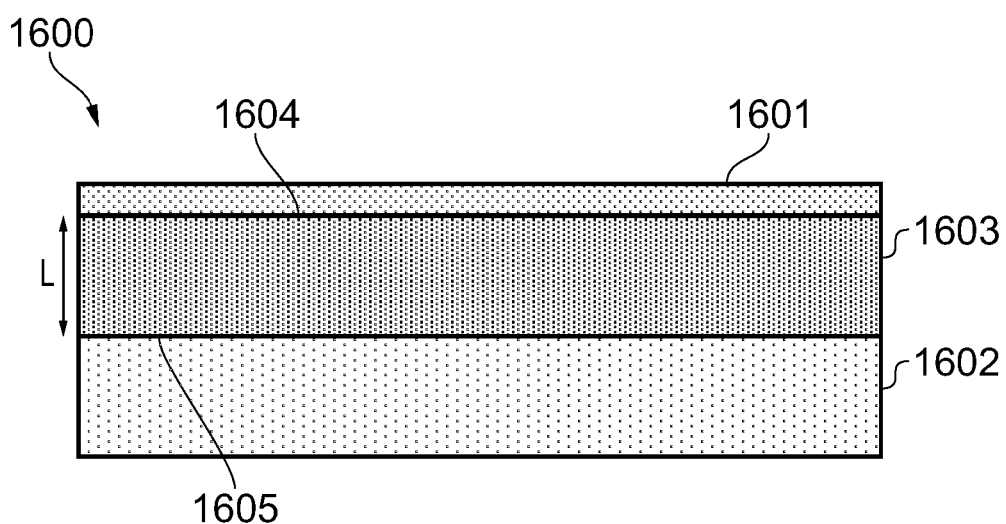
Figure 17:
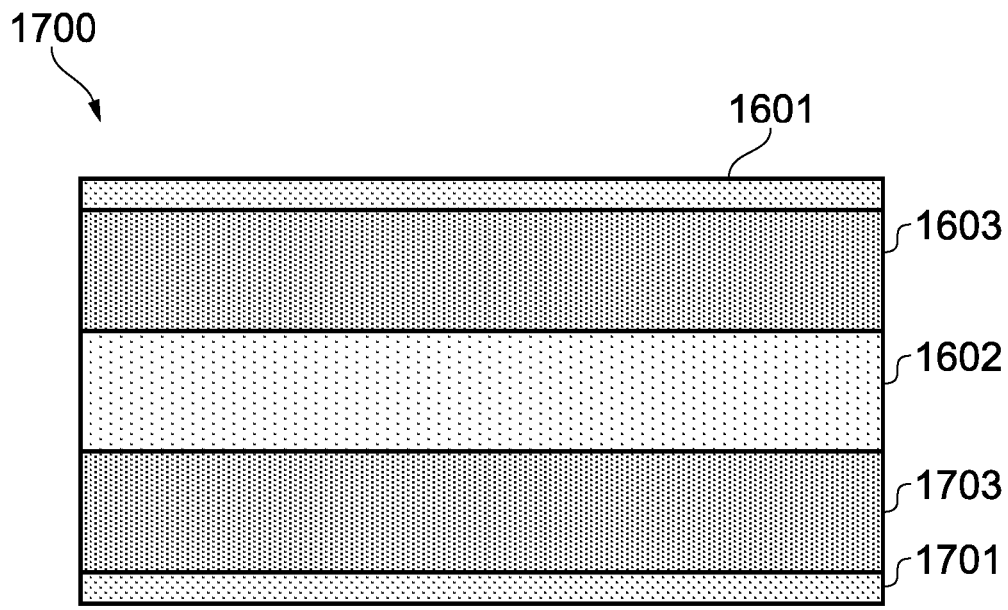
Figure 18:
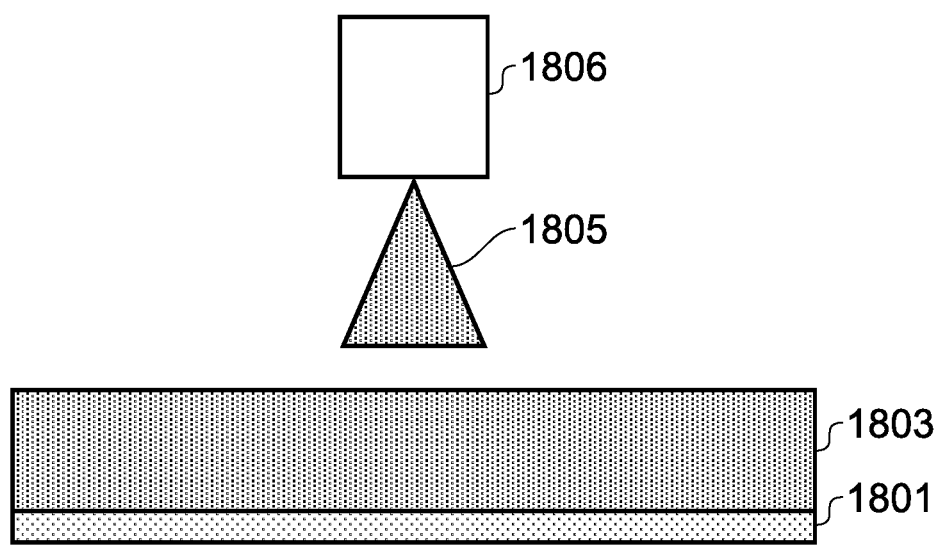
Figure 19:
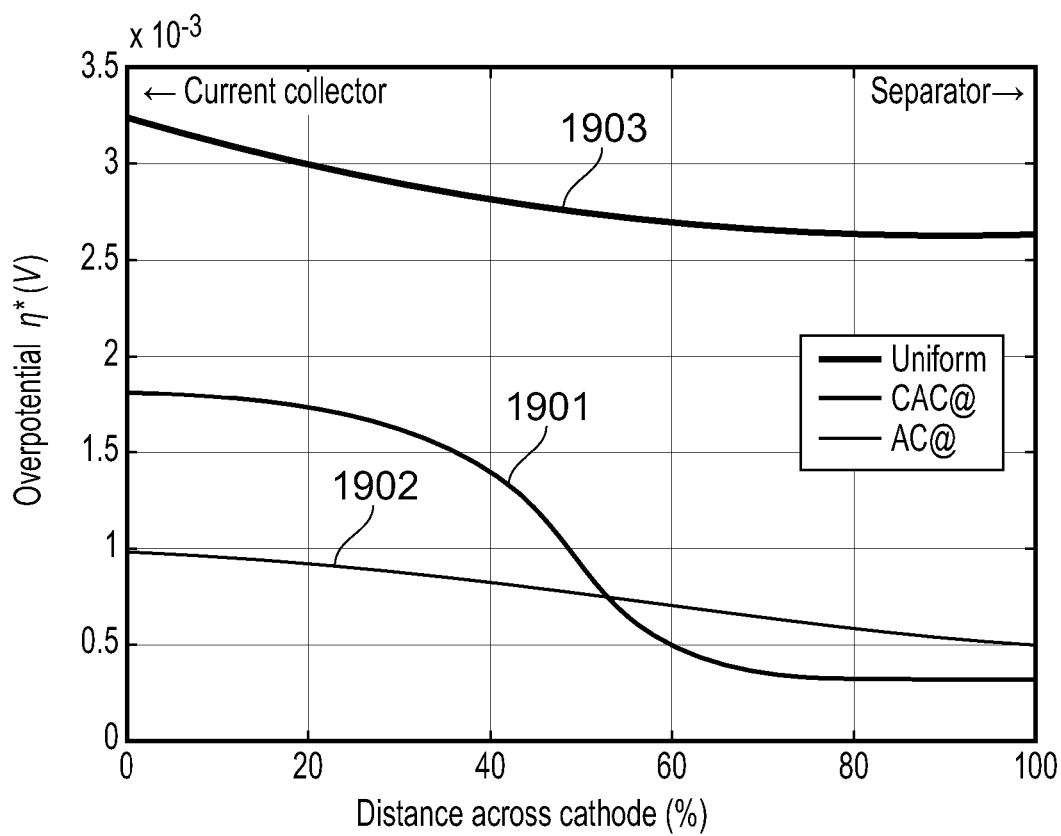

FIGS. 6a-c are Bode plots of the impedance magnitude as a function of frequency for the AC@ graded electrode, CAC@ electrode and uniform electrode respectively;

FIG. 7 is a plot of distribution of active material weight fraction through an electrode, as generated by solving Algorithm 1 for different average weight fractions;

FIG. 8a is a plot of overpotential as a function of distance through the electrode for graded and uniform electrodes having differing average active material weight fractions;

FIG. 8b is a plot of reaction rate as a function of distance through the electrode for graded and uniform electrodes having differing average active material weight fractions;

FIGS. 9a and 9b are plots of peak reaction rate and average reaction rate respectively as a function of average active material weight fraction for graded and uniform electrodes;

FIG. 10 is a plot of overpotential as a function of distance through an electrode for differing ratios of electronic to ionic conductivity;

FIGS. 11a and 11b are plots of particle concentration as functions of distance through the electrode thickness and time for a uniform slurry cast electrode and a graded electrode respectively;

FIGS. 11c and 11d are plots of reaction rate as functions of distance through the electrode thickness and time for a uniform slurry cast electrode and a graded electrode respectively;

FIG. 12 is a plot of material wt. % as a function of distance through an electrode for an example trapezoidal distribution of active material;

FIG. 13 is a plot of discharge capacity as a function of cycle number for various LFP half-cells with differing active material distributions;

FIGS. 14a and 14b are plots of discharge capacity as a function of cycle number for uniform and graded electrodes;

FIG. 15 is a schematic flow diagram illustrating an example method of designing an electrode;

FIG. 16 is a schematic diagram of an example electrode assembly;

FIG. 17 is a schematic diagram of an example cell;

FIG. 18 is a schematic diagram illustrating an example method of manufacturing an electrode; and FIG. 19 is a plot of overpotential as a function of distance across the cathode for graded and uniform electrodes with a unit applied current I(t)=1A.

By applying the teaching of the present disclosure, electrodes for use in energy storage devices, including lithium ion batteries, may be improved. Consequently, energy storage devices having improved performance may be realised. Realisable improvements may include, for example, higher energy density, higher power density, longer life. The teaching of the present disclosure may provide, in particular, a methodology to enable optimisation of the spatial distribution of the different materials used in electrodes for energy storage devices such as lithium ion batteries. Currently, such optimisation typically is attempted using trial and error, which may be time consuming and inefficient. In particular, this may lead to manufacturing inefficiencies, e.g. in terms of waste and/or downtime, and/or may lead to sub-optimal electrodes being manufactured. Applying the methodologies disclosed herein may mitigate one or more of these problems.

The design process described herein relies on understanding the impact of electrode grading by modelling the impedance response of graded LFP half-cells. Focusing on an impedance analysis enables the impact of the various electrochemical phenomena from the electrode grading to be unraveled more explicitly than discharge curves. Several model based studies on graded electrodes have been previously conducted, including [14, 2, 5, 33, 4, 32, 21, 14, 19, 42, 41], which considered shaping the local electrode porosity via electrode layering to improve battery energy/power densities as well as health and thermal response, generalising previous results that optimised electrode lengths and porosities etc. [40, 36, 12, 15, 9]. But, due to a previous lack of manufacturing methods, little consideration was given in these studies on how to construct the proposed optimal designs; except where layered slurry cast $LiNi_{0.5}Mn_{1.5}O_4$ electrodes were produced with an 8% reduction in capacity fade over equivalent uniform electrodes.

These studies highlight the potential for graded electrodes to improve Li-ion battery energy density, power density and lifespan (through reduced degradation) as well as presenting opportunities to control temperature distributions across the Li-ion battery (both through the electrode thickness and in the plane). These battery performance metrics are highly interconnected, but are all directly related to how the electrode microstructure is used. By locally controlling the electrode microstructure and optimising its design in a rational manner, as illustrated here, there is a real opportunity to improve each of these metrics simultaneously, leading to more efficient battery designs. In order for the design optimisation to be rational, it should be conducted along with a model of the Li-ion battery that describes the electrochemical response, i.e. the internal electrochemical reactions occurring within the cell and the local dynamics of the active material in the electrodes as the cell charges and discharges. Such a model is introduced and parameterised here.

Following [3], an analysis of impedance data of Li-ion half-cells consisting of an LFP cathode and a lithium foil anode is considered. LFP is a widely used cathode material for Li-ion batteries, particularly for EV applications, due to its high energy density and electrochemical stability. The main limitation of LFP follows from its inherent stability; it is insulating and so has low ionic and electronic conductivities [39]. Improvements to LFP electronic conductivity is the main focus of the graded electrode design approach considered here, where the spatially varying microstructure is designed to exploit the non-homogeneous usage of LFP cathodes [43, 46], as previously considered in [23, 24, 25], although the principles may also apply to other electrode chemistries. As a general rule, it is predicted that grading will find most value when applied to thick, active-material-rich electrodes with low conductivities that experience high currents. As such, LFP cathodes are particularly appropriate materials for grading, although other chemistries, such as Ni-rich $LiNi_{1-x-y}Mn_xCo_yO_2$ (NMC) cathodes, have also demonstrated similar heterogeneous behaviour [50]. In terms of modelling, despite their surface stability, LFP cathodes are described by a complex system formed of multi-phase particles with hysteresis between charging and discharging [37, 38], non-homogeneous electrode currents [37, 43, 46] and flat open-circuit-potentials, making physical interpretations of their response solely from current/voltage data challenging [34]. For this reason, the predictions of the electrochemical developed here were compared against experimental data for validation. The main features disclosed herein are:

1) The development of an electrochemical model for Li-ion half-cells with graded LFP cathodes.
2) Demonstrating that increasing the carbon content at the current collector significantly reduces the charge transfer and contact resistances. This was primarily caused by the local increase in carbon content at the current collector increasing the cathode's electronic conductivity and reducing the reactivity constant.
3) The carbon content of LFP cathodes should be concentrated at the current collector.
4) The ratio of electronic to ionic conductivity determines whether the particles at the current collector or the separator discharge first.
5) The improved cycle life of graded LFP cells is due to the reduced percentage of particles being fully discharged upon cycling.
6) The explanation of the pole at $\omega \approx 10^3$ Hz seen in the LFP impedance being due to the movement of lithium through an SEI (solid-electrolyte interface) layer at the anode is questioned.

The following guidelines are given to design graded LFP cathodes. Most of the active material should be located away from the current collector, and, instead, the carbon content should be increased there. Particles in this region will experience the most usage, increasing their stress and chance of cracking, eventually leading to a loss of active material. Battery resistance and heat generation rates may also be reduced with such a design. With different chemistries, where the electronic conductivity dominates the ionic conductivity, the active material rich region should instead be at the current collector. Future work will focus on the optimal design of graded electrodes that exploit these guidelines.

The various spatio-temporal variables of the battery model are defined in Table 1 and the model parameters are described in Table 2. Distance across the electrode is denoted by x, with x=0 being the current collector interface or boundary and x=L being the separator interface or boundary. Likewise, r defines the distance through the particles, with r=0 being the particle centre and $r=R_s$ being the particle surface, $R_s$ being the outer radius of a particle (assuming spherical particles).

Experimental Set-Up

Figure 1:
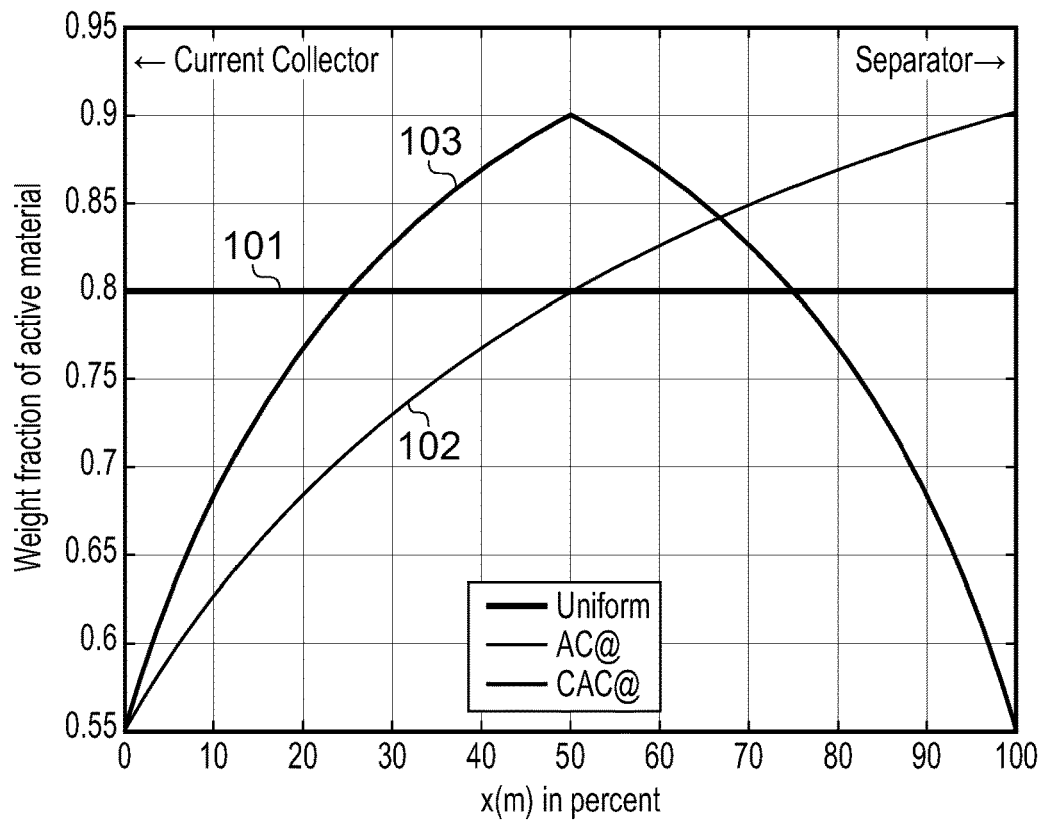
FIG. 1 is a plot of weight fraction of active material distributions through the thickness of graded and uniform cathodes.

Electrodes consisting of a compound mixture of active material (lithium iron phosphate consisting $\approx 80\%$ of the weight fraction), conductor (typically carbon black at $\approx 10\%$ of the weight fraction) and binder (typically polyvinylidene fluoride [PVDF] and also $\approx 10\%$ of the weight fraction) manufactured using the spray forming process of [3]. The basis of the electrode fabrication process is a high-pressure spray that deposits layer-by-layer a solution containing the electrode components onto the current collector, which is then near instantaneously evaporated using a hot plate. Using a program to control the layer-by-layer spray deposition, a near continuous distribution of the active material across the electrode can be built up. To achieve the controlled material variations in space across the electrode, two suspensions were formed, suspension A and suspension B, as illustrated in FIG. 1 of [3]. Suspension A was pumped into the spray nozzle by a peristaltic pump and was then atomized by compressed air at $\approx 0.4$ bar, the resulting spray suspension droplets then being deposited onto the foil current collector. The current collector was held at a constant temperature of 140° C. to enable the liquid fraction of the spray to evaporate near instantaneously. Simultaneously, the content of suspension A was modified by mixing it with suspensions B, leading to the controlled spatially varying electrode properties. Spraying this evolving suspension layer-by-layer allowed electrodes with near continuous through thickness variations of weight fraction of active material to be constructed, with a MATLAB code being used to control the pump rates [3].

The electrode components were: a $LiFePO_4$ based cathode with particles from Hydro-Quèbec (Canada), Super-P carbon black obtained from MTI (USA) used as a conducting agent and PVDF (polyvinylidene fluoride, MW around 534,000) as a binder, NMP (1-Methyl-2-pyrroli-dinone, ≥99.0%) and IPA (2-propanol, 99.5%) from Sigma-Aldrich (UK). Here, the CAC@ and AC@ designs of [3], with idealised distributions of active material weight fraction as shown in FIG. 1, were analysed. Each distribution has an overall average weight fraction of active material of 0.8, with the uniform distribution 101 having a constant weight fraction throughout the thickness, the AC@ distribution 102 a gradually increasing distribution from around 0.55 at x=0 to 0.9 at x=1 and the CAC@ distribution a gradual increase from around 0.55 at x=0 to 0.9 at x=0.5 and a corresponding decrease to around 0.55 at x=1. The true as-sprayed CAC@ and AC@ distributions are given in [3].

Electrochemical impedance spectroscopy (EIS) was performed using 10 mV sine wave perturbations in the frequency range 1 MHz down to 0.01 Hz after discharging to an open circuit voltage of 2.5 V and aging of approximately 12 h. Local porosity $\varepsilon(x)$ at a distance of x through the electrode was given by:

$$e(x) = 1 - \frac{W}{V}\left(\frac{p_1(x)}{d_1} + \frac{p_2(x)}{d_2} + \frac{p_3(x)}{d_3}\right) \quad \text{(equation 1)}$$

with W being the cathode weight, V the volume ($=L \times S_A$, i.e. the length multiplied by the cross-sectional area), $p_1$, $p_2$ and $p_3$ the relative percentages of active material, PVDF binder and carbon black respectively, and $d_1$, $d_2$ and $d_3$ their corresponding densities.

TABLE 1

Variables used in the electrochemical model
Variables of the Model

| | |
|---|---|
| $x \in [0, L]$ | Distance across the electrode. (m). |
| $r \in [0, R_s]$ | Distance through each particle. (m). |
| $j(\eta(x, t))$ | Interfacial reaction rate. |

TABLE 1-continued

Variables used in the electrochemical model
Variables of the Model

| | |
|---|---|
| $\eta(x, t)$ | Overpotential. (V). |
| $\phi_{dl}(x, t)$ | Electrode potential $\phi_{dl}(x, t) = \phi_s(x, t) - \phi_e(x, t)$. (V). |
| $i_0$ | Ion exchange current density. |
| $w(x)$ | Weight fraction of active material. $w(x) \in [0, 1]$. |
| $c_s(x, r, t)$ | Particle concentration. (mol m$^{-3}$). |
| $u_s(x, r, t)$ | $u_s(x, r, t) = rc_s(x, t)$. (mol m$^{-2}$). |
| $c_s^{surf}(x, t)$ | Concentration on particle surface. (mol m$^{-3}$). |
| $U(c_s^{surf}(x, t))$ | Open circuit potential. (V). |
| $c_e(x, t)$ | Electrolyte concentration. (mol m$^{-3}$). |
| $\phi_s(x, t)$ | Solid-phase potential. (V). |
| $\phi_e(x, t)$ | Liquid phase potential. (V). |
| $i_s(x, t)$ | Current in the solid phase. (A m$^{-2}$). |
| $i_e(x, t)$ | Ionic current in the liquid phase. (A m$^{-2}$). |
| $I(t)$ | Applied current. (A). |
| $i(t)$ | Applied current density. $i(t) = I(t)/S_A$. (A m$^{-2}$). |
| $v(t)$ | Measured voltage. (V). |
| $\Theta(x)$ | $\dfrac{F^2 i_0 a_s(x)}{RT}$ |
| $\Gamma(x)$ | $\sigma^{eff}(x)\,\kappa^{eff}(x)/(\sigma^{eff}(x) + \kappa^{eff}(x))$ (S m$^{-1}$). |
| $\Sigma(x)$ | Normalised ionic conductivity $\dfrac{\Gamma(x)}{\sigma(x)}$. |
| $\varepsilon(x)$ | Local porosity. |
| $\upsilon_{vol}(x)$ | Volume fraction of active material. |

TABLE 2

Electrochemical model parameters
Electrochemical Parameters

| Symbol | Definition | Value | Units |
|---|---|---|---|
| $\sigma_\infty$ | Free electronic conductivity | $6 \times 10^{-2}$ | S m$^{-1}$ |
| $b_\sigma$ | Bruggeman coefficient. | 1 | |
| $\kappa_\infty$ | Free ionic conductivity. | 2.6 | S m$^{-1}$ |
| $b_\kappa$ | Bruggeman coefficient. | 1.5 | |
| $D_e$ | Bulk ionic diffusivity. | $1.55 \times 10^{-7}$ | m$^2$ s$^{-1}$ |
| $b_{D_e}$ | Bruggeman coefficient. | 1.5 | |
| $D_e^{sep}$ | Separator ionic diffusivity. | $7.90 \times 10^{-8}$ | m$^2$ s$^{-1}$ |
| $a_s$ | Reactant surface area. | Eqn. (6) | m$^2$ |
| L | Cathode length. | $120 \times 10^{-6}$ | m |
| $C^{sp}$ | Specific capacitance. | $50 \times 10^3$ | F m$^{-3}$ |
| $D_s^{dc}$ | Li-deficient diffusion coef. | $7.3 \times 10^{-18}$ | m$^2$ s$^{-1}$ |
| $D_s^{ri}$ | Li-rich diffusion coef. | $9 \times 10^{-15}$ | m$^2$ s$^{-1}$ |
| R | Universal gas constant. | 8.3140 | J K$^{-1}$ mol$^{-1}$ |
| F | Faraday's constant. | 96487 | C mol$^{-1}$ |
| T | Temperature. | 297 | K |
| $t_+$ | Transference number. | 0.5 | |
| S | Electrode surface area. | $1.131 \times 10^{-4}$ | m$^2$ |
| n | # discretisation elements. | 10 | |
| $R_s$ | Particle radii. | $300 \times 10^{-9}$ | m |
| $R_s^{ri}$ | Radius of inner core region | $\lambda R_s$ | m |
| $\lambda$ | $R_s^{ri}/R_s$ | 0.9 | |
| $c_e^*$ | Equilibrium electrolyte concentration. | $10^3$ | 5.6 |
| $c_s^{max}$ | Max. particle concentration. | $10^3$ | mol m$^{-3}$ |
| $c_s^{surf,*}$ | Local state-of-charge. | $0.8\,c_s^{max}$ | mol m$^{-3}$ |
| $dU(\cdot)/dc_s^{surf}$ | Open circuit potential slope. | $-5.4 \times 10^{-6}$ | V m$^3$ mol$^{-1}$ |
| $\alpha_\varepsilon$ | Porosity gradient. | $-0.586$ | |
| $\beta_\varepsilon$ | Porosity constant. | 11 | |
| $\theta_{k_{i0}}$ | Reactivity scaling term. | $1.4095 \times 10^{-10}$ | |
| $\rho_{k_{i0}}$ | Reactivity parameter. | $-5.2664 \times 10^{-11}$ | |
| $\theta_{\sigma_\infty}$ | Conductivity scaling term. | $-0.1820$ | |
| $\rho_{\sigma_\infty}$ | Conductivity parameter. | 0.1532 | |
| $R_{res}$ | Voltage resistance. | 7.8 | $\Omega$ |

TABLE 3

Model parameters for the contact and anode dynamics

| | CAC@ | AC@ | Uniform |
|---|---|---|---|
| Contact resistance | | | |
| $\tau_{con}$ | $1.83 \times 10^{-4}$ | $1.83 \times 10^{-4}$ | $1.60 \times 10^{-3}$ |
| $k_{con}$ | $63.1 \times 10^3$ | $40.8 \times 10^3$ | $3.87 \times 10^4$ |
| Li-Foil Anode | | | |
| $\tau_{SEI}$ | $2.1 \times 10^3$ | $2.1 \times 10^3$ | $2.1 \times 10^3$ |
| $k_{SEI}$ | 531 | 531 | 531 |
| $k_{Li}$ | 0.75 | 0.75 | 0.75 |

Electrochemical Model for Graded LFP Cathodes

An electrochemical model was used to interpret the impedance data of half-cells with graded LFP cathodes. The model is posed within the classic framework of the Newman group (see e.g. [6, 26, 11]) and so is subject to the standard assumptions of that approach, such as electrode homogenisation and the pseduo-2D domain [27].

Dependence of Model Parameters on Active Material

Prior to introducing the model equations, a relationship between the local weight fraction of active material $w(x)$ (the controlled variable of the spray forming process taking values in [0, 1] with $w(x)=0$ being no particles and $w(x)=1$ being particle full) and the model parameters, in particular $\sigma(x)$, $\kappa(x)$ and $a_s(x)$ [52, 20], was established. This was done by relating $w(x)$ to the porosity $\varepsilon(x)$ and then applying Bruggeman relationships to express the local conductivities in terms of the porosity $\varepsilon(x)$. Both the reactivity constant $k_{i0}$ and the free electronic conductivity $\sigma_\infty$ were also related to the active material weight fraction at the current collector.

Figure 2A:
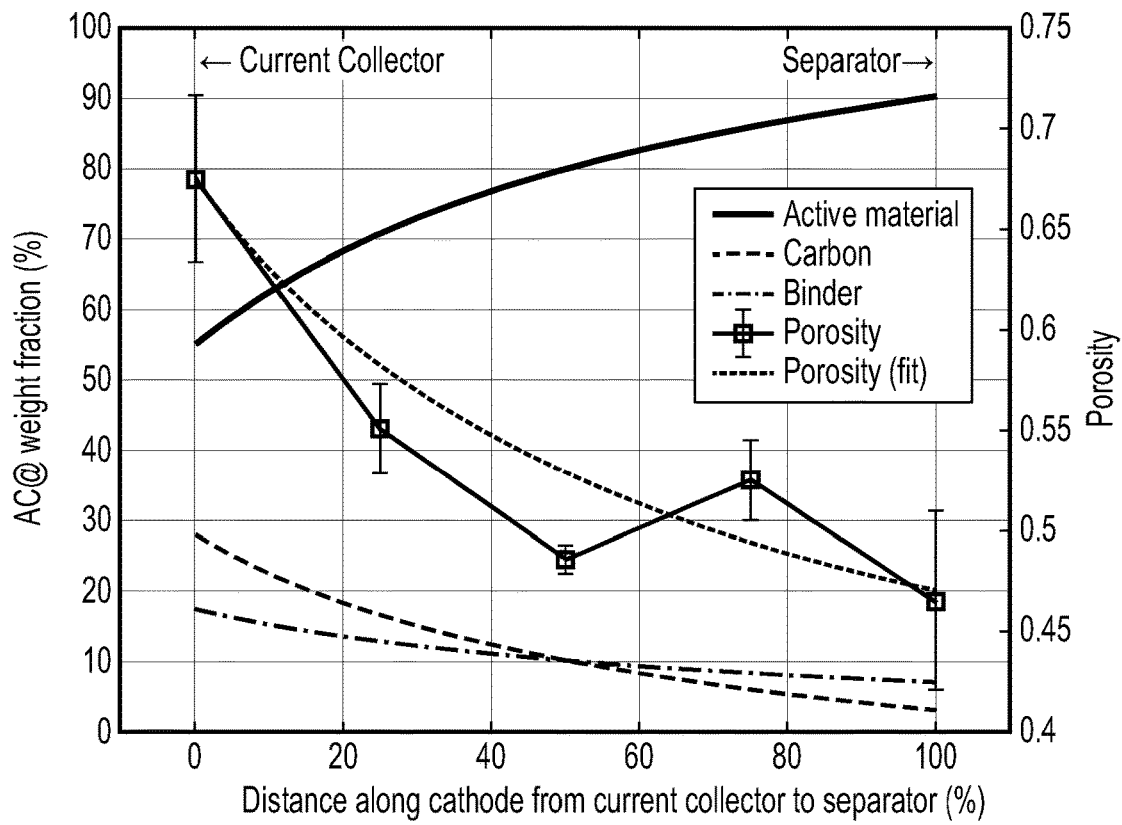
FIG. 2a is a plot of porosity as a function of active material weight fraction for the AC@ electrode design of [3]
Figure 2B:
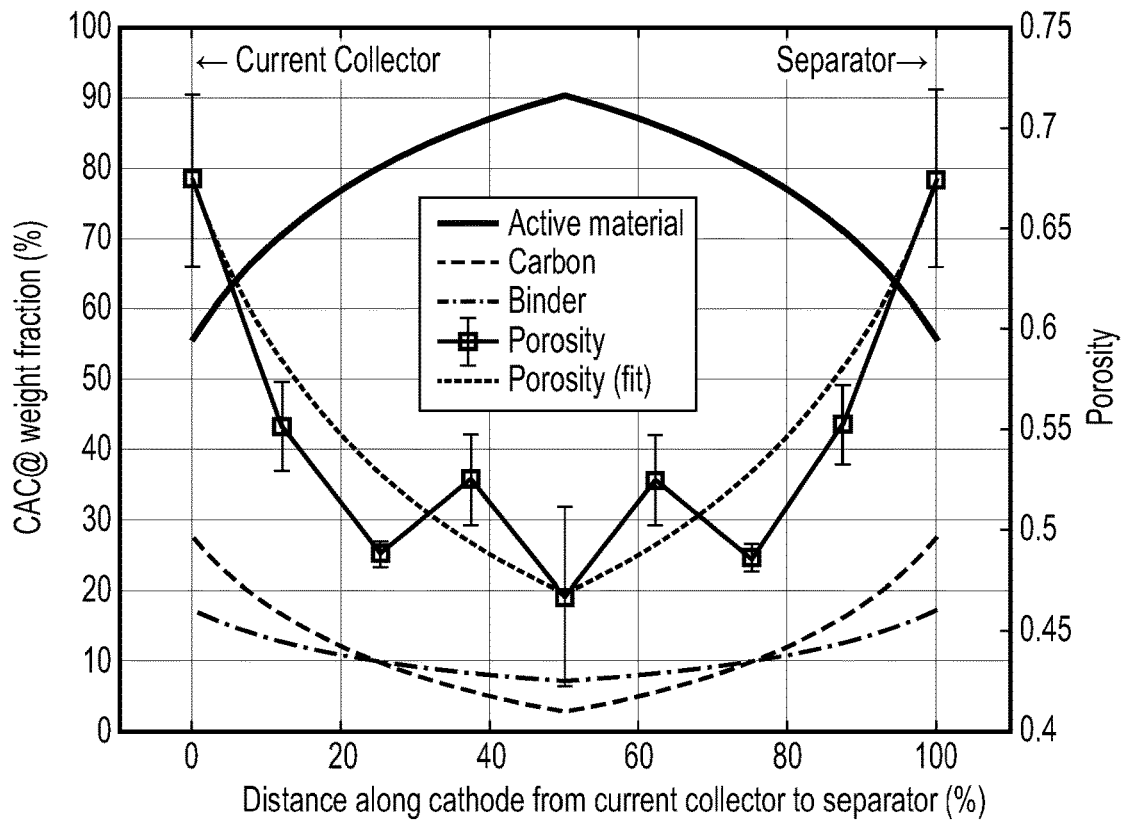
FIG. 2b is a plot of porosity as a function of active material weight fraction for the CAC@ design of [3]

FIGS. 2a and 2b plot the local porosity $\varepsilon(x)$ through the thickness of the graded electrodes AC@ and CAC@ respectively, as measured using equation (1) above. A negative correlation between the porosity and the weight fraction of active material can be seen in this data and is assumed to satisfy the simplified affine relationship $$\varepsilon(x) = \alpha_\varepsilon w(x) + \beta_\varepsilon \qquad \text{(equation 2)}$$

with $\alpha_\varepsilon = -0.59$ and $\beta_\varepsilon = 1.0$. This measured negative correlation between increasing active material weight fraction and porosity conflicts with [52], which instead showed a positive correlation.

In [52], this was explained by an increasing $w(x)$ introducing voids between the particles, although, no such effect was found in the material considered here. With a connection between active material weight fraction $w(x)$ and porosity $\varepsilon(x)$ defined, the impact of changes in $w(x)$ upon the electrode conductivities can then be established using Bruggeman relationships, with electronic conductivity $\sigma(x)$, ionic conductivity $\kappa(x)$ and electrolyte diffusivity $D_e^{eff}(x)$ given by the following relationships:

$$\sigma(x) = \sigma_\infty \varepsilon(x)^{b\sigma} \qquad \text{(equation 3)}$$

$$\kappa(x) = \kappa_\infty \varepsilon(x)^{b\kappa} \qquad \text{(equation 4)}$$

$$D_e^{eff} = D_e \varepsilon(x)^{bDe} \qquad \text{(equation 5)}$$

where $\kappa_\infty$, $\sigma_\infty$, $D_e$ are the conductivities/diffusivity coefficients with $\varepsilon=1$ and $b\sigma$, $b_\kappa$, $b_{De}$ the Bruggeman coefficients.

As well as influencing the conductivities, changing the weight fraction of active material also affects the local reacting surface area $a_s(x)$. Assuming spherical particles, this area is given by:

$$a_s(x) = \frac{3v_{vol}(x)}{R_s} \approx \frac{3(1-\varepsilon(x))}{R_s} = -\frac{3\sigma_\varepsilon w(x)}{R_s} \quad \text{(equation 6)}$$

where $v_{vol}(x)$ is the volume fraction of active material.

In the model, the contact between the cathode and the current collector was found to substantially influence the response of the LFP half-cells [13]. To capture this effect, both the reactivity constant $k_{i_0}$ and the free electronic conductivity $\sigma_\infty$ were parameterised in terms of the weight fraction of active material at the current collector $w(0)$, by the following relationships:

$$k_{i_0} = \theta_{k_{i_0}} w(0)(w(0) - p_{k_{i_0}}), \quad \text{(equation 7a)}$$

and $$\sigma_\infty = \theta_{\sigma_\infty}(w(0) - 1)(w(0) - p_{\sigma_\infty}). \quad \text{(equation 7b)}$$

Figure 3:
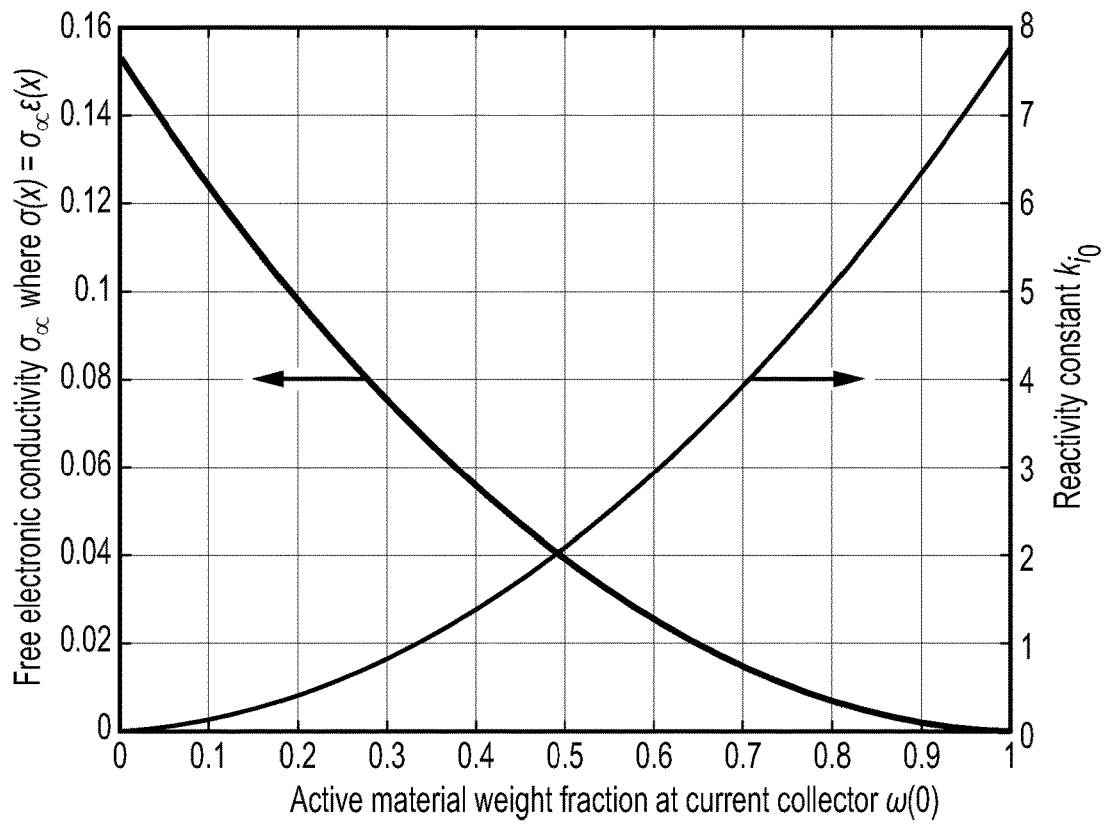
FIG. 3 is a plot of dependency of the free electronic conductivity $\sigma_\infty$ and reactivity constant $k_{i0}$ on the weight fraction of active material at the current collector w(0)

These two dependencies are illustrated in FIG. 3. The relationships between free electronic conductivity and reactivity constant with the active material weight fraction at the current collector were found to be important factors relating to the accuracy of the model, and reveal the significance of the carbon content at the current collector to the performance of the graded LFP cathode. The free electronic conductivity at the current collector reaches a maximum at a minimum active material weight fraction, while the reactivity constant reaches a minimum. In essence, equations 7a and 7b state that the electron flux in the cathode's solid matrix is determined by its connectivity to the current collector, which is a function of the carbon content at the current collector.

Equations for Current Flow

With the dependencies between the controlled active material weight fraction $w(x)$ and the electrochemical parameters established, an electrochemical model for graded LFP cathodes can be introduced. The basis of the model is the following four sets of equations from the DFN model:

$$C^{sp}\frac{\partial \phi_{dl}(x,t)}{\partial t} = \frac{\partial i_e(x,t)}{\partial x} - a_s F j(x,t) \quad \text{(equation 8a)}$$

$$i_e(x,t) = -\kappa(x)\frac{\partial \phi_e(x,t)}{\partial x}, \quad \text{(equation 8b)}$$

$$i_s(x,t) = -\sigma(x)\frac{\partial \phi_s(x,t)}{\partial x}, \quad \text{(equation 8c)}$$

$$i(t) = i_s(x,t) + i_e(x,t). \quad \text{(equation 8d)}$$

Equation (8a) is the divergence equation adapted with a double layer effect [29, 8], (8b) is MacInnes' equation without electrolyte effects, (8c) is Ohm's law for the solid phase current and (8d) is Kirchhoff's law for current conservation of the two phases of the electrode.

The system described by the above equations is driven by the applied current density $i(t)$ and the interfacial reaction rate $j(\bullet)$, which governs lithium intercalation into the particles. Within the DEN model framework, the interfacial reaction rate is described by Butler-Volmer kinetics according to the following relationship:

$$j(\eta(x,t)) = i_0 \sinh\left(\frac{F}{RT}\eta(x,t)\right), \quad \text{(equation 9)}$$

which is a function of the overpotential $\eta(x,t)$, given by:

$$\eta(x,t) = \phi_s(x,t) - \phi_e(x,t) - U(u_s^{surf}(x,t)) \quad \text{(equation 10)}$$

and the ion exchange current density $i_0$, given by:

$$i_0(x) = k_{i_0} F\left(c_s^{max} - c_s^{surf,*}\right)^{\frac{1}{2}} \left(c_s^{surf,*}\right)^{\frac{1}{2}} \left(c_e^*\right)^{\frac{1}{2}}, \quad \text{(equation 11)}$$

which may be assumed to be constant under the small signal assumption of impedance. For impedance analysis, the non-linear Butler-Volmer kinetics can be linearised around $\eta(x) = 0$ as:

$$a_s(x) j(\eta(x,t)) \approx \frac{F^2 i_0 a_s(x)}{RT}\eta(x,t) = \ominus(x)\eta(x,t). \quad \text{(equation 12)}$$

The model boundary conditions at the current collector are such that all of the current is carried by electrons in the solid phase with $i_s(0,t) = i(t)$, $i_e(0,t) = 0$, while at the separator boundary, all of the current is carried by ions in the electrolyte with $i_e(L,t) = i(t)$, $i_s(L,t) = 0$.

The voltage drop across the electrode is given by:

$$v(t) = v_\varphi(t) + v_{contact}(t) + v_{anode}(t) + v_{c_e}(t) + R_{res}i(t) \quad \text{(equation 13)}$$

where $v_\varphi(t)$ is the potential difference between the solid at the current collector and the liquid at the separator, which accounts for the charge transfer resistance and solid state diffusion, $v_{contact}(t)$ is the voltage drop from the contact resistance at the current collector/cathode interface [13], $v_{ce}(t)$ is the potential induced by the bulk electrolyte concentration build-up and $v_{anode}(t)$ is caused by the voltage drop across the SEI (solid-electrolyte interface) at the anode [34].

Overpotential Dynamics

Overpotential relaxation dynamics are now introduced to define the charge transfer resistance, which is the resistance overcome to transport charge carried by an electron at the current collector to an ion at the separator. Following [8], the ionic current is first expressed as $$i_e(x,t) = i(t) - i_s(x,t) = i(t) + \sigma(x)\frac{\delta\phi_s(x,t)}{\delta x}$$

and then adding and subtracting $\kappa(x)\delta\phi_s(x,t)/\delta x$ from the right hand side of equation 8b gives:

$$i_e(x,t) = \Gamma(x)\frac{\partial \phi_{dl}(x,t)}{\partial x} + \Sigma(x)i(t) \quad \text{(equation 14)}$$

where $\Gamma(x) = \sigma^{eff}(x)\kappa^{eff}(x)/(\sigma^{eff}(x) + \kappa^{eff}(x))$ and $$\Sigma(x) = \frac{\Gamma(x)}{\sigma(x)}.$$

Note that if $\sigma$ is much smaller than $\kappa$, as is often the case for LFP cells, then $\Gamma(x) \approx \kappa(x)$ and $\Sigma(x) \approx 1$. Differentiating the above expression in space (under the assumption that $w(x)$ is differentiable) gives the ionic current flux according to the following relationship:

$$\frac{\partial i_e(x,t)}{\partial x} = \frac{\partial}{\partial x}\left(\Gamma(x)\frac{\partial \phi_{dl}(x,t)}{\partial x}\right) + \frac{d\Sigma(x)}{dx}i(t). \quad \text{(equation 15)}$$

The convective, spatially varying diffusion and resistive terms in this equation can be manipulated by graded electrodes. Note that if $b_\sigma = b_\kappa$ then $$\frac{d\Sigma(x)}{dx} = 0.$$

Substituting equation 15 back into the capacitive equation (8a) gives the following relationship:

$$C^{sp}\frac{\partial \phi_{dl}(x,t)}{\partial t} = \frac{\partial}{\partial x}\left(\Gamma(x)\frac{\partial \phi_{dl}(x,t)}{\partial x}\right) + \frac{d\Sigma(x)}{dx}i(t) - a_s(x)Fj(\eta(x,t)).$$ (equation 16)

Equation (16) is not in a state-space form from which it is possible to derive impedance, as $\varphi_{dl}$ and $\eta$ have different equilibria. This issue may be overcome by converting the equation into a model for overpotential dynamics. Assuming that the slope of the open circuit potential (OCP) $U(c_s^{surf})$ with respect to the particle surface concentration $(c_s^{surf})$ is small, so that $dU(c_s^{surf})/dc_s^{surf} \approx 0$ (which predominantly is the case for LFP cells) then equation 10 above implies that variations in the electrode potential are approximately the same as the overpotential, i.e. $\partial \varphi_{dl}(x,t) = \partial \eta(x,t)$, so that)

$$C^{sp}\frac{\partial \eta(x,t)}{\partial t} = \frac{\partial}{\partial x}\left(\Gamma(x)\frac{\partial \eta(x,t)}{\partial x}\right) + \frac{d\Sigma(x)}{dx}i(t) - a_s(x)Fj(\eta(x,t)).$$ (equation 17)

For small-signal impedance analysis, the nonlinearity $j(\cdot)$ in equation 18 may be linearised around $\eta = 0$, as in equation 12 to give a spatially heterogeneous semi-linear convection-reaction-diffusion equation:

$$C^{sp}\frac{\partial \eta(x,t)}{\partial t} = \frac{\partial}{\partial x}\left(\Gamma(x)\frac{\partial \eta(x,t)}{\partial x}\right) + \frac{d\Sigma(x)}{dx}i(t) - \theta(x)\eta(x,t).$$ (equation 18)

The equivalent dynamics for uniform electrodes are $$C^{sp}\frac{\partial \eta(x,t)}{\partial t} = \Gamma\frac{\partial^2 \eta(x,t)}{\partial^2 x} - \frac{i_0 a_s F}{RT}\eta(x,t),$$ (equation 19)

which is a reaction-diffusion equation with an analytical solution [29]. No such analytical solution could be found for equation 18 with generic spatially varying coefficients.

Under the flat OCP assumption, the boundary conditions for the overpotential n (x,t) at the current collector are:

$$\left.\frac{\partial \eta(x,t)}{\partial x}\right|_{x=0} = -\frac{1}{\sigma(0)}i(t)$$ (equation 20a)

and at the separator are:

$$\left.\frac{\partial \eta(x,t)}{\partial x}\right|_{x=L} = \frac{1}{\kappa(L)}i(t).$$ (equation 20b)

These boundary conditions illustrate the importance of $\sigma(0)$ and $\kappa(L)$ to the battery, since they determine the applied current fluxes driving the electrochemical response.

The relaxation of the double layer, as in the dynamics of $\eta$, is significantly faster than the other electrochemical phenomena in the proposed model, such as solid-state diffusion. This time-scale separation can be exploited to decouple the various electrochemical effects in the impedance and simplify the analysis. Specifically, for a unit applied current $i(t)=1$, the equilibrium overpotential $\eta^*(x)$ is defined as the solution to the following equation:

$$0 = \frac{d}{dx}\left(\Gamma(x)\frac{\partial \eta^*(x)}{dx}\right) + \frac{d\Sigma(x)}{dx} - \theta(x)\eta^*(x)$$ (equation 21)

where $\eta^*(x)$ is subject to the boundary conditions of equations 20a and 20b, with $i(t)=1$. The spatially varying equilibrium reactivity $j(\eta^*(x))$ can then be computed exactly for a unit applied current density.

Understanding the contribution to the voltage from the various electrochemical effects $v_\varphi$ is key to enabling the impedance functions to be generated from the model. This voltage drop can be written as a path integral:

$$v_\phi(t) = \phi_e(L,t) - \phi_s(0,t),$$ (equation 22a)

$$= \phi_e(L,t) - \phi_{dl}(0,t) - \phi_e(0,t),$$ (equation 22b)

$$= -\phi_{dl}(0,t) + \int_0^L \frac{\partial \phi_e(x,t)}{\partial x}dx.$$ (equation 22c)

By re-writing the electrolyte potential gradient from equation 8b as the following:

$$-\frac{\partial \phi_e(x,t)}{\partial x} = \frac{1}{\kappa(x)}i_e(x,t),$$ (equation 23a)

$$\frac{\Gamma(x)}{\kappa(x)}\frac{\partial \phi_{dl}(x,t)}{\partial x} + \frac{\Gamma(x)}{\sigma(x)\kappa(x)}i(t)$$

the voltage $v_\varphi(t)$ becomes:

$$-v_\phi(t) = \phi_{dl}(0,t) + \int_0^L \frac{\Gamma(x)}{\kappa(x)}\frac{\partial \phi_{dl}(x,t)}{\partial x} + \frac{\Gamma(x)i(t)}{\sigma(x)\kappa(x)}dx.$$ (equation 24)

Finally, using equation 10, the above can be written in terms of the overpotential and the open circuit potential:

$$-v_\phi(t) = \eta(0,t) + U\left(c_s^{surf}(0,t)\right) + \int_0^L \frac{\Gamma(x)}{\sigma(x)\kappa(x)}dxi(t) +$$ (equation 25)

$$\int_0^L \frac{\Gamma(x)}{\kappa(x)}\frac{\partial \eta(x,t)}{\partial x} + \frac{\Gamma(x)}{\kappa(x)}\frac{\partial U\left(c_s^{surf}(x,t)\right)}{\partial x}dx.$$

Solid-State Diffusion

Ion diffusion within the particles is included to capture the low frequency tail of the impedance plot. LFP particle dynamics are complicated by the fact that it is a multi-phase material [37] that experiences hysteresis (i.e. having a different response upon charging and discharging). This can for example lead to LFP particles developing a lithium-rich core entombed within a lithium deficient outer region. The standard approach to modelling this multi-phase system is to introduce a moving boundary at the interface between the two regions [37], but here it is assumed that the small signals of impedance ensure the boundary remains fixed and instead each region diffuses separately but regions are connected by a constant flux boundary condition.

Assuming spherical particles and defining the radius of the inner core region as $R_i = AR_s$ and furthermore $u_{s,r}^{de}(x,r,t) = rc_s^{de}(x,r,t)$ and $u_s^{ri}(x,r,t) = rc_s^{ri}(x,r,t)$ as the scaled concentrations in the lithium rich and deficient regions, then, within each particle region, the ions are assumed to diffuse according to the following relationships:

$$\frac{\partial u_s^{ri}(x,r,t)}{\partial t} = D_s^{ri} \frac{\partial^2 u_s^{ri}(x,r,t)}{\partial r^2}, \forall r \in (0, R_s^{ri}) \quad \text{(equation 26a)}$$

$$\frac{\partial u_s^{de}(x,r,t)}{\partial t} = D_s^{de} \frac{\partial^2 u_s^{de}(x,r,t)}{\partial r^2}, \forall r \in (R_s^{ri}, R_s) \quad \text{(equation 26b)}$$

and are subject to the boundary conditions $u_s^{ri}(x,0,t)=0$, $u_s^{ri}(x,R_s^{ri},t) = u_s^{de}(x,R_s^{ri},t)$, $$D_s^{ri} \frac{\partial}{\partial r}\left(\frac{u_s^{ri}(x,r,t)}{r}\right)\bigg|_{r=R_s^{ri}} = D_s^{de} \frac{\partial}{\partial r}\left(\frac{u_s^{de}(x,r,t)}{r}\right)\bigg|_{r=R_s^{ri}}, \quad \text{(equation 27a)}$$

$$\frac{1}{R_s}\frac{\partial u_s^{de}}{\partial r}\bigg|_{r=R_s} - \frac{u_s^{de}(x,R_s,t)}{R_s^2} = -\frac{j(\eta^*(x))}{D_s}. \quad \text{(equation 27b)}$$

Diffusion of the Bulk Electrolyte

Under the approximation of fast relaxation of the double layer, the movement of the bulk electrolyte concentration is described in a slightly more generalised form than the single particle model with electrolyte [22], since the equilibrium reactivity $j(\eta^*(x))$ is allowed to vary in space in the graded cathode according to the following relationship:

$$\varepsilon(x)\frac{\partial c_e(x,t)}{\partial t} = \frac{\partial}{\partial x}\left(D_e^{eff}(x)\frac{\partial c_e(x,t)}{\partial x}\right) + \frac{1-t_+}{F} j(\eta^*(x)) \quad \text{(equation 28a)}$$

and in the separator according to the following relationship:

$$\varepsilon(x)\frac{\partial c_e(x,t)}{\partial t} = D_e^{sep}(x)\frac{\partial^2 c_e(x,t)}{\partial x^2} \quad \text{(equation 28b)}$$

subject to the boundary conditions:

$$\frac{\partial c_e(x,t)}{\partial x}\bigg|_{x=0} = \frac{\partial c_e(x,t)}{\partial x}\bigg|_{x=L+L_s} = 0, \quad \text{(equation 29a)}$$

$$D_e^{eff}(L)\frac{\partial c_e(x,t)}{\partial x}\bigg|_{x=L}^{Left} = D_e^{sep}\frac{\partial c_e(x,t)}{\partial x}\bigg|_{x=L}^{Right} = 0. \quad \text{(equation 29b)}$$

in which the superscript Left denotes a derivative pointing to the left and the superscript Right denotes a derivative pointing to the right. The contribution to the voltage [22] is given by:

$$v_{ce}(t) = \frac{2RT(1-t_+)}{F}(\ln(c_e(L+L_s,t)) - \ln(c_e(0,t)), \quad \text{(equation 30a)}$$

$$\approx \frac{2RT(1-t_+)}{Fc_e^*}(c_e(L+L_s,t) - c_e(0,t)) \quad \text{(equation 30b)}$$

under the small signal assumption that the electrolyte concentration remains near equilibrium, i.e. $c_e \approx c_e^*$.

Contact Resistance

The electrochemical effects described above are typically sufficient to describe the impedance response of most battery chemistries. However, for LFP half-cells in particular, two additional effects need to be included [34]: i) a contact resistance at the current collector interface; and ii) ion movement through an SEI layer at the anode.

At frequencies of the order of $\omega \approx 10^4$ Hz, the contact resistance at the interface between the current collector and the cathode tends to dominate the impedance response [13, 34, 44]. Here, this effect may be described by a first-order relaxation:

$$\dot{\phi}_{con}(t) = -\frac{1}{\tau_{con}}\phi_{con}(t) + k_{con}i(t), \quad \text{(equation 31a)}$$

$$v_{contact}(t) = \phi_{con}(t). \quad \text{(equation 31b)}$$

SEI Layer at the Li-Foil Anode

Ion movement through the SEI (solid-electrolyte interface) layer at the lithium foil anode has also been identified as contributing to the impedance of LFP half-cells at frequencies $\omega \approx 10^3$ Hz [34]. This effect is modelled as $$\begin{bmatrix}\dot{\phi}_{SEI}(t) \\ \dot{\phi}_{Li}(t)\end{bmatrix} = \begin{bmatrix}-\frac{1}{\tau_{SEI}} & 0 \\ 0 & 0\end{bmatrix}\begin{bmatrix}\phi_{SEI}(t) \\ \phi_{Li}(t)\end{bmatrix} + \begin{bmatrix}k_{SEI} \\ k_{Li}\end{bmatrix}i(t), \quad \text{(equation 32a)}$$

$$v_{anode}(t) = \phi_{SEI}(t) + \phi_{Li}(t), \quad \text{(equation 32b)}$$

where $\phi_{SEI}$ captures the movement of ions through the anode SEI layer and $\phi_{Li}$ accounts for the build-up of lithium at the cathode moving from the foil, allowing the impedance tail to deviate away from the standard 45° slope of solid-state diffusion [1].

The anode SEI layer was identified in [51, 34] as being the central feature in the impedance at frequencies around $\omega = 10^3$ Hz, with the charge transfer resistance being insignificant. However, such a conclusion is not reflected in the results of FIGS. 4 and 6, which show that cells with graded cathodes but with equivalent Li-foil anodes have large deviations in the impedance magnitude within this frequency range. These deviations could not be explained if the dominant effect was the anode's SEI layer.

Constructing the Impedance Function

The model outlined above may be used to generate an impedance function for the Li-ion half-cells with graded LFP cathodes and lithium foil anodes. The impedance function was generated by spatially discretising the PDEs of equations 18, 19 and 26 using the Chebyshev spectral collocation method [45] and linearising the voltage equations before applying the Laplace transform to compute the gains from the current density to the voltage (13) in the frequency range $10^{-2} \leq \omega \leq 10^6$. The impedance generated by the model can be decomposed into contributions from the overpotential $G_\eta(s)$, which is the charge transfer resistance and is apparent when $\omega = 10^3$, the particles $G_{s}^{surf}(s)$, which is the dominant process at low frequencies, i.e. where $\omega < 1$ Hz, the bulk transport effect $G_{c_e}(s)$, the SEI anode $G_{an}(s)$, which also operates at $10^3$ Hz and the contact resistance $G_{con}(s)$, which is active at high frequencies, i.e. where $\omega>10^4$. The total impedance $G(s)$ is then the sum of each of these contributions, given as:

$$G(s)=G_\eta(s)+G_{s_s}{}^{surf}(s)+G_{c_e}(s)+G_{an}(s)+G_{con}(s). \quad \text{(equation 33)}$$

Results

The impedance responses of the model for the CAC@ and AC@ active material distributions of FIG. 1, as well as the equivalent uniform electrodes, are compared against data from [3] in FIGS. 4 and 6. The parameters from Table 2 were used for the model. This section discusses the physical interpretation of these impedances, in order to understand the impact of electrode grading on LFP cathodes in more detail. The review [34] on the physical interpretation of LFP impedance is applied.

Figure 4A:
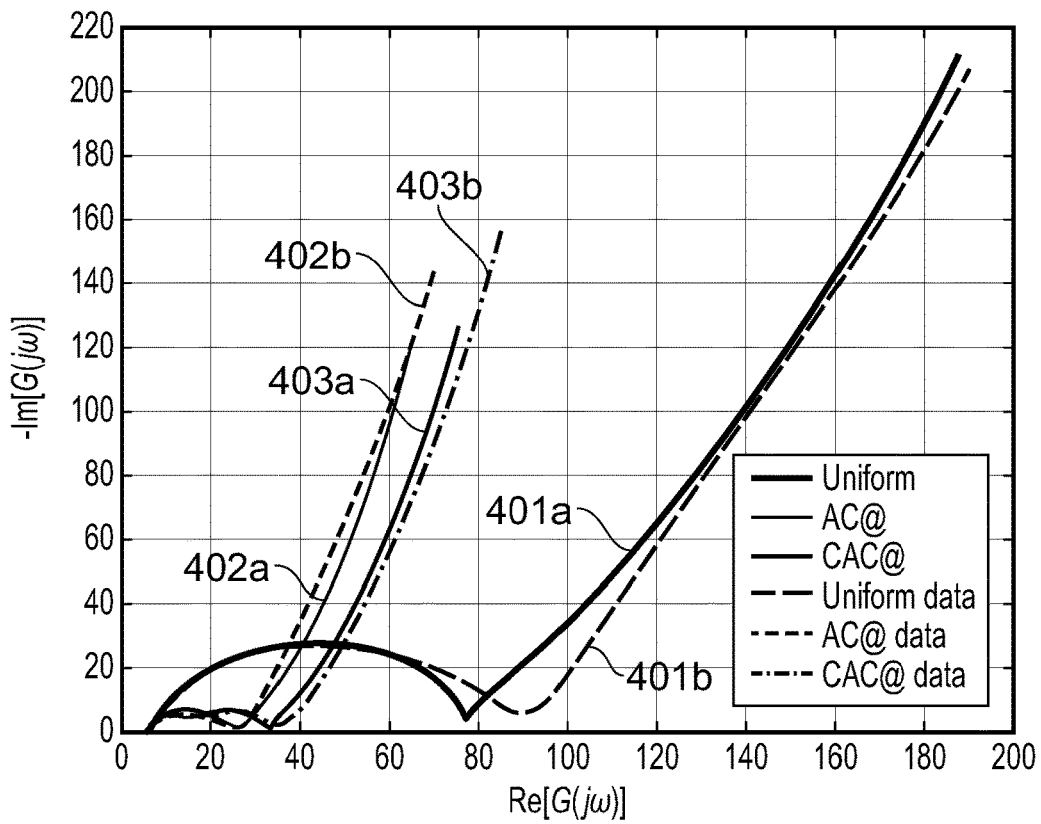
FIG. 4a is a Nyquist plot of the impedance response of modelled and experimental graded electrodes.

FIG. 4a illustrates the impedance responses of modelled impedances for the uniform electrode 401a, AC@ graded electrode 402a and CAC@ graded electrode 403a, and the corresponding experimental data 401b, 402b, 403b. FIG. 4a shows the same responses at high frequencies. A good fit can be seen between the modelled impedances and the corresponding experimental data, with the dependencies described above and shown in FIG. 3 enabling the model to generalise to electrodes with the CAC@, AC@ and uniform distributions of active material weight fractions from FIG. 1.

Figure 4B:
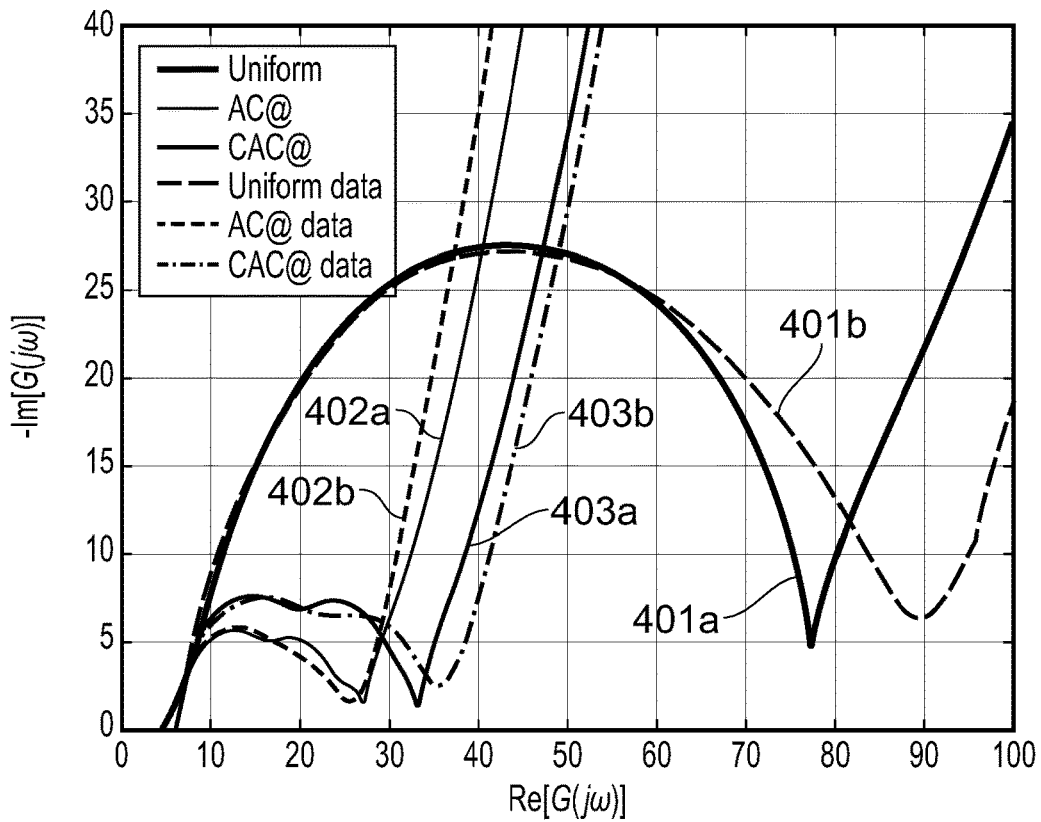
FIG. 4b is a Nyquist plot of the impedance response of modelled and experimental graded electrodes at high frequencies.

The reduced contact and charge transfer resistances of the graded electrodes are particularly apparent in FIGS. 4a and 4b and explain the graded cells' increased capacities at high C-rates [3]. These reduced resistances are primarily caused by the improved conductivity and reactivity described by equation 7 above, implying that having an increased carbon content at the current collector is an important factor in improving LFP cathode performance, as it increases the cathode's overall electronic conductivity, reduces the reactivity and promotes an improved contact with the current collector. Carbon coating of LFP particles should therefore be biased at the current collector as far as possible. Besides reducing resistances, the reduced charge transfer resistances of the graded LFP cathodes should also make them more thermally stable, since the reactivity constant is reduced, according to equation 7a, mitigating degradation and improving the fast charging response.

Figure 5:
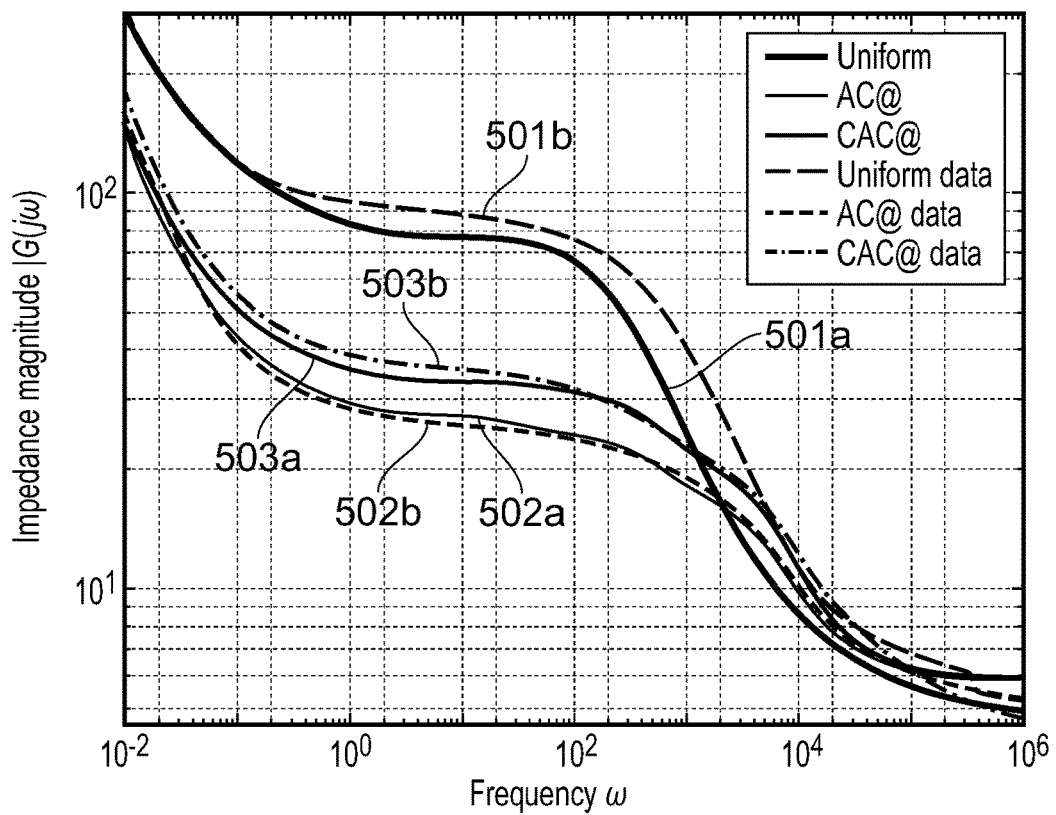
FIG. 5 is a Bode plot showing the magnitude of the impedance response $|G(j\omega)|$ for different designs of graded electrodes.

The Bode plot shown in FIG. 5 provides information on the system's poles locations (with the term "pole" being used here in the sense of control theory as in it is the reciprocal of a time constant). Again, a comparison is made between the modelled impedance for the uniform electrode 501a, AC@ electrode 502a and CAC@ electrode 503a and the corresponding experimentally measured impedance 501b, 502b, 503b. At low frequencies, slow diffusion in the solid dominates the response, at $\omega \approx 10^3$ Hz there is a pole which is typically attributed to an SEI layer build up at the Li-foil anode [51, 34] (although this is disputed here for LFP cells), with a further pole at around $@=10^4$ Hz normally associated with the contact resistance. The Bode plot in FIG. 5 shows that electrode grading primarily influences the magnitude of the impedance response, with the location of the poles remaining relatively unchanged from those of the uniform electrode. This suggests that the underlying factors influenced by grading include the conductivity of the overall electrode.

One of the main benefits of electrochemical battery modelling lies in its ability to disentangle the contributions of the various physical effects occurring within the battery. This is illustrated in FIGS. 6a, 6b and 6c, which are Bode plots of the magnitudes of the impedance components for each cell configuration, with FIG. 6a showing plots relating to the uniform electrode, FIG. 6b the AC@ electrode and FIG. 6c the CAC@ electrode. A key feature from this is that grading helps to reduce the contact resistance and the overall resistance. Any model-based design for LFP cathodes should therefore consider this effect in its analysis, as the model may then either underestimate the benefit of electrode grading seen in practice [3], or arrive at designs that would actually perform worse when manufactured, such as LFP half-cells with a concentrated active material region near the current collector.

The data of FIGS. 4 and 6 disagree with the physical explanation of the pole at $\omega \approx 10^3$ Hz as given in the review [34]. In that study, the pole was attributed to the movement of ions through an SEI layer at the Li-foil anode, building upon the results of [51]. If this applied to the half-cells considered here, then grading the LFP cathodes would have no impact upon the magnitude of this impedance at this frequency. However, the data in FIG. 6 shows that cathode grading does influence the impedance magnitude at this frequency, conflicting with the anode-centric interpretation of [34]. With this data, the contribution from the anode SEI was in fact small for LFP half-cells, and instead, the charge transfer region was significant.

The ratio of electronic conductivity at the current collector to ionic conductivity at the separator, $\sigma(0)/\kappa(L)$, is an important factor in determining the region of initial cathode discharge. This can be seen from a simplified analysis where a uniform distribution of $w(x)$ is assumed, and so, from the maximal principle, the boundary conditions of equation 20 determine the peak value of the overpotential. As the overpotential drives the interfacial reaction rate $j(\eta(x,t))$, then if $\sigma(0)$ is much less than $\kappa(L)$, as is typically the case for LFP cells, the peak reactivity will be at the current collector. But, if $\sigma(0)$ is much greater than $\kappa(L)$, as is the case for most chemistries like NMC (Lithium Nickel Manganese Cobalt Oxide) [50], it will be at the separator. Particles in this region of peak initial reactivity will discharge first, from equation 27b, and so, for large enough currents that cause a local state-of-charge, these particles will be cycled the most. By continuously subjecting the particles in this highly reactive region to intercalation upon cycling, these particles will experience higher stresses which will lead to an increased chance of fracture and, eventually, to a loss of active material.

Moving particles away from this highly active region means that the percentage of stressed particles is reduced, thereby increasing the cycle life. In a graded LFP cells, since $\sigma(0)$ is much less than $\kappa(L)$, the particles should be moved away from the highly reactive current collector region as much as possible, explaining the improvements seen in [3] of the AC@ and CAC@ designs, as well as the poor performance of the CA@ design [3] but, for chemistries like NMC it is expected that this should be reversed with the separator region being rich in carbon.

Several modelling papers have previously proposed theoretical designs for layered electrodes, primarily by taking the porosity as a design variable and then optimising energy/power densities along a Ragone plot. Most of these papers proposed designs with a highly porous region near the separator (corresponding to a region of low active material weight fraction region when built using the electrode grading approach considered here) with the impact of the current collector region in these studies being rather benign. As far as the inventors are aware, only proposes a highly porous region at the current collector, although also allowed the particle radii to change simultaneously. However, from the data of the manufactured LFP cells in [3], LFP cathode designs with a highly porous separator region would deteriorate performance in practice when compared against equivalent uniform electrodes. These experimental results show that an important factor in to improved performance of graded LFP electrodes is a high carbon content at the current collector. This result emphasises the need to verify the conclusions of model-based predictions in experiment, to guarantee that the optimal designs translate into benefits in practice.

The above discrepancy between the experimentally realised designs [3] and previous modelling results for LFP half-cells indicates that additional affects may have to be included into these models/design problems. Care must also be given to whether the proposed designs can be realised in practice. Experimental results indicate that some of the benefits of graded electrodes may lie in reduced degradation rate and increased thermal stability, effects that are, traditionally, often not included in electrochemical models, e.g [4].

Conclusions: Electrochemical Model

The electrochemical model described herein can be used to understand the impedance response of graded electrodes in Lithium ion cells, in particular for $LiFePO_4$ half-cells. Graded electrodes allow for control of through thickness variations in microstructure, with the relative fractions of active material, carbon content and binder allowed to vary, and have demonstrated around 31% reductions in degradation rates and around 50% improvements in capacity compared to uniform electrodes. This effect can be understood by validating an electrochemical model against impedance data for various graded and uniform half-cells, with an important contribution of the model accuracy stemming from parameterisation of both the free electronic conductivity and the reactivity constant in terms of the weight fraction of active material at the current collector.

The validated model may be used to explain the observed benefits of graded electrodes. Firstly, it has been shown that increasing the carbon content at the current collector/cathode interface improves the connection there, leading to significantly reduced contact and charge transfer resistances. Secondly, since ionic conductivity dominates the electronic conductivity in $LiFePO_4$ electrodes, the initial area of discharge of the cathode will also be at the current collector/cathode interface, and so, for high C-rates, particles in this region will experience the highest amount of usage and stress upon cycling and will be more likely to fracture. To limit the percentage of stressed particles, particles should be moved away from this region. These two results imply that the carbon content of $LiFePO_4$ cathodes should be increased at the current collector region as much as possible. However, the reverse should hold for cells where the electronic conductivity dominates the ionic one. With the benefits of graded electrodes thereby explained, an experimentally validated design approach for graded electrodes can now be developed, opening the way to manufacture better batteries.

Convex Design of Graded Electrodes

A convex optimisation program to design graded electrodes with controlled variations in the through-thickness relative fraction of active-material, carbon and binder is now described. The designs were generated from the solution of a semi-definite program that could be efficiently solved within seconds to give the optimal local electrode micro-structure minimising the overpotentials. To verify the benefits of the computed designs, Li-ion half-cells with graded $LiFePO_4$ cathodes were then built using a spray forming process and found to perform well in experiment, showing a 44.7% increase in capacity and a 50.2% reduction in degradation rate when cycled at 1C compared against slurry-cast electrodes. These improvements illustrate how controlling the electrode micro-structure can significantly influence the battery response, especially at high C-rates. The results of this work highlight how a combination of electrochemical modelling, optimisation and electrode manufacturing techniques can deliver improvements to existing battery technologies.

INTRODUCTION

Lithium ion battery electrodes do not charge uniformly through their thickness, especially when the electrodes are thick, suffer from low conductivities or are subject to large, aggressive currents. In fact, several recent studies, including [67, 31, 10, 59], have identified electrode heterogeneities as being key features to battery performance, with heterogeneities causing increased degradation [56], swelling [77] and local state-of-charge hotspots [65] amongst other issues. Such heterogeneities are symptoms of the induced potential gradients needed to drive charge transfer and result in inefficiencies and safety concerns. As ever greater demands are placed on batteries to satisfy the storage requirements of emerging technologies like electric vehicles, these heterogeneities need to be reduced as much as possible.

A recently developed approach to manipulate the local electrochemical response involves manufacturing electrodes with through-thickness variations at the micro-scale ($\approx 10^{-6}$ m). Somewhat counter-intuitively, these electrodes exploit local micro-structural heterogeneities to smoothen the electrode's response. A convex program described herein has been developed to find optimal spatial distributions of the active material through the electrode thickness for such graded electrodes. It is only recently that processes have been developed to manufacture graded electrodes with through thickness structures, representing an alternative manufacturing approach to slurry-casting where the electrode is a random mix of constituents. One such process involves dividing the electrode up into slurry-cast layers with differing microstructures, as demonstrated in [21] where an $\approx 8\%$ reduction in capacity loss was observed in layered $LiNi_{0.5}Mn_{1.5}O_4$ cells. Electrode layering was also shown to improve the high C-rate capacities of Li-ion electrodes in [76] and the ion mobility of supercapacitors in [30, 7].

As well as slurry-cast layered electrodes, an additive manufacturing process to construct graded electrodes using a spray-forming technique has also been developed [16, 18, 53, 68, 3]. At first, this method also deconstructed the electrode into distinct layers [16, 18, 53, 68, 7] but has now been extended to enable electrodes with continuously varying through-thickness fractions of active material to be sprayed. Through this process, the continuously varying designs first envisioned in simulation studies such as can now be realised without the inter-layer resistances predicted in [73]. Demonstrating this, [3] sprayed Li-ion half-cells with LFP cathodes that showed a 50% increased capacity and a 31% degradation rate reduction compared against their slurry-cast counterparts when cycled at 2C, highlighting the potential to engineer better batteries for advanced applications. Further demonstration of the applicability of the technique to graded anodes as well as cathodes is shown in [78], in which a lithium titanate based cathode is combined with lithium iron phosphate based cathode.

The design flexibility of graded electrodes has made them attractive topics of study for battery modelers, where the power and flexibility of electrochemical models can be exploited to propose novel designs. These model-based studies have focused on layered electrodes, and typically involve extensive simulations or a non-convex optimisation over the parameters of the benchmark Doyle-Fuller-Newman (DFN) Li-ion battery model [5, 33, 14, 4, 32, 21, 61, 19]. Several performance benefits have been claimed in these studies, for instance [14] predicted that the discharge capacity could be improved by 61% with layered electrodes while [61] estimated that a 14% reduction in the heat generation of the cathode could be achieved. Critically, little consideration was given in these modelling papers on realising the optimised designs in experiment, which is a main focus of the results presented here.

Disclosed herein is a convex approach to optimising graded electrode designs, which may be manufactured for example using the spray forming process of [3] or other techniques that allow for continuous variation in constituents of the electrode. A goal of this optimisation is to find the active material distribution that minimises the overpotential across the electrode, subject to certain constraints. In doing so, bounds are provided for the overpotential given any current of finite energy. A simple model of the overpotential dynamics is developed for the optimisation and a convex relaxation of the design problem is proposed which allows designs to be constructed in seconds by solving a convex semi-definite program (SDP). This speed contrasts with pre-existing design approaches, such as the neural networks of [74] and the genetic algorithm adopted in [21] but comes at the cost of potential sub-optimality in the solutions due to the convex relaxations.

The results described herein include a cross-fertilisation of techniques from battery modelling, optimisation and manufacturing. The proposed designs have been realised in experiment and show the expected performance benefits. Li-ion half-cells with an example proposed cathode design having a characteristic trapezoidal shape distribution of active material (in this case $LiFePO_4$) showed a 44.7% reduction in degradation rate and a 50.2% increase in capacity over slurry-cast cathodes when cycled at 1C. The results highlight the potential for the use of electrochemical models to accelerate battery design by controlling the local electrode micro-structure and combining this analysis with advanced manufacturing techniques such as spray forming.

Notation and Definitions

The variables of the battery model are defined in Table 4 and its parameters are given in Table 5. The parameters for the optimisation are given in Table 6.

Finite dimensional signals are defined in bold. Real vectors and matrices of dimension n are respectively $\mathbb{R}_n$ and $\mathbb{R}^{n \times n}$. Non-negative real vectors of dimension n are $\mathbb{R}_+^n$ and the non-negative real line is $\mathbb{R}_+$. Symmetric positive definite matrices are denoted $\mathbb{S}_{<0}^n$. Positive definiteness of a matrix $M^{n \times n}$ is denoted $M>0$ and negative definiteness is $M<0$. Non-negative diagonal matrices of dimension n are $\mathbb{D}_+^n$. The identity matrix of dimension n is $I_n$.

A spatio-temporal signal (defined in the spatial [0, L] and temporal [0, T] domains) is said to exist within a Hilbert space $\mathcal{L}_{2([0,L]\times[0,T])}$ if the norm $$\|\eta(x,t)\|_{\mathcal{L}_2([0,L]\times[0,T])} = \sqrt{\int_0^T \int_0^L \eta(x,t)^2 dx dt} \quad \text{(equation 34)}$$

is finite. The space $\mathcal{L}_{2([0,L])}$ is defined as the signals evaluated at time t for which $$\|\eta(x,t)\|_{\mathcal{L}_2([0,L])} = \sqrt{\int_0^L \eta(x,t)^2 dx} \quad \text{(equation 35)}$$

is finite. Similarly, finite-dimensional signals (here, representing discretisations of the electrochemical variables) that evolve only in time, they exist within the Hilbert space $\mathcal{L}_2$ if $$\|\eta(t)\|_2 = \sqrt{\int_0^T \eta(t)^T \eta(t) dt} \quad \text{(equation 36)}$$

is finite. The time derivative of a signal $\eta(t)$ is denoted $\dot{\eta}(t)$.

TABLE 4

Variables of the electrochemical model
Variables of the Model

| Symbol | Description |
|---|---|
| $x \in [0, L]$ | Distance across the electrode. (m). |
| $r \in [0, R_s]$ | Distance through each particle. (m). |
| $j(\eta(x, t))$ | Interfacial reaction rate. |
| $\eta(x, t)$ | Overpotential. (V). |
| $\phi_s(x, t)$ | Solid-phase potential. (V). |
| $\phi_e(x, t)$ | Liquid phase potential. (V). |
| $\phi_{dt}(x, t)$ | Electrode potential $\phi_{dt}(x,t) = \phi_s(x,t) - \phi_e(x,t)$. (V). |
| $i_0$ | Ion exchange current density. |
| $w(x)$ | Weight fraction of active material. $w(x) \in [0, 1)$. |
| $c_s(x, r, t)$ | Particle concentration. (mol m$^{-3}$). |
| $c_s^{surf}(x, t)$ | Concentration on particle surface. (mol m$^{-3}$). |
| $U(c_s^{surf}(x, t))$ | Open circuit potential. (V). |
| $c_e(x, t)$ | Electrolyte concentration. (mol m$^{-3}$). |
| $I(t)$ | Applied current. (A). |
| $i(t)$ | Applied current density. $i(t) = I(t)/S_A$. (A m$^{-2}$). |
| $\Gamma(x)$ | $\sigma^{eff}(x) \kappa^{eff}(x)/(\sigma^{eff}(x) + \kappa^{eff}(x))$ (S m$^{-1}$). |
| $\Sigma(x)$ | Normalised ionic conductivity $\frac{\Gamma(x)}{\sigma(x)}$. |
| $\epsilon(x)$ | Local porosity. |
| $\upsilon_{vol}(x)$ | Volume fraction of active material. |

TABLE 5

Electrochemical model parameters
Electrochemical Parameters

| | Definition | Value | Units |
|---|---|---|---|
| $\alpha_s$ | Reactant surface area. | Eqn. (13) | m$^2$ |
| L | Cathode length. | $120 \times 10^{-6}$ | m |
| $C^{rsp}$ | Specific capacitance. | $50 \times 10^3$ | F m$^{-3}$ |
| $D_s$ | Diffusion coef. | $7.3 \times 10^{-18}$ | m$^2$ s$^{-1}$ |
| R | Universal gas constant. | 8.3140 | J K$^{-1}$ mol$^{-1}$ |
| F | Faraday's constant. | 96487 | C mol$^{-1}$ |
| T | Temperature. | 297 | K |
| S | Electrode surface area. | $1.131 \times 10^{-4}$ | m$^2$ |
| $R_s$ | Particle radii. | $300 \times 10^{-9}$ | m |
| $c_e$ | Electrolyte conc. | $10^3$ | mol m$^{-3}$ |
| $c_s^{max}$ | Max. particle conc. | 22785 | mol m$^{-3}$ |
| $c_s^{surf,*}$ | Local state-of-charge. | $0.8 \ c_s^{max}$ | mol m$^{-3}$ |
| $U(\cdot)$ | From [37]. | | V |
| $\alpha_\epsilon$ | Porosity gradient. | -0.586 | |
| $\beta_\epsilon$ | Porosity constant. | 1 | |
| $\theta_{k_0}$ | Reactivity scaling term. | $1.4095 \times 10^{-10}$ | |
| $\rho_{k_0}$ | Reactivity parameter. | $-5.2664 \times 10^{-11}$ | |
| $\theta_{\sigma_\infty}$ | Conductivity scaling term. | -0.1820 | |
| $\rho_{\sigma_\infty}$ | Conductivity parameter. | 0.1532 | |

TABLE 6

Electrochemical model parameters
Parameters for the optimisation and simulation

| | Definition | Value | Units |
|---|---|---|---|
| n | Discretisation of the electrode. | 40 | |
| n | Discretisation of the particles. | 10 | |
| δ | Slope constraint. | 2 L | |
| $\underline{w}$ | Bound on w(x). | 0 | |
| $\overline{w}$ | Bound on w(x). | 0.95 | |
| I | Charging current. | 3.12 | mA |

Electrode Design Problem

This section explains the rationale behind the proposed structured electrode designs. Electrodes inspired by these designs were manufactured using the spray forming process of [3]. The proposed model was parameterised against impedance data as detailed in the preceding sections of the present disclosure.

Design Rationale: Minimising the Overpotentials

A Li-ion battery cathode is a compound mixture of: i) active material (such as LiFePO$_4$ (denoted LFP here), LiNiMnCoO$_2$ or LiNiCoAlO$_2$, typically consisting of around 80 wt. %); ii) electrically conductive material (typically carbon black at around 10 wt. %) and a binder (typically polyvinylidene fluoride [PVDF] at around 10 wt. %). Using a process such as that disclosed in [3] allows the relative fraction of each of these three components through the electrode thickness. Doing so influences the electrochemical model parameters (including the conductivities, the ion exchange current and the specific surface area) and, in turn, the dynamical response of the electrodes. Due to its ability to govern lithium intercalation into the particles and its dependency upon the electrode microstructure, the overpotential has been identified as a key variable for the electrode design problem to optimise and is used as a performance metric here. The following design problem is motivated from this observation.

Design Problem 1: For a given amount of lithium, find the optimal distribution of active material across the electrode that minimises the overpotential.

Isolating the role of the overpotential in this manner greatly simplifies the design analysis and enables the convex SDPs of Algorithm 1 shown below. The overpotential is used as a simple metric for the battery's capabilities. By optimising the overpotential, instead of, for example, the Ragone plot, the analysis targets the system behaviour directly influenced by grading, which then leads to improvements in energy and power densities.

The Impact of the Overpotential

Central to the definition of optimality in Design Problem 1 is the interfacial reaction rate $j(\eta(x,t))$ that governs lithium intercalation into the particles (seen from the boundary conditions of the particle dynamics in the DFN modelling framework [6]). This rate is typically defined by Butler-Volmer kinetics $$j(\eta(x,t)) = \frac{i_0}{F}\sinh\left(\frac{F}{RT}\eta(x,t)\right) \quad \text{(equation 37)}$$

which is a function of the ion exchange current density $i_0$:

$$i_0 = k_{i_0} F (c_s^{max} - c_s^{surf})^{\frac{1}{2}} (c_s^{surf})^{\frac{1}{2}} (c_e)^{\frac{1}{2}}. \quad \text{(equation 38)}$$

and the overpotential $\eta(x,t)$:

$$\eta(x,t) = \phi_s(x,t) - \phi_e(x,t) - U(u_s^{surf}(x,t)). \quad \text{(equation 39)}$$

Due to the exponential growth of the sinh(•) function, the reaction rate $j(\eta(x,t))$ is strongly dependent upon the overpotential η, especially when η is large. If a small signal analysis is assumed, as done here for the design, then the concentrations in the ion exchange current are effectively constant $c_s^{surf} \approx c_s^{surf,*}$, $c_e \approx c^*_e$ and so $$i_0 \approx i_0^* = k_{i_0} F(c_s^{max} - c_s^{surf,*})^{\frac{1}{2}} (c_s^{surf,*})^{\frac{1}{2}} (c_e^*)^{\frac{1}{2}}, \quad \text{(equation 40)}$$

making j(•) purely a function of η.

Dependence of the Model Parameters on the Active Material

Prior to introducing the considered model for the overpotential dynamics in graded electrodes, the electrochemical parameters of interest influenced by electrode grading, namely the ionic x and electronic σ conductivities as well as the reacting surface area a, and reactivity constant $k_{i_0}$, are related to the weight fraction of active material $w(x) \in [0, 1]$, the design variable of the problem. These dependencies have been identified from a parameterisation of impedance data, as described above.

The design of graded LFP cathodes is considered herein. LFP is a particularly attractive material for graded electrodes for three main reasons: i) because it has a mature battery chemistry that is currently mass produced and so significant improvements can be made at the manufacturing level; ii) it suffers from low electronic conductivities which can be alleviated by controlling the carbon content; and iii) experimental results have already shown the benefits of grading LFP cathodes [3], with these designs being optimised here. The same principles would also apply to other Li-ion chemistries including lithium nickel manganese cobalt oxide, lithium nickel cobalt aluminium oxide, lithium manganese oxide and lithium cobalt oxide. The same principle of minimising overpotential can also be applied to the graphite-based anode too, where the electrochemically active material is graphite, formed together with a binder and carbon black as an electrically conductive material. These materials follow the same underlying electrochemical equations but with different parameter values, resulting in the modelling and optimisation also applying.

The same general principle of applying a model for overpotential dynamics may also be applied to batteries with other chemistries such as sodium-ion batteries. The specific details of the model may differ but the same general idea may be applicable.

Following the description above of the relationship between porosity and active weight fraction, a simple affine relationship is assumed between the porosity & and the active material distribution w(x):

$$\varepsilon(x) = \alpha_\varepsilon \omega(x) + \beta_\varepsilon. \quad \text{(equation 41)}$$

As shown in FIG. 12, local increases in local active material weight fraction w(x) are countered by corresponding decreases in carbon/binder, i.e. $w_{cb}(x) = 1 - w(x)$, and vice versa when w(x) decreases, so the design variable w(x) may be considered to be interchangeable with carbon content throughout. Most existing studies on the model-based design of graded electrodes, e.g. [33], optimised the porosity directly instead of w(x), but, this does not account for the physical realisability of the designs. In particular, increasing the porosity is achieved here by reducing the amount of active material, which would also reduce the energy density, a feature that would be lost by simply optimising $\varepsilon(x)$ directly.

Using equation 41 above, the active material weight fraction w(x) can be related to the conductivities via Bruggeman relations. For instance, the ionic conductivity is given by:

$$\kappa^{eff}(x) = \kappa_\infty \varepsilon(x)^b, \qquad \text{(equation 42)}$$

with Bruggeman coefficient b and $\kappa_\infty$ being the conductivity of the free solution. Typically, this coefficient is taken as b=3/2 but here, to aid the optimisation, it is set to b=2. Several recent studies have critically examined the relationship between porosity and tortuosity of the Bruggeman relationship. For instance, found that a scaled version of the Bruggeman coefficient, with b=1.52 was quite accurate for the cathode. In contrast, using simulated data with specific pore structures, [62] suggested b≈1.9 but also warned about the validity of the Bruggeman relationship, especially with regards to quantifying the tortuosity. Likewise, the results of [57] indicated that, for increased active material fractions, then b≥1.5. However, with the considered porosities in the designs not deviating that substantially, then the choice b=2 is not expected to significantly influence the results.

Extrapolating the data of [52], the electronic conductivity is assumed to satisfy the linear relation:

$$\sigma(x) = \sigma_\infty \varepsilon(x). \qquad \text{(equation 43)}$$

As described above in relation to the electrochemical model, a dependency between the free electronic conductivity $\sigma_\infty$ and the carbon content at the current collector w(0) was identified for LFP cathodes, with the following fit proposed:

$$\sigma_\infty = \theta_{\sigma_\infty}(w(0)-1)(w(0)-p_{\sigma_\infty}). \qquad \text{(equation 44)}$$

A similar dependency was also found with the reactivity constant $k_{i0}$:

$$k_{i_0} = \theta_{k_{i_0}} w(0)\left(w(0) - p_{k_{i_0}}\right). \qquad \text{(equation 45)}$$

As described herein, both dependencies were found to be important to the model's accuracy, and strongly influenced the results presented here, as they emphasise the importance of good contact at the current collector through increased carbon content there.

Varying the local particle density also affects the specific surface area available for reactions. With spherical particles assumed, this area $a_s(x)$ is given by:

$$a_s(x) = \frac{3v_{vol}(x)}{R_s} \approx \frac{3(1-\varepsilon(x))}{R_s} = -\frac{3\alpha_s w(x)}{R_s}. \qquad \text{(equation 46)}$$

In order to ensure that the proposed designs relate to physically realisable active material distributions that can be manufactured, for example by spraying [3], the following constraint set was defined.

Definition 1 (Physically realisable weight fraction of active material) For some $\mu \in [0, 1]$, define the set W of active material distributions satisfying w∈W if:

$$\frac{1}{L}\int_0^L w(x)dx \geq \mu, \qquad \text{(equation 47a)}$$

$$0 \leq \underline{w} \leq w(x) \leq \overline{w} \leq 1, \forall x \in [0, L], \qquad \text{(equation 47b)}$$

$$\left|\frac{dw(x)}{dx}\right| \leq \delta. \qquad \text{(equation 47c)}$$

The first condition of equation 47a ensures that the average weight fraction of active material through the thickness of the electrode is no less than μ. In practice this is required to be between 0 and 1 for the result to be realistic. Typically for an LFP cathode the average value is around 0.8. For other materials such as NMC cathodes the value may be as high as 0.97. In a general aspect, the average weight fraction of active material may be less than 1 and greater than 0, and may generally be greater than 0.5.

Enforcing this condition ensures enough active material, e.g. lithium (and hence energy density) is retained in the computed designs. The box constraint of equation 47b imposes the amount of active material at any given point in the electrode is neither too low nor too high. In general this will also need to be between 0 and 1 for the resulting electrode to be realistic but a narrower range may be chosen such as defining an upper limit of about 0.95 (e.g. for LFP electrodes) or around 0.99 (e.g. for NMC electrodes). If w is too high, then the electrode may suffer from structural issues and connectivity of the solid matrix may be lost. The constraint of equation 47c ensures that the electrode composition does not vary too rapidly such that it cannot be manufactured, for example by spraying. In practice this variation can be very high but it may be desirable to set an upper limit to avoid step changes in the distribution, which may lead to resistance.

Model: Overpotential Dynamics

A model for graded electrode overpotential dynamics, which is then optimised in the following section, is described here. This model evolves by the following relationship:

$$C^{sp}\frac{\partial \eta(x,t)}{\partial t} = \frac{\partial}{\partial x}\left(\Gamma(x)\frac{\partial \eta(x,t)}{\partial x}\right) - j(\eta(x,t)) + \frac{d\Sigma(x)}{dx}i(t) \qquad \text{(equation 48)}$$

where $\Gamma(x) = \sigma(x)\kappa(x)/(\sigma(x)+\kappa(x))$ and $$\Sigma(x) = \frac{\Gamma(x)}{\sigma(x)}.$$

The vector field of equation 48 assumes the active material distributions w(x) are differentiable (if not, then a layer-based modelling approach can be used instead, as done in [70] for Li-ion batteries and [7] for supercapacitors). Even though the time-constant of equation 48 is fast (typically ≈$10^{-3}$ s), the dynamics are included here to enable the tools of dynamic systems theory to be applied to the design. LFP cathodes are noted for their low ratio of electronic to ionic conductivity ratio, i.e. σ<<κ[72], which, upon linearisation around η=0, simplifies equation 48 to the following:

$$C^{sp}\frac{\partial \eta(x,t)}{\partial t} = \qquad \text{(equation 49)}$$

$$\sigma(x)\frac{\partial^2 \eta(x,t)}{\partial x^2} + \frac{d\sigma(x)}{dx}\frac{\partial \eta(x,t)}{\partial x} - \frac{i_0^* F a_s(x)}{RT}\eta(x,t).$$

This defines the system to be optimised in the above-mentioned design problem.

To evaluate performance, the graded electrodes were compared against equivalent uniform electrodes manufactured by slurry casting, whose overpotential dynamics [29] when $\sigma \ll \kappa$ follow the following relationship:

$$C^{sp}\frac{\partial \eta(x,t)}{\partial t} = \sigma \frac{\partial^2 \eta(x,t)}{\partial^2 x} - \frac{i_0^* F a_s}{RT}\eta(x,t). \quad \text{(equation 50)}$$

The boundary conditions for $\eta$ are: at the current collector, all the current is carried by the solid phase and so $i_s=i$, $i_e=0$, and, at the separator, all the current is carried by ions in the electrolyte, implying $i_e=i$, $i_s=0$. This implies $$\left.\frac{\partial \eta(x,t)}{\partial x}\right|_{x=0} = -\frac{1}{\sigma(0)}i(t) \quad \text{(equation 51a)}$$

at the current collector, and $$\left.\frac{\partial \eta(x,t)}{\partial x}\right|_{x=L} = \frac{1}{\kappa(L)}i(t) \quad \text{(equation 51b)}$$

at the separator. The importance of the conductivities at each boundary can be seen from equations 51a and 52b, as they determine the current fluxes entering the system.

Formulation of the Optimal Design Problem

With the model for the overpotential dynamics set by equation 49, the connection between the design variable $w(x)$ and the model parameters established and the physically realisable constraint set defined (Definition 1), robust solutions to Design Problem 1, being optimal in a min-max sense for all $i \in \mathcal{L}_2$, can then be computed.

The proofs of Propositions 1-4 below follow from standard applications of dissipativity theory [55, 63, 60] and so are omitted here.

Proposition 1: Find $w(x) \in W$ that minimises $\gamma > 0$ such that $\|\eta\|_{\mathcal{L}_{2((0,L) \times (0,T)}} \leq \gamma \|i\|_2$ for all $i \in \mathcal{L}_2$ with $\eta$ subject to the dynamics of equation 49 and boundary conditions of equation 51.

One of the main benefits of robust optimisation is that the computed bounds hold for all charging currents of finite energy, not just constant current discharges. This allows the results to be generalised to applications like the highly dynamic currents seen in the drive cycles of electric vehicles, applications where the benefits of graded electrodes will be most apparent.

For a given linear system, Proposition 1 may be completely solved using dissipativity theory [60], in which a storage function $S(\eta(x,t))$ (akin to the system's internal energy) is found that bounds the input-output gain of the system.

Definition 2 (Storage Function) A storage function $S(\eta(x,t)): \mathcal{L}_{2(0,L)} \to \mathbb{R}_+$ maps the state, $\eta(x,t) \in \mathcal{L}_{2(0,L)}$ to the positive real line whilst satisfying $S(0)=0$ and $\dot{S}(\eta(x,t)) \leq s(i,y)$ for some supply rate $s(i,\eta)$.

The particular choice $s(i,\eta)=\gamma^2 i(t)^2 - \int_0^L \eta(x,t)^2 dx$ ensures that, if a suitable storage function can be found, then the $\mathcal{L}_2$ gain from the current to the overpotential can be bounded by $\gamma$ [55, 63]. This can be more formally stated as the following proposition:

Proposition 2 If there exists a storage function $S(\eta(x,t)): \mathcal{L}_{2(0,L)} \to \mathbb{R}_+$ that solves $$\min_{w \in W} \gamma^2 \quad \text{(equation 52a)}$$

$$\text{s.t. } \dot{S}(\eta(x,t)) \leq \int_0^L \eta(x,t)^2 dx - \gamma i(t)^2, \quad \text{(equation 52b)}$$

then $\|\eta\|_{\mathcal{L}_{2(0,L) \times (0,T)}} \leq \gamma \|i\|_2$ for all $i \in \mathcal{L}_2$.

Unfortunately, since the decision variable $w \in W$ of this problem is infinite dimensional, finding a solution is challenging. This hurdle motivates a discretised formulation of the problem.

Discretisation of the Model and Constraint Set

In order to discretise Proposition 2, the overpotential dynamics of equation 49 are first discretised in space using the spectral collocation method [45]. Due to the spectral accuracy of this discretisation method for smooth solutions, low order reductions of equation 49 can be used, with this method previously being used to discretise Li-ion battery models dynamics in [54, 8, 58].

Several discrete objects are now defined. $n+1$ is the number of discretisation elements of the spatial domain (so that there are then $n+2$ grid points and the system solves for the n internal variables of the model). The spatially discretised overpotential signal is $\eta \in \mathbb{R}^n$ and the discretised spatial domain is $x \in \mathbb{R}_+^{n+2}$ with $x_i \in [0, L]$ sitting on Chebyshev points. D and $D_\eta$ are differentiation matrices [45] with $D_\eta$ accounting for the boundary conditions of $\eta$. The diagonal matrix $$W = \begin{bmatrix} w(x_2) & & & \\ & w(x_3) & & \\ & & \ddots & \\ & & & w(x_{n+1}) \end{bmatrix} \in \mathbb{D}_+^n \quad \text{(equation 53)}$$

captures the spatially varying weight fraction evaluated on the discretised space. The boundary values are $W_0=w(0)$ and $W_L=w(L)$ which are fixed in the optimisation, due to them entering nonlinearly in the boundary conditions stated in equations 51a and 51b, the state-transition operator in which may be discretised as $$A(W) = \sigma_\infty(\alpha_\varepsilon W + \beta_\varepsilon)^2 D_\eta^2 + \sigma_\infty \alpha_\varepsilon D W D_\eta - \frac{3i_0^* F \alpha_\varepsilon}{R_s RT}W, \quad \text{(equation 54)}$$

and $B(W)$ is a vector that captures the current injection from the boundary conditions from equations 51a and 51b. With these objects defined, the finite dimensional state-space form for the dynamics of equation 49 can be written as $$\dot{\eta} = A(W)\eta + B(W)i(t). \quad \text{(equation 55)}$$

As well as discretised dynamics, the constraint set W also needs to be discretised.

Definition 3 (Discretised Physically Realisable Constraint Set)

The discrete form of the set of physically realisable active material distributions $W \subseteq \mathbb{D}_+^n$ is defined as $\mathbb{W}$ where $W \in \mathbb{W}$ if $$\text{trace}(W) \geq n\mu, \quad \text{(equation 56a)}$$

$$0 \leq \underline{w}I_n \leq W \leq \overline{w}I_n \leq I_n, \quad \text{(equation 56b)}$$

$$|DW| \leq \delta. \quad \text{(equation 56c)}$$

A discrete form of Proposition 2 can then be stated.

Proposition 3: If there exists $P \in \mathbb{S}_{>0}^n$ and $W \in \mathbb{W}$ that solves $$\min_{W \in \mathbb{W}} \gamma^2 \quad \text{(equation 57a)}$$

$$\text{s.t.} \begin{bmatrix} PA(W) + A^T(W)P + I_n & PB(W) \\ (PB(W))^T & -\gamma^2 \end{bmatrix} \leq 0, \quad \text{(equation 57b)}$$

then $\|\eta\|_2 \geq \gamma \|i\|_2$ for all $i \in \mathcal{L}_2$.

Proposition 3 differs from the standard dissipativity analysis of dynamical systems in one important aspect, in that it involves a non-convex nonlinear matrix inequality constraint (NMI) (equation 57b) as the solver needs to simultaneously search over both the system matrices (W) and the positive definite matrices (P) defining the storage function $S(\eta) = \eta^T P \eta$. Standard techniques from control theory to deal with NMIs, such as defining the variable $\tilde{P} = PA(W)$ can also not be applied here, since W is constrained by $\mathbb{W}$. Several convex relaxations are now applied to Proposition 3.

Convex Relaxations

The first convex relaxation approximates the quadratic W term in the state transition matrix A(W) from equation 51 with $W_{sq} \in \mathbb{D}_+^n \approx W^2$ so that $A(W) \approx \overline{A}(W, W_{sq})$ and $$\overline{A}(W, W_{sq}) = \quad \text{(equation 58)}$$

$$\sigma_\infty (\alpha_\epsilon^2 W_{sq} + 2\alpha_\epsilon \beta_\epsilon W + \beta_\epsilon^2 I_n) D_\eta^2 + \sigma_\infty \alpha_\epsilon W D_\eta - \frac{3 i_\theta^* F \alpha_\epsilon}{R_\epsilon RT} W.$$

with the discretised dynamics approximated by.

$$\dot{\eta} = \overline{A}(W, W_{sq}) \eta + B(W). \quad \text{(equation 59)}$$

To improve the accuracy of the approximation $W_{sq} \approx W^2$, the following constraint set is defined.

Definition 4 (Approximation of $W_{sq} \approx W^2$).
Define the set $\mathbb{W}_{sq} \subseteq \mathbb{D}_+^n$ whereby $W_{sq} \in \mathbb{W}_{sq}$ if $$W \geq W_{sq} \quad \text{(equation 60a)}$$

$$\begin{bmatrix} W_{sq} - \epsilon_1 I_n & W \\ W & I \end{bmatrix} > 0. \quad \text{(equation 60b)}$$

$$\begin{bmatrix} \epsilon_2 I_n - W_{sq} & W \\ W & I - \end{bmatrix} < 0, \quad \text{(equation 60c)}$$

$$\text{trace}(W_{sq}) \geq n\mu^2, \quad \text{(equation 60d)}$$

$$0 \leq \underline{w}^2 I_n \leq W_{sq} \leq \overline{w}^2 I_n \leq I_n, \quad \text{(equation 60e)}$$

for some $0 < \epsilon_1 < 1$ and $1 < \epsilon_2$.

The first constraint of equation 60a implies that the approximation of $w(x)^2$ should be less than $w(x)$ on $0 \leq w(x) \leq 1$.

By applying the Schur compliment, the conditions of equations 60b and 60c are equivalent to $$\epsilon_1 I_n \leq W_{sq} - W^2 \leq \epsilon_2 I_n, \quad \text{(equation 61)}$$

with $\epsilon_1$ and $\epsilon_2$ providing upper and lower bounds for the approximation. The constraint of equation 60d provides a conservative condition for the sum constraint of equation 56a. The final constraint of equation 60e ensures that the upper and lower bounds of equation 56b are satisfied by the approximation $W_{sq}$.

The second relaxation to convexify Proposition 3 is to fix the boundary values of the active material weight fraction, $W_0$ and $W_L$, since the boundary conditions on the overpotential in equation 51 are set by the reciprocal of the conductivities. The vector of boundary weight fractions $W_0^L = [w(0), w(L)]$ determines $B(W) = B(W_0^L)$ which is now a fixed vector.

Finally, to overcome, the NMI condition in equation 57b, the convexified version of Proposition 3 has either W or P fixed, as in an initial estimate for either the design variable W or of the energy for the system P is set before the optimisation iterates around this point.

With these relaxations applied, Proposition 3 is then convexified.

Proposition 4 For fixed $P \in \mathbb{S}_{>0}^n$ or $W \in \mathbb{W}$ and a given $W_0^L = [w(0), w(L)]$, if there exists a solution to $$\min \gamma^2 + \text{trace}(W_{sq} - \overline{w} W). \quad \text{(equation 62a)}$$

$$\text{s.t.} \quad W_{sq} \in \mathbb{W}_{sq}, \quad \text{(equation 62b)}$$

$$\begin{bmatrix} P\overline{A}(W, W_{sq}) + \overline{A}(W, W_{sq})^T P + I_n & PB(W_0^L) \\ (PB(W_0^L))^T & -\gamma^2 \end{bmatrix} \leq 0, \quad \text{(equation 62c)}$$

then $\|\eta\|_2 < \gamma \|i\|_2$ for all $i \in \mathcal{L}_2$.

This is a convex semi-definite program that can be solved efficiently using solvers like MOSEK [6]. The trace term in the cost function of equation 62a regularises the approximation $W_{sq} \approx W^2$ and leads to a non-noticeable gap between $W^2$ and $W_{sq}$ in the results.

Iterated Design

An iterative solution for the design problem of finding an optimal W is then proposed, as described by Algorithm 1 below, which recursively solves the SDP in equation 62 of Proposition 4. An initial guess of W is first made to generate an energy P, which is then used to find a new optimised weight fraction W, with the process then repeating. Progression of this algorithm is defined by two functions corresponding to the solution of the SDP of equation 62 with either W or P fixed. Solving equation 62 with fixed W generates a storage function matrix P, with this function written as $[P, \gamma]$ = Compute $P(W)$. Likewise, solving equation 62 with a fixed P to compute W is defined by the function $[W, \gamma]$ = Compute $W(P)$.

| Algorithm 1 Iterative Solutions |
| --- |
| Require: $K_{max} \in \mathbb{N}$, $W_1 \in D_+^n$, $\mu \in [0, 1]$, $w(0) \in [0, 1]$ and $w(L) \in [0, 1]$. |
| 1:     for $k = 1, \ldots, K_{max}$ do |
| 2:         $[P_k, \gamma_k]$ = Compute $P(W_k)$. |
| 3:         $[W_{k+1}, \gamma_k]$ = Compute $W(P_k)$. |
| 4:     end for |

The algorithm then locally optimises around the initial distribution $W_1$ whilst satisfying the constraints.

The design with lowest $\gamma$ was then selected which was typically the design found on the first iteration.

Comments about the Design Method

The design approach introduced above contrasts with most existing methods for optimising Li-ion batteries, including those that use neural networks [74], meta models [64], evolutionary algorithms [21, 14], genetic algorithms [75] and parameter sweeps [11]. The key benefits of the proposed approach include:

1. Computational speed. Algorithm 1 takes seconds to solve using standards semi-definite programming solvers such as MOSEK [66], even with $n \approx 100$ decision variables.

2. The results are robust. The bound γ holds for all charging currents i∈$\mathcal{L}_2$, not simply for galvanostatic currents.
3. Constraints on the active material distribution are naturally applied.
4. There is a physical interpretation in terms of shaping the system's energy.

This brings a generality, simplicity and speed to the design process whose solutions are applicable to a wide range of charging currents with performance guarantees provided. The limitations of the approach are:

1. The overpotential dynamics are simplified into a form with a linear dependence between the model parameters and the decision variables of the optimisation problem.
2. An initial guess for the weight fraction is required (although the algorithm was found to be quite robust to this).
3. Only the initial response of the electrode is optimised (by the small signal analysis assumption).
4. The robust solutions may be sub-optimal for particular currents in the space $\mathcal{L}_2$.

Limitation 1) could be relaxed by noting that j(η(x,t)) (equation 37) is a monotonic function of n and so is locally sector bounded. The dynamics of equation 48 could then be understood as a Lurie system [8], a class of well-understood nonlinear systems. The speed and flexibility of the proposed approach then comes at the cost of model accuracy and potential solution sub-optimality of the non-convex problem. These were, however, found to be not significant in the experimental results, as shown below.

Results: Model Based Design

The optimal designs generated by Algorithm 1 are investigated in this section. For these solutions, graded LFP cathodes were considered with the model parameter values of Table 5 and the optimisation parameters of Table 6. The boundary values of the active material weight fraction were set to w(0)=w(L)=μ−$w_A$, with $w_A$=0.25 and the initial distribution was w(x)=a(x/L)²+b(x/L)+w(0) with a=−3/2, b=w(L)−w(0)−a, although the algorithm was found to be quite robust to the initial conditions, meaning that it converged to the found trapezoidal designs with most initial conditions trialed. Increasing the carbon content at the boundaries increases the local conductivities there, and so, from equation 51, reduces the current fluxes experienced by the electrode. Amplifying this effect further by promoting steeper gradients at the boundaries should improve the electrode's performance even more. The graded electrodes were compared against equivalent uniform electrodes with constant active material weight fractions $$w_{unif} = \frac{1}{L}\int_0^L w(x)dx = \mu. \quad \text{(equation 63)}$$

For different average values for u (see equation 47a), the computed distributions in the weight fraction of active material are shown in FIG. 7. A clear trapezoidal shape can be seen in the designs, with most of the active material containing lithium particles concentrated in the centre region of the electrode and large gradients at the current collector and separator boundaries. For electrodes having higher average levels of active material, i.e. with larger values for μ, the slope constraint of equation 47c limited by the spray pumping rate was active at the domain boundaries. If this slope constraint were to be removed, these gradients could become even steeper, highlighting how the algorithm tends to promote sharp gradients at the boundary regions with most of the active material in the centre of the electrode.

In a general aspect therefore, the distribution of active material across the thickness of the electrode is such that the weight fraction of active material between at least 15% and 85% of the thickness of the electrode is greater than the overall average weight fraction of active material in the electrode. In the plots of FIG. 7, 15% of the thickness corresponds to around 0.18×10⁻⁴ m (18 μm) and 85% corresponds to around 1.02×10⁻⁴ m (102 μm) across the electrode, as measured from the current collector interface.

The overall average weight fraction may be between around 0.6 and 0.9. Below this range the amount of active material may be insufficient to achieve high activity, while above this range the amount of binder and conductor may be insufficient to allow for the electrode to be bound together sufficiently to retain integrity and to conduct electricity sufficiently.

The weight fraction of active material reduces from a maximum between 15% and 85% of the electrode thickness to a minimum at one or both of the current collector and separator interfaces. In the example in FIG. 7, the minimum is around 0.3 at both the current collector and separator interfaces.

A maximum gradient of the active material weight fraction is at least around 3, a dimensionless value determined by the rise or fall in weight fraction over a fraction of the electrode thickness.

The maximum gradient in the examples in FIG. 7 are between around 3 and 4. In other examples the maximum gradient may be higher, depending on the thickness of the electrode, the ability of the manufacturing process to alter the composition over time, and the size of the constituent particles. A maximum gradient may for example be around 5 or 10 in a practical implementation.

Between around at least 15% and 85% of the thickness of the electrode, the variation in active material may be relatively small, for example varying by no more than around 0.05. The majority of variation is therefore constrained towards the boundaries of the electrode, i.e. towards the current collector and separator interfaces.

To evaluate the performance of the trapezoidal designs, their initial response to an applied current was considered, the results of which are shown in FIGS. 8a and 8b. Since the overpotential dynamics η(x,t) are significantly faster than the electrode's other electrochemical effects such as solid-state diffusion, η(x,t) will be at equilibrium for most applied currents when the state-of-charge is constant. Analysing the equilibrium overpotential η*(x) therefore reveals key details about the electrode response, with η*(x) being the solution to $$0 = \left(\sigma(x)\frac{\partial^2}{\partial x^2} + \frac{d\sigma(x)}{dx}\frac{\partial}{\partial x} - \frac{i_\theta^* F \alpha_c(x)}{RT}\right)\eta^*(x,t) \quad \text{(equation 64)}$$

subject to the boundary conditions of equation 51. The discrete form of this solution η*∈$\mathbb{R}^n$ is given by $$\eta^* = -A(W)^{-1}B(W)\frac{I(t)}{S_A}, \quad \text{(equation 32)}$$

scaling linearly with the applied current, set in this case to I(t)=3.5 mA. From η*(x), the reactivity j(η*(x,t)) can then be computed using equations 37, 44 and 45, which determines the initial rate of lithium intercalation into the particles. Whilst $j(\eta^*(x))$ only determines the initial discharge rate of the particles, it was found to provide a good, simple metric for the high C-rates response.

FIGS. 8a and 8b compare the equilibrium overpotentials and reactivities of the trapezoidal designs shown in FIG. 7 with the equivalent uniform electrodes, i.e. with uniform electrodes having the same overall average weight fraction of active material, for a unit current I(t)=3.5 mA. FIG. 8b is focused on the region closer to the current collector, where most of the reactivity in the electrode takes place. In both of these plots, the response of the trapezoid electrodes is more uniform, with the peak reactivity in particular being significantly reduced. This is considered to be primarily due to the higher carbon content near to the current collector interface, which increases the free electronic conductivity (equation 44) and reducing both the reactivity constant (equation 45) and current fluxes at the boundaries (equation 51). Without the dependencies of equations 44 and 45, which were identified as being critical to the graded electrode model's accuracy, little difference was observed between the uniform and graded electrode responses, possibly suggesting an explanation for the conclusions of [4].

Two metrics are defined to evaluate these responses: the average reactivity $$j_{average} = \frac{1}{L} \int_0^L j(\eta^*(x)) dx \quad \text{(equation 66)}$$

and its peak $$\|j(\eta^*(x))\|_\infty = \sup_{x \in [0,L]} j(\eta^*(x)). \quad \text{(equation 67)}$$

Variations in these metrics for different average values of active material u are shown FIGS. 9a and 9b for both the trapezoidal designs from Algorithm 1 and the equivalent uniform electrodes. FIG. 9a shows the peak reaction rate as a function of average active material weight fraction, while FIG. 9b shows the average reaction rate as a function of average active material weight fraction. These plots show that, as the average active material weight fraction u increases, the difference between the average reactivity of the uniform and trapezoidal electrodes remains fairly constant but the peak reactivity in the uniform electrodes rises sharply compared with that of the graded electrodes, highlighting the trapezoid design's more homogeneous use.

The region of peak reactivity for both the uniform and the trapezoidal electrodes was at the current collector, due to the boundary conditions (equation 51) and since $\sigma \ll \kappa$ for LFP cells. In the trapezoid designs, this highly reactive region will have a reduced reacting surface area, as the carbon content is locally increased at the expense of active material. Upon cycling at large C-rates, the heterogeneous electrode response will cause particles in this region to experience deeper discharges. But, by moving particles away from this region with the trapezoidal designs, the percentage of cycled (and so stressed) particles in the electrode is reduced, which decreases the chance of particle cracking and loss of active material.

The importance of the electronic $\sigma$ to ionic $\kappa$ conductivity ratio on shaping the heterogeneous electrode response is highlighted in FIG. 10. Similarly to [43], this illustrative figure plots solutions $\eta^*(x)$ of equation 64 with w(0)=0.8 defining $a_s(x)$ (equation 46) and $k_{i0}$ (equation 45), $\kappa=1$ and $\sigma$ set by the various ratios for $\sigma/\kappa$ shown in FIG. 10, i.e. 0.5, 0.75, 1, 2 and 10. With a low electronic conductivity, the largest initial overpotentials were at the current collector but, as the $\sigma/\kappa$ ratio increase, these large overpotentials move towards the separator, aligning with the similar conclusions of [43].

As the overpotential drives the interfacial reaction rate $j(\eta(x,t))$, if $\sigma(0) \ll \kappa(L)$, as is typically the case for LFP cells, in which typical conductivities may be in the region of $\sigma \approx 10^{-1}$ S m$^{-1}$ and $\kappa \approx 1$ S m$^{-1}$, the peak reactivity will be at the current collector. But, if $\sigma(0) \gg \kappa(L)$, as is the case for LIB cathode materials such as LiNi$_{1-x-y}$Mn$_x$Co$_y$O$_2$ (NMC) where corresponding conductivity values may be in the region of $\sigma \approx 101$ S m$^{-1}$ and $\kappa \approx 1$ S m$^{-1}$, active particles at the separator will experience the peak reactivity. Particles in the region of peak initial reactivity will discharge first and so, for large enough current densities these particles will be cycled most fully and fastest. Since charge/discharge almost always involves particle volume change, and thus potentially pulverising strains, active particles in this relatively reactive local region will tend to experience the highest strains and likelihood of fracture, isolation and resulting in a progressive loss of capacity. Thus, we can now see that a reason for grading is to move a proportion of active particles away from this highly active region and replacing them with another material.

Grading optimisation therefore involves deciding how much active material can be moved, and where, before overall capacity is reduced. The optimum will lie in an arrangement where the most uniform electrochemical response of the electrode as a whole combines with the smallest impedance, i.e. the flattest and lowest curve of overpotential as a function of distance across the cathode, increasing the overall realisable and useful cycle life.

Returning to the specific case of the graded LFP cells studied here, since $\sigma(0) \ll \kappa(L)$, the implication is that a proportion of active particles should be moved away from the comparatively reactive current collector region to improve overall electrode response. This is consistent with the improved performance of the AC@ and CAC@ designs (and the poorer performance of the CA@ design) as disclosed in [3]). FIG. 19 plots the overpotential distributions for both the graded AC@, CAC@ and uniform electrodes obtained by solving equation 21. The overpotential of the CAC@ graded electrode 1901 and the AC@ grade electrode 1902 are lower than that of the equivalent uniform electrode 1903, and the AC@ overpotential relationship is notably flatter, supporting the idea that heterogeneous electrode structures can homogenise and reduce overpotential distributions by reducing electrode resistance and avoiding excessive, local pulverisation of active material.

By extension, for cathodes based on NMC for example, it is expected that performance benefits might be provided if the configuration were reversed, and the separator region was carbon rich. Thus, there is no "universal" best arrangement of the various particulates in a Li-ion battery electrode, but for each cathode chemistry an optimum arrangement (for a fixed fraction of each component) may exist, which will depend on the ionic and electronic conductivity behaviour of the electrode materials, and how their spatial distribution is contrived. Indeed, for some electrode compositions, the optimum arrangement may be acceptably close to a uniform distribution of constituents (at least for relatively thin electrodes and at modest C-rate), as is produced to such great effect at scale by slurry casting. However, for some chemistries and fixed fractions of materials, or if ultra-thick and/or high-power electrodes are required, the optimum arrangement may be a graded or layered arrangement, the details of which can be guided by models of the type described herein.

In the above, for the design and analysis of the trapezoid electrodes, it was assumed that the state-of-charge (SoC) remained constant. This simplified the analysis, but it is not a reasonable assumption to make in practice. To generalise these results, a full charge was simulated for both the trapezoidal and the uniform electrodes, as illustrated in FIG. 11, which illustrate evolution of the local particle concentrations and interfacial reaction rates for slurry cast (FIGS. 11a and 11c) and trapezoidal graded electrodes (FIGS. 11b and 11d). By controlling the microstructure, the graded electrodes demonstrated reduction in reaction rates, which delays charging of the particles, equating to an increase in capacity. In each of the plots, the particle concentration (FIGS. 11c, 11b) or reaction rate (FIGS. 11c, 11d) are shown as a function of both distance across the electrode (where x=0 corresponds to the current collector interface) and over time, from 0 to 1 hour.

In these simulations, ions in the particles evolved by spherical solid-state diffusion $$\frac{\partial c_s(x, r, t)}{\partial t} = D_s \left( \frac{\partial^2 c_s(x, r, t)}{\partial r^2} + \frac{2}{r} \frac{\partial c_s(x, r, t)}{\partial r} \right) \quad \text{(equation 68a)}$$

subject to $$\left. \frac{\partial c_s(x, r, t)}{\partial r} \right|_{r=0} = 0, \quad \left. \frac{\partial c_s(x, r, t)}{\partial r} \right|_{r=R_s} = -\frac{j(\eta(x, t))}{D_s}, \quad \text{(equation 68b)}$$

with the electrode potential satisfying $$C^{ep} \frac{\partial \phi_{dl}(x, t)}{\partial t} = \frac{\partial}{\partial x} \left( \Gamma(x) \frac{\partial \phi_{dl}(x, t)}{\partial x} \right) - j(\eta(x, t)) + \frac{d\Sigma(x)}{dx} i(t) \quad \text{(equation 69a)}$$

where $$\left. \frac{\partial \phi_{dl}(x, t)}{\partial x} \right|_{x=0} = -\frac{1}{\sigma(0)} i(t), \quad \left. \frac{\partial \phi_{dl}(x, t)}{\partial x} \right|_{x=L} = \frac{1}{\kappa(L)} i(t). \quad \text{(equation 69b)}$$

The potential dynamics of equations 69a and 69b are equivalent to equation 48 for the overpotentials except with the constant SoC assumption relaxed. The boundary condition at the particle surface (when $r=R_s$) in equation 68b is an algebraic constraint that has to be solved at each point in time within the model. Whilst commonly used in battery modelling [6], spherical solid-state diffusion of equation 68 is a simplified model for LFP particles, which exhibit a two core system in general [69]. For the single charge simulated here, however, this phenomenon is not expected to be significant.

FIGS. 11a-d show the simulation results under an applied current of 3.12 mA and with the parameters of Table 5 used. The results of this draw similar conclusions to in showing that LFP cathodes experience a propagating front of interfacial reactivity from the current collector to the separator as the cathode is charged, illustrating the electrode inhomogeneity. A key point is that the lower conductivities of the trapezoidal shaped graded designs reduce the reaction rates compared to the uniform case (being $j \approx 9 \times 10^{-6}$ in the uniform electrodes, reduced to $j \approx 4.5 \times 10^{-6}$ in the trapezoid designs), which leads to fewer particles being fully charged, and hence an increase in capacity. Without the parametrisations of equations 34 and 35, which were found to be critical to the model's accuracy for LFP half-cells, no noticeable difference between the trapezoidal and uniform, slurry-cast electrode responses was observed.

Spray Forming Process for Structured Electrodes

Closing the loop in the design process, the graded electrode designs of FIG. 7 were produced using the spray-forming process of [3]. The relative fractions of carbon, binder and active material of the trapezoid designs manufactured by the spray process as well as the equivalent uniform, slurry-cast electrodes with the same amount of active material are shown in FIG. 12. The overall average weight fraction of active material was selected to be 80%. The graded distribution of active material weight fraction was maintained constant at around 85% between 15% and 85% of the thickness across the electrode, falling to around 40-45% at the separator and current collector boundaries. It may be desirable for the active material content to be as low possible at the current collectors and as high as possible at the separator. A steeper gradient may allow for this effect to be amplified, with these steep gradients being the output of the optimisation. The distributions may, however, need to be continuous to avoid step changes in the microstructure that can introduce new resistances into the electrode. A reduction in gradient from the edges of the electrode towards the central portion may therefore be advantageous.

Details of the spray process are given in [3] and only a summary is given here. The basis of the electrode fabrication process of [3] is a high-pressure spray that deposits layer-by-layer a solution containing the electrode components onto the current collector, which is then near instantaneously evaporated off by a hot plate. Using a program to control the layer-by-layer spray deposition, a near continuous distribution of the active material across the electrode could be built up. To achieve the controlled material variations in space across the electrode, two suspensions were formed, suspension A and suspension B, as illustrated in FIG. 1 of [3]. Suspension A was pumped into the spray nozzle by a peristaltic pump and was then atomized by compressed air at $\approx 0.4$ bar, the resulting spray suspension droplets then being deposited onto the foil current collector. The current collector was held at a constant temperature of 140° C. to enable the liquid fraction of the spray to evaporate near instantaneously. Simultaneously, the content of suspension A was modified by mixing it with suspensions B, leading to the controlled spatially varying electrode properties. Spraying this evolving suspension layer-by-layer allowed electrodes with near continuous through thickness variations of active material weight fraction to be constructed, with a MATLAB code being used to control the pump rates [3].

The electrode components were: a $LiFePO_4$ based cathode using particles from Hydro-Quebec (Canada) and a Li foil anode; Super-P carbon black obtained from MTI (USA) used as a conducting agent and PVDF (polyvinylidene fluoride, MW at around 534,000) as a binder, NMP (1-Methyl-2-pyrrolidone, ≥99.0%) and IPA (2-propanol, 99.5%) from Sigma-Aldrich (UK).

Experimental Results: Cycling Performance

The manufactured structured electrodes with the trapezoidal distribution of FIG. 12 with $\mu=0.8$ were then tested in experiment through cycling. FIGS. 13 and 14a show the results of long term cycling with the first 5 cycles at 0.1C and the following 200 cycles at 1C, while FIG. 14b shows high C-rate cycling data. Also shown in FIG. 13 is the AC@ and CAC@ designs proposed in [3] and the equivalent uniform electrodes with µ=0.8.

The CAC@ design has a parabolic distribution of active material which is similar to the trapezoidal design proposed here. The results of this figure were obtained by averaging the response of three cells.

Two main conclusions about the trapezoidal design can be drawn from FIGS. 13 and 14. Firstly, compared to the slurry cast uniform electrodes the trapezoidal designs show reduced degradation and increased capacities at C-rates above 1C. For instance, when cycled at 1C, the trapezoid designs had a 50.2% reduction in the degradation rate and a 44.7% increase in capacity compared to the equivalent uniform, slurry-cast electrodes. For these values, the capacity improvement was measured by $$\Delta \text{ capacity} = 100 \frac{Cap_{trap}|_{1C} - Cap_{unif}|_{1C}}{Cap_{unif}|_{1C}} \quad \text{(equation 70)}$$

with $Cap_{\theta|1C}$ with $\theta \in \{unif, trap\}$ being the capacity of the uniform or trapezoidal half-cells, respectively, at 1C given in the data of FIG. 14b and the degradation rate improvement was measured by $$\frac{d \text{ capacity}}{d \text{ cycle}} = 100 \frac{\frac{dCap_{trap}}{d \text{ cycle}} - \frac{dCap_{unif}}{d \text{ cycle}}}{\frac{dCap_{unif}}{d \text{ cycle}}} \quad \text{(equation 71)}$$

with $$\frac{dCap_\theta}{d \text{ cycle}} = 100 \frac{Cap_{trap}|_{cycle\,205} - Cap_{trap}|_{cycle\,8}}{205 - 8} \quad \text{(equation 72)}$$

and $Cap_{\theta|cycle\,k}$ being the capacity in the "θ" half-cell at cycle k extracted from the data of FIG. 14a. These significant improvements justify the design approach and illustrate the predicted benefits of graded electrodes, namely that by locally controlling the electrode microstructure the electronic conductivity can be tailored to reduce the overpotentials without sacrificing on energy density (since the same amount of active material was retained within the electrode). Compared to the CAC@ and AC@ graded electrodes from [3], the new trapezoidal designs had an improved performance over the AC@ half-cells and reduced variability in cycling behaviour compared to the CAC@ designs. These results illustrate how changes in the battery manufacturing can make a real difference to the battery's energy storage performance.

FIG. 15 illustrates a schematic flow diagram of an example method of designing an electrode for an electric battery cell. In a first step 1501, upper and lower bounds for the weight fraction of electrochemically active material are selected. In a second step 1502, an initial weight fraction for the electrode is selected for x=0 and x=L. In a third step 1503, a model of overpotential dynamics is applied for the electrode. In step 1504, a variation in the weight fraction of electrochemically active material is adjusted to determine a distribution that minimises overpotential across the electrode.

FIG. 16 schematically illustrates an example electrode assembly 1600, comprising a current collector 1601 comprising an electrically conductive layer, a separator 1602 and an electrode 1603 disposed between the current collector 1601 and the separator 1602. The electrode 1603 may for example be a cathode or an anode of a lithium ion battery cell. The electrode 1603 has a thickness L between first and second opposing faces 1604, 1605 and has a weight fraction w(x) of electrochemically active material with a distribution that ranges from x=0 to x=L.

FIG. 17 schematically illustrates an example battery 1700 comprising a cell with an electrode assembly of the type illustrated in FIG. 16. The cell comprises a first current collector 1601 and first electrode 1603 on one side of the separator 1602 and a second current collector 1701 and second electrode 1703 on the other side of the separator 1602. The first electrode 1603 may be the cathode, while the second electrode 1703 may be the anode.

FIG. 18 schematically illustrates an example method of manufacturing an electrode 1803 for an electric battery cell, the method comprising depositing a compound mixture 1805 of an electrochemically active material, an electrically conductive material and a binding material on a substrate 1801 to form the electrode 1803. The mixture 1805 may be deposited by spraying on to the substrate, i.e. via a spraying nozzle 1806. Further details of the method may be found for example from [3] and [78].

It will be understood that various modifications and improvements can be made without departing from the concepts disclosed herein. Except where mutually exclusive, any of the features may be employed separately or in combination with any other features and the disclosure extends to all combinations and sub-combinations of one or more features disclosed herein.

REFERENCES

[1] A. M. Bizeray, J.-H. Kim, S. R. Duncan, and D. A. Howey, "Identifiability and parameter estimation of the single particle lithium-ion battery model," IEEE Transactions on Control Systems Technology, no. 99, pp. 1-16, 2018.

[2] I. D. Campbell, K. Gopalakrishnan, M. Marinescu, M. Torchio, G. J. Offer, and D. Raimondo, "Optimising lithium-ion cell design for plug-in hybrid and battery electric vehicles," Journal of Energy Storage, vol. 22, pp. 228-238, 2019.

[3] C. Cheng, R. Drummond, S. R. Duncan, and P. S. Grant, "Micro-scale graded electrodes for improved dynamic and cycling performance of Li-ion batteries," Journal of Power Sources, vol. 413, pp. 59-67, 2019.

[4] Y. Dai and V. Srinivasan, "On graded electrode porosity as a design tool for improving the energy density of batteries," Journal of the Electrochemical Society, vol. 163, no. 3, pp. A406-A416, 2016.

[5] S. De, P. W. C. Northrop, V. Ramadesigan, and V. R. Subramanian, "Model-based simultaneous optimization of multiple design parameters for lithium-ion batteries for maximization of energy density," Journal of Power Sources, vol. 227, pp. 161-170, 2013.

[6] M. Doyle, T. Fuller, and J. Newman, "Modeling of galvanostatic charge and discharge of the lithium/polymer/insertion cell," Journal of the Electrochemical Society, vol. 140, no. 6, pp. 1526-1533, 1993.

[7] R. Drummond, C. Huang, P. Grant, and S. Duncan, "Overcoming diffusion limitations in supercapacitors using layered electrodes," Journal of Power Sources, vol. 433, p. 126579, 2019.

[8] R. Drummond, A. Bizeray, D. Howey, and S. R. Duncan, "A feedback interpretation of the Doyle-Fuller-Newman Li-ion battery model," IEEE Transactions on Control Systems Technology, 2019.

[9] R. Drummond, S. Zhao, and S. R. Duncan, "Design tools for electrochemical supercapacitors using local absolute stability theory," IEEE Transactions on Control Systems Technology, no. 99, pp. 1-13, 2018.

[10] M. M. Forouzan, B. A. Mazzeo, and D. R. Wheeler, "Modeling the effects of electrode microstructural heterogeneities on Li-ion battery performance and lifetime," Journal of The Electrochemical Society, vol. 165, no. 10, pp. A2127-A2144, 2018.

[11] T. F. Fuller, M. Doyle, and J. Newman, "Simulation and optimization of the dual lithium ion insertion cell," Journal of the Electrochemical Society, vol. 141, no. 1, pp. 1-10, 1994.

[12], "Simulation and optimization of the dual lithium ion insertion cell," Journal of the Electrochemical Society, vol. 141, no. 1, pp. 1-10, 1994.

[13] M. Gaberscek, J. Moskon, B. Erjavec, R. Dominko, and J. Jamnik, "The importance of interphase contacts in Li ion electrodes: the meaning of the high-frequency impedance arc," Electrochemical and Solid-State Letters, vol. 11, no. 10, pp. A170-A174, 2008.

[14] S. Golmon, K. Maute, and M. L. Dunn, "A design optimization methodology for Li+ batteries," Journal of Power Sources, vol. 253, pp. 239-250, 2014.

[15] J. Haverkort, "A theoretical analysis of the optimal electrode thickness and porosity," Electrochimica Acta, vol. 295, pp. 846-860, 2019.

[16] C. Huang, N. P. Young, J. Zhang, H. J. Snaith, and P. S. Grant, "A two layer electrode structure for improved Li-ion diffusion and volumetric capacity in Li-ion batteries," Nano Energy, vol. 31, pp. 377-385, 2017.

[17], "A two layer electrode structure for improved Li ion diffusion and volumetric capacity in Li ion batteries," Nano energy, vol. 31, pp. 377-385, 2017.

[18] C. Huang, J. Zhang, N. P. Young, H. J. Snaith, and P. S. Grant, "Solid-state supercapacitors with rationally designed heterogeneous electrodes fabricated by large area spray processing for wearable energy storage applications," Scientific reports, vol. 6, p. 25684, 2016.

[19] F. M. Kindermann, P. J. Osswald, G. Ehlert, J. Schuster, A. Rheinfeld, and A. Jossen, "Reducing inhomogeneous current density distribution in graphite electrodes by design variation," Journal of The Electrochemical Society, vol. 164, no. 11, pp. E3105-E3113, 2017.

[20] H. Kondo, H. Sawada, C. Okuda, and T. Sasaki, "Influence of the active material on the electronic conductivity of the positive electrode in lithium-ion batteries," Journal of The Electrochemical Society, vol. 166, no. 8, pp. A1285-A1290, 2019.

[21] L. Liu, P. Guan, and C. Liu, "Experimental and simulation investigations of porosity graded cathodes in mitigating battery degradation of high voltage lithium-ion batteries," Journal of The Electrochemical Society, vol. 164, no. 13, pp. A3163-A3173, 2017.

[22] S. G. Marquis, V. Sulzer, R. Timms, C. P. Please, and S. J. Chapman, "An asymptotic derivation of a single particle model with electrolyte," arXiv preprint arXiv: 1905.12553, 2019.

[23] A. Masliy and N. Poddubny, "Influence of solid phase conductivity on spatial localization of electrochemical processes in flow-through porous electrodes: Part i: Electrodes with uniform conducting matrix," Journal of applied electrochemistry, vol. 27, no. 9, pp. 1036-1044, 1997.

[24], "Influence of solid phase conductivity on spatial localization of electrochemical processes in flow-through porous electrodes part ii: Nonuniform porous matrix with a variable conductivity profile," Journal of Applied Electrochemistry, vol. 27, no. 9, pp. 1045-1051, 1997.

[25], "Effect of distortions in the ideal profile of solid phase conductivity on performance efficiency of porous electrodes," Journal of applied electrochemistry, vol. 28, no. 6, pp. 589-592, 1998.

[26] J. Newman and W. Tiedemann, "Porous-electrode theory with battery applications," AIChE Journal, vol. 21, no. 1, pp. 25-41, 1975.

[27] J. Newman and K. E. Thomas-Alyea, Electrochemical systems. John Wiley & Sons, Honoken, NJ, 2012.

[28] B. Nykvist and M. Nilsson, "Rapidly falling costs of battery packs for electric vehicles," Nature climate change, vol. 5, no. 4, p. 329, 2015.

[29] I. J. Ong and J. Newman, "Double-layer capacitance in a dual lithium ion insertion cell", Journal of The Electrochemical Society, vol. 146, no. 12, pp. 4360-4365, 1999.

[30] J. W. Palko, A. Hemmatifar, and J. G. Santiago, "Tailored porous electrode resistance for controlling electrolyte depletion and improving charging response in electrochemical systems", Journal of Power Sources, vol. 397, pp. 252-261, 2018.

[31] S. Paul, C. Diegelmann, H. Kabza, and W. Tillmetz, "Analysis of ageing inhomogeneities in lithium-ion battery systems," Journal of Power Sources, vol. 239, pp. 642-650, 2013.

[32] Y. Qi, T. Jang, V. Ramadesigan, D. T. Schwartz, and V. R. Subramanian, "Is there a benefit in employing graded electrodes for lithium-ion batteries?" Journal of The Electrochemical Society, vol. 164, no. 13, 2017.

[33] V. Ramadesigan, R. N. Methekar, F. Latinwo, R. D. Braatz, and V. R. Subramanian, "Optimal porosity distribution for minimized ohmic drop across a porous electrode," Journal of The Electrochemical Society, vol. 157, no. 12, pp. A1328-A1334, 2010.

[34] J. P. Schmidt, T. Chrobak, M. Ender, J. Illig, D. Klotz, and E. Ivers-Tiffée, "Studies on $LiFePO_4$ as cathode material using impedance spectroscopy," Journal of Power Sources, vol. 196, no. 12, pp. 5342-5348, 2011.

[35] H. C. Shin, W. I. Cho, and H. Jang, "Electrochemical properties of carbon-coated $LiFePO_4$ cathode using graphite, carbon black, and acetylene black," Electrochimica Acta, vol. 52, no. 4, pp. 1472-1476, 2006.

[36] V. Srinivasan and J. Newman, "Design and optimization of a natural graphite/iron phosphate lithium-ion cell," Journal of the Electrochemical Society, vol. 151, no. 10, pp. A1530-A1538, 2004.

[37], "Discharge model for the lithium iron-phosphate electrode," Journal of the Electrochemical Society, vol. 151, no. 10, pp. A1517-A1529, 2004.

[38], "Existence of path-dependence in the $LiFePO_4$ electrode," Electrochemical and solid-state letters, vol. 9, no. 3, pp. A110-A114, 2006.

[39] K. Striebel, J. Shim, V. Srinivasan, and J. Newman, "Comparison of $LiFePO_4$ from different sources," Journal of the Electrochemical Society, vol. 152, no. 4, pp. A664-A670, 2005.

[40] B. Suthar, P. W. C. Northrop, D. Rife, and V. R. Subramanian, "Effect of porosity, thickness and tortuosity on capacity fade of anode," Journal of The Electrochemical Society, vol. 162, no. 9, pp. A1708-A1717, 2015.

[41] S. T. Taleghani, B. Marcos, K. Zaghib, and G. Lantagne, "A study on the effect of porosity and particles size distribution on Li-ion battery performance," Journal of The Electrochemical Society, vol. 164, no. 11, pp. E3179-E3189, 2017.

[42] , "The effect of structural properties of a two-layered electrode on the Li-ion battery polarization," Journal of The Electrochemical Society, vol. 166, no. 2, pp. A225-A235, 2019.

[43] Y. Tang, M. Jia, J. Li, Y. Lai, Y. Cheng, and Y. Liu, "Numerical analysis of distribution and evolution of reaction current density in discharge process of lithium-ion power battery," Journal of the electrochemical society, vol. 161, no. 8, pp. E3021-E3027, 2014.

[44] I. V. Thorat, T. Joshi, K. Zaghib, J. N. Harb, and D. R. Wheeler, "Understanding rate-limiting mechanisms in $LiFePO_4$ cathodes for Li-ion batteries," Journal of The Electrochemical Society, vol. 158, no. 11, pp. A1185-A1193, 2011.

[45] L. N. Trefethen, Spectral methods in MATLAB. SIAM, 2000, vol. 10.

[46] M. Wang, J. Li, X. He, H. Wu, and C. Wan, "The effect of local current density on electrode design for lithium-ion batteries," Journal of Power Sources, vol. 207, pp. 127-133, 2012.

[47] Y. Wang, X. Fu, M. Zheng, W.-H. Zhong, and G. Cao, "Strategies for building robust traffic networks in advanced energy storage devices: A focus on composite electrodes," Advanced Materials, vol. 31, no. 6, p. 1804204, 2019.

[48] D. Westhoff, T. Danner, S. Hein, R. Scurtu, L. Kremer, A. Hoffmann, A. Hilger, I. Manke, M. Wohlfahrt-Mehrens, A. Latz et al., "Analysis of microstructural effects in multi-layer lithium-ion battery cathodes," Materials Characterization, 2019.

[49] B. Wu, V. Yufit, M. Marinescu, G. J. Offer, R. F. Martinez-Botas, and N. P. Brandon, "Coupled thermal-electrochemical modelling of uneven heat generation in lithium-ion battery packs," Journal of Power Sources, vol. 243, pp. 544-554, 2013.

[50] Y. Yang, R. Xu, K. Zhang, S.-J. Lee, L. Mu, P. Liu, C. K. Waters, S. Spence, Z. Xu, C. Wei et al., "Quantification of heterogeneous degradation in li-ion batteries," Advanced Energy Materials, p. 1900674, 2019.

[51] A. Zaban, E. Zinigrad, and D. Aurbach, "Impedance spectroscopy of Li electrodes. 4. A general simple model of the Li-solution interphase in polar aprotic systems," The Journal of Physical Chemistry, vol. 100, no. 8, pp. 3089-3101, 1996.

[52] H. Zheng, R. Yang, G. Liu, X. Song, and V. S. Battaglia, "Cooperation between active material, polymeric binder and conductive carbon additive in lithium ion battery cathode," The Journal of Physical Chemistry C, vol. 116, no. 7, pp. 4875-4882, 2012.

[53] L. Aravinda, K. Nagaraja, H. Nagaraja, K. U. Bhat, and B. R. Bhat, "Fabrication and performance evaluation of hybrid supercapacitor electrodes based on carbon nanotubes and sputtered TiO 2," Nanotechnology, vol. 27, no. 31, p. 314001, 2016.

[54] A. M. Bizeray, S. Zhao, S. R. Duncan, and D. A. Howey, "Lithium-ion battery thermal-electrochemical model-based state estimation using orthogonal collocation and a modified extended Kalman filter," Journal of Power Sources, vol. 296, pp. 400-412, 2015.

[55] S. Boyd, L. El Ghaoui, E. Feron, and V. Balakrishnan, Linear matrix inequalities in system and control theory. SIAM, 1994, vol. 15.

[56] L. Cai, K. An, Z. Feng, C. Liang, and S. J. Harris, "In-situ observation of inhomogeneous degradation in large format Li-ion cells by neutron diffraction," Journal of Power Sources, vol. 236, pp. 163-168, 2013.

[57] D.-W. Chung, M. Ebner, D. R. Ely, V. Wood, and R. E. Garc'ia, "Validity of the Bruggeman relation for porous electrodes," Modelling and Simulation in Materials Science and Engineering, vol. 21, no. 7, p. 074009, 2013.

[58] R. Drummond and S. Duncan, "Observer design for the Doyle-Fuller-Newman Li-ion battery model without electrolyte dynamics," Journal of Energy Storage, vol. 23, pp. 250-257, 2019.

[59] S. J. Harris and P. Lu, "Effects of inhomogeneities nanoscale to mesoscale on the durability of Li-ion batteries," The Journal of Physical Chemistry C, vol. 117, no. 13, pp. 6481-6492, 2013.

[60] D. Hill and P. Moylan, "The stability of nonlinear dissipative systems," IEEE Transactions on Automatic Control, vol. 21, no. 5, pp. 708-711, 1976.

[61] E. Hosseinzadeh, J. Marco, and P. Jennings, "The impact of multi-layered porosity distribution on the performance of a lithium ion battery," Applied Mathematical Modelling, vol. 61, pp. 107-123, 2018.

[62] D. Kehrwald, P. R. Shearing, N. P. Brandon, P. K. Sinha, and S. J. Harris, "Local tortuosity inhomogencities in a lithium battery composite electrode," Journal of The Electrochemical Society, vol. 158, no. 12, pp. A1393-A1399, 2011.

[63] H. K. Khalil and J. Grizzle, Nonlinear systems. Prentice hall Upper Saddle River, NJ, 2002, vol. 3.

[64] C.-W. Kim, H.-I. Yang, K.-J. Lee, and D.-C. Lee, "Metamodel-based optimization of a lithium-ion battery cell for maximization of energy density with evolutionary algorithm," Journal of The Electrochemical Society, vol. 166, no. 2, pp. A211-A216, 2019.

[65] M. Meyer, L. Komsiyska, B. Lenz, and C. Agert, "Study of the local SOC distribution in a lithium-ion battery by physical and electrochemical modeling and simulation," Applied Mathematical Modelling, vol. 37, no. 4, pp. 2016-2027, 2013.

[66] A. Mosek, "The mosek optimization software," Online at http://www.mosek.com, vol. 54, no. 2-1, p. 5, 2010.

[67] S. Müller, J. Eller, M. Ebner, C. Burns, J. Dahn, and V. Wood, "Quantifying inhomogeneity of lithium ion battery electrodes and its influence on electrochemical performance," Journal of The Electrochemical Society, vol. 165, no. 2, pp. A339-A344, 2018.

[68] B. Sankapal, H. Gajare, D. Dubal, R. Gore, R. Salunkhe, and H. Ahn, "Presenting highest supercapacitance for TiO 2/MWNTs nanocomposites: Novel method," Chemical Engineering Journal, vol. 247, pp. 103-110, 2014.

[69] V. Srinivasan and J. Newman, "Discharge model for the lithium iron-phosphate electrode," Journal of the Electrochemical Society, vol. 151, no. 10, pp. A1517-A1529, 2004.

[70] S. T. Taleghani, B. Marcos, K. Zaghib, and G. Lantagne, "The effect of structural properties of a two-layered electrode on the Li-ion battery polarization," Journal of The Electrochemical Society, vol. 166, no. 2, pp. A225-A235, 2019.

[72] I. V. Thorat, D. E. Stephenson, N. A. Zacharias, K. Zaghib, J. N. Harb, and D. R. Wheeler, "Quantifying tortuosity in porous Li-ion battery materials," Journal of Power Sources, vol. 188, no. 2, pp. 592-600, 2009.

[72] C. Wang and J. Hong, "Ionic/electronic conducting characteristics of LifePO 4 cathode materials the determining factors for high rate performance," Electrochemical and solid-state letters, vol. 10, no. 3, pp. A65-A69, 2007.

[73] D. Westhoff, T. Danner, S. Hein, R. Scurtu, L. Kremer, A. Hoffmann, A. Hilger, I. Manke, M. Wohlfahrt-Mehrens, A. Latz et al., "Analysis of microstructural effects in multi-layer lithium-ion battery cathodes," Materials Characterization, 2019.

[74] B. Wu, S. Han, K. G. Shin, and W. Lu, "Application of artificial neural networks in design of lithium-ion batteries," Journal of Power Sources, vol. 395, pp. 128-136, 2018.

[75] L. Zhang, L. Wang, G. Hinds, C. Lyu, J. Zheng, and J. Li, "Multi-objective optimization of lithium-ion battery model using genetic algorithm approach," Journal of Power Sources, vol. 270, pp. 367-378, 2014.

[76] Y. Zhang, O. I. Malyi, Y. Tang, J. Wei, Z. Zhu, H. Xia, W. Li, J. Guo, X. Zhou, Z. Chen et al., "Reducing the charge carrier transport barrier in functionally layer-graded electrodes," Angewandte Chemie, vol. 129, no. 47, pp. 15 043-15 048, 2017.

[77] Y. Zhao, F. B. Spingler, Y. Patel, G. J. Offer, and A. Jossen, "Localized swelling inhomogeneity detection in lithium ion cells using multi-dimensional laser scanning," Journal of The Electrochemical Society, vol. 166, no. 2, pp. A27-A34, 2019.

[78] C. Cheng, R. Drummond, S. R. Duncan & P. S. Grant, "Combining composition graded positive and negative electrodes for higher performance Li-ion batteries", Journal of Power Sources 448 (2020) 227376.

The invention claimed is:

1. A method of designing an electrode for an electric battery cell, the electrode comprising a compound mixture of an electrochemically active material, an electrically conductive material and a binding material, the method comprising:
   applying a model for an electrochemical response of the electric battery cell, the model including overpotential dynamics for the electrode; and
   optimising parameters of the model to maximise one or more of an energy density, power density, battery health or thermal response of the electric battery cell;
   wherein the electrode is a graded electrode and has a thickness L between first and second opposing faces, the method comprising:
   i) selecting upper and lower bounds for a weight fraction w(x) of the electrochemically active material at a fractional distance x from the first to second opposing faces;
   ii) selecting an initial weight fraction for the electrode for x=0 and x=L;
   iii) applying the model of overpotential dynamics for the electrode;
   iv) adjusting a variation in the weight fraction w(x) of the electrochemically active material to determine a distribution of the weight fraction w(x) of the electrochemically active material that minimises overpotential across the electrode; and
   v) manufacturing the electrode by depositing the electrochemically active material based on the determined distribution of w(x).

2. The method of claim 1, wherein the model describes the evolution of state-of-charge, overpotential, heat generation, electrolyte displacement and degradation effects including Li-plating, particle cracking and SEI layer growth.

3. The method of claim 1, wherein the parameters include one or more of a length of an electrode separator, a length of the electrode, porosity, tortuosity, particle radii, electronic or ionic conductivities or dimensions of the electrode.

4. The method of claim 1 wherein the model is configured to minimise a variation in overpotential of the electrode to maximise the energy density, power density, battery health and/or thermal response of the electric battery cell.

5. The method of claim 1, wherein the electrode is a graded electrode and the method comprises defining an average overall weight fraction m of electrochemically active material for the electrode, step iv) comprising adjusting the variation in w(x) to provide a distribution that minimises overpotential across the electrode for defined average overall weight fraction of electrochemically active material in the electrode.

6. The method of claim 1, wherein step iv) comprises determining an average overall weight fraction m of electrochemically active material for the electrode.

7. The method of claim 1, wherein step iv) comprises:
   applying a convex relaxation to the model to provide a convex semi-definite program; and
   solving the convex semi-definite program to determine the distribution of w(x).

8. The method of claim 1, wherein step i) further comprises selecting an upper bound for a gradient in w(x) across the electrode.

9. The method of claim 1 comprising a further step of manufacturing the electrode by depositing successive layers of the compound mixture on a substrate.

10. The method of claim 9 wherein the substrate is a current collector layer for the electric battery cell.

11. The method of claim 1, wherein the electric battery cell is a Li-ion battery cell.

* * * * *